US012787376B2

(12) United States Patent
Ishiguro et al.

(10) Patent No.: US 12,787,376 B2
(45) Date of Patent: Nov. 3, 2026

(54) SEMICONDUCTOR DEVICE AND METHOD OF FORMING MOSFET OPTIMIZED FOR $R_{DSON}$ AND/OR $C_{OSS}$

(71) Applicant: IceMos Technology Limited, Belfast (GB)

(72) Inventors: Takeshi Ishiguro, Fukushima (JP); Aymeric Privat, Tempe, AZ (US); Samuel J. Anderson, Tempe, AZ (US)

(73) Assignee: IceMos Technology Limited (GB)

( * ) Notice: Subject to any disclaimer, the term of this patent is extended or adjusted under 35 U.S.C. 154(b) by 609 days.

(21) Appl. No.: 18/045,019

(22) Filed: Oct. 7, 2022

(65) Prior Publication Data

US 2023/0154977 A1 May 18, 2023

Related U.S. Application Data

(60) Provisional application No. 63/268,959, filed on Mar. 7, 2022, provisional application No. 63/264,099, filed on Nov. 16, 2021.

(51) Int. Cl.
*H10D 62/10* (2025.01)
*H10D 30/01* (2025.01)
(Continued)

(52) U.S. Cl.
CPC ....... *H10D 62/111* (2025.01); *H10D 30/0297* (2025.01); *H10D 30/665* (2025.01);
(Continued)

(58) Field of Classification Search
CPC .. H10D 62/109; H10D 62/111; H10D 62/314; H10D 62/116; H10D 30/0297; H10D 30/668
See application file for complete search history.

(56) References Cited

U.S. PATENT DOCUMENTS

| | | | | |
|---|---|---|---|---|
| 5,108,783 A * | 4/1992 | Tanigawa | H10W 10/012 | 438/433 |
| 7,232,726 B2 * | 6/2007 | Peake | H10D 12/481 | 257/E29.256 |

(Continued)

OTHER PUBLICATIONS

P. Goarin et al., Split-gate Resurf Stepped Oxide (RSO) MOSFETs for 25V applications with record low gate-to-drain charge, Proceedings of the 19th International Symposium on Power Semiconductor Devices & ICs, May 27-30, 2007, pp. 61-64, IEEE, Jeju, Korea.

(Continued)

*Primary Examiner* — Joseph C. Nicely
(74) *Attorney, Agent, or Firm* — Robert D. Atkins; PATENT LAW GROUP: Atkins and Associates, P.C.

(57) ABSTRACT

A semiconductor device has a substrate and semiconductor layer formed over the substrate. A trench is formed through the semiconductor layer. An insulating material is disposed in the trench. A first column of semiconductor material having a first conductivity type extends through the semiconductor layer adjacent to the trench. A second column of semiconductor material having a second conductivity type extends through the semiconductor layer adjacent to the first column of semiconductor material. A first insulating layer is formed between the insulating material and a side surface of the trench. A source region is formed within the semiconductor layer. A gate region is formed adjacent to the insulating layer. A second insulating layer is formed between the gate region and source region. A conductive layer is formed over the semiconductor layer. The source region is coupled to the conductive layer.

25 Claims, 52 Drawing Sheets

(51) Int. Cl.

| | |
|---|---|
| ***H10D 30/66*** | (2025.01) |
| ***H10D 62/17*** | (2025.01) |
| ***H10D 64/00*** | (2025.01) |
| *H02M 3/335* | (2006.01) |
| *H10P 30/20* | (2026.01) |
| *H10P 50/24* | (2026.01) |

(52) U.S. Cl.

CPC ......... *H10D 30/668* (2025.01); *H10D 62/109* (2025.01); *H10D 62/127* (2025.01); *H10D 62/314* (2025.01); *H10D 62/393* (2025.01); *H10D 64/117* (2025.01); *H02M 3/33523* (2013.01); *H10P 30/222* (2026.01); *H10P 50/244* (2026.01)

(56) References Cited

U.S. PATENT DOCUMENTS 7,871,882 B2 * 1/2011 Parthasarathy ...... H10D 12/032 438/235
7,977,193 B1 * 7/2011 Disney ............... H10D 30/0297 257/E29.257
8,067,800 B2 11/2011 Hsieh
8,829,607 B1 * 9/2014 Hsieh .................. H10D 30/665 257/334
2003/0036247 A1 2/2003 Eriksen et al.
2005/0095789 A1 * 5/2005 Blanchard ............ H10D 30/663 438/270
2006/0281249 A1 * 12/2006 Yilmaz ................ H10D 30/025 438/243
2008/0258213 A1 * 10/2008 Yilmaz ................ H10D 30/025 257/E21.429
2008/0258226 A1 * 10/2008 Ishiguro ............. H10D 30/0291 257/E27.059
2010/0219468 A1 * 9/2010 Zeng ...................... H10D 30/66 257/330
2012/0018800 A1 * 1/2012 Kim ................... H10D 30/0291 438/270
2012/0061754 A1 * 3/2012 Hsieh ................. H10D 30/0295 438/270
2012/0074489 A1 * 3/2012 Hsieh ................. H10D 30/0295 257/330
2012/0187477 A1 * 7/2012 Hsieh ................... H10D 30/665 257/331
2013/0181282 A1 7/2013 Yilmaz et al.
2014/0117441 A1 * 5/2014 Zeng ...................... H10D 30/66 257/330
2015/0035048 A1 2/2015 Weber
2015/0050817 A1 * 2/2015 Cheng .................. H10D 30/665 438/791
2015/0200248 A1 7/2015 Ono et al.
2016/0163789 A1 * 6/2016 Hsieh ................. H10D 30/0295 257/330
2016/0351691 A1 * 12/2016 Ng ..................... H10D 30/0295
2019/0189796 A1 6/2019 Su et al.
2019/0198650 A1 6/2019 Wuebben et al.
2021/0036104 A1 * 2/2021 Santangelo ........ H10D 30/0297
2021/0384346 A1 * 12/2021 Hsieh ................. H10D 30/0297
2022/0149161 A1 * 5/2022 Hsieh ................... H10D 30/665
2022/0328618 A1 10/2022 Gong et al.
2023/0119393 A1 4/2023 Kowalik-Seidl et al.
2023/0154976 A1 * 5/2023 Ishiguro ............ H02M 3/33523 257/330
2023/0154977 A1 * 5/2023 Ishiguro ............ H02M 3/33523 257/330
2023/0395651 A1 12/2023 Zhu et al.
2024/0297214 A1 9/2024 Hu et al.

OTHER PUBLICATIONS

G. Sabui et al., On the Feasibility of Further Improving Figure of Merits (FOM) of Low Voltage Power MOSFETs, Proceeding of the 26th International Symposium on Power Semiconductor Devices & IC's, Jun. 15-19, 2014, pp. 155-158, Waikoloa, Hawaii.

* cited by examiner

SEMICONDUCTOR DEVICE AND METHOD OF FORMING MOSFET OPTIMIZED FOR $R_{DSON}$ AND/OR $C_{OSS}$

CLAIM TO DOMESTIC PRIORITY

The present application claims the benefit of U.S. Provisional Application No. 63/264,099, filed Nov. 16, 2021, which application is incorporated herein by reference. The present application further claims the benefit of U.S. Provisional Application No. 63/268,959, filed Mar. 7, 2022, which application is incorporated herein by reference.

FIELD OF THE INVENTION

The present invention relates in general to a semiconductor device and, more particularly, to a semiconductor device and method of forming a power MOSFET optimized for $R_{DSON}$ and/or $C_{OSS}$.

BACKGROUND OF THE INVENTION

Semiconductor devices are commonly found in modern electrical products. Semiconductor devices vary in the number and density of electrical components. Discrete semiconductor devices generally contain one type of electrical component, e.g., a light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, interface circuits, and other signal processing circuits.

With respect to the power MOSFET, such devices have been made with a super-junction structure. Advances have been made to merge micro-electrical-mechanical system (MEMS) layer transfer and super-junction technology. Super-junction has been an important development for power devices since the introduction of the insulated gate bipolar transistor (IGBT) in the 1980s. Super-junction has extended the well-known theoretical study on the limit of silicon in high-voltage devices. MEMS super-junction reduces manufacturing cost by merging MEMS processing techniques into CMOS processes to build super-junction metal oxide semiconductor (SJMOS) structures.

Super-junction can be challenging to realize in practice, due to the requirement of forming three-dimensional device structures with a high aspect ratio. SJMOS addresses the super-junction manufacturing and cost problem through a low-cost, commercially viable MEMS layer transfer and deep reactive ion etch fabrication technology. The comparison between multiple-epi and the merger of MEMS based SJMOS devices is differentiated by the number of mask layers. There can be twenty or more mask layers used in the manufacture of multi-epi, while SJMOS uses nine mask layers.

Semiconductor devices perform a wide range of functions, such as signal processing, high-speed calculations, transmitting and receiving electromagnetic signals, controlling electrical devices, transforming sunlight to electricity, and creating visual projections for television displays. Semiconductor devices are found in the fields of communications, power conversion, networks, computers, and consumer products. Semiconductor devices are also found in military applications, aerospace, aviation, automotive, data processing centers, industrial controllers, and office equipment.

MOSFETs are commonly used in electrical circuits, such as communication systems and power supplies. Power MOSFETs are particularly useful when used as electric switches to enable and disable the conduction of relatively large currents. The on/off state of the power MOSFET is controlled by applying and removing a triggering signal at the gate electrode. When turned on, the electric current in the MOSFET flows between the drain and source. When turned off, the electric current is blocked by the MOSFET.

Power MOSFETs are typically arranged in an array of thousands of individual MOSFET cells electrically connected in parallel. The MOSFET cell has an inherent drain-source resistance ($R_{DSON}$) in the conducting state. The width of the MOSFET cell influences the electrical resistance of the MOSFET cell. The larger the cell width, the larger the resistance. Conversely, the larger the cell density with corresponding smaller cell width, the smaller the resistance. Many applications, such as portable electrical devices, require a low operating voltage, e.g., less than 5 VDC. The low voltage electrical equipment in the portable electrical devices creates a demand for power supplies that can deliver the requisite operating potential.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The features shown in the figures are not necessarily drawn to scale. Elements having a similar function are assigned the same reference number in the figures. The term "semiconductor die" as used herein refers to both the singular and plural form of the words, and accordingly, can refer to both a single semiconductor device and multiple semiconductor devices.

Most modern electrical equipment requires a power supply to provide a DC operating potential to the electrical components contained therein. Common types of electrical equipment which use power supplies include aerospace, personal computers, energy systems, telecommunication systems, audio-video equipment, consumer electrical devices, automotive components, portable electrical devices, data processing centers, LED lighting, electric vehicles, and other devices which utilize integrated circuits, semiconductor chips, or otherwise require DC operating potential. Many semiconductor components require a low voltage DC operating potential. However, many sources of electric power are AC, or high voltage DC, which must be converted to low voltage DC for the electrical equipment.

Figure 1:
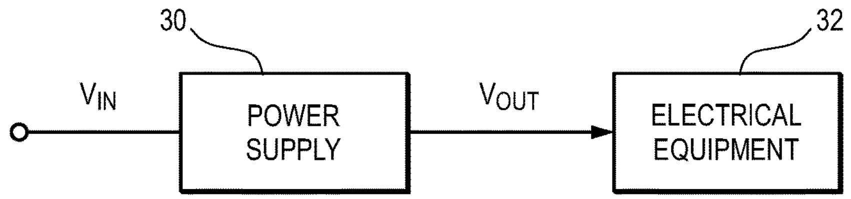
FIG. 1 illustrates a block diagram of a power supply and electrical equipment.

In one common arrangement, the AC/DC power supply receives an AC input voltage, e.g., between 110 and 240 VAC, and converts the AC input voltage to the DC operating voltage. Referring to FIG. 1, a PWM power supply 30 is shown providing a DC operating potential to electrical equipment 32. Power supply 30 receives input voltage $V_{IN}$ and produces one or more DC output voltages. The electrical equipment 32 may take the form of aerospace equipment, personal computers, energy systems, telecommunication systems, audio-video equipment, consumer electrical devices, automotive components, portable electrical devices, aerospace, data processing centers, LED lighting, charging stations for electric vehicles, variable speed drives for electric motors, and other devices which utilize integrated circuits, semiconductor chips, or otherwise require DC operating potential from the power supply.

Figure 2:
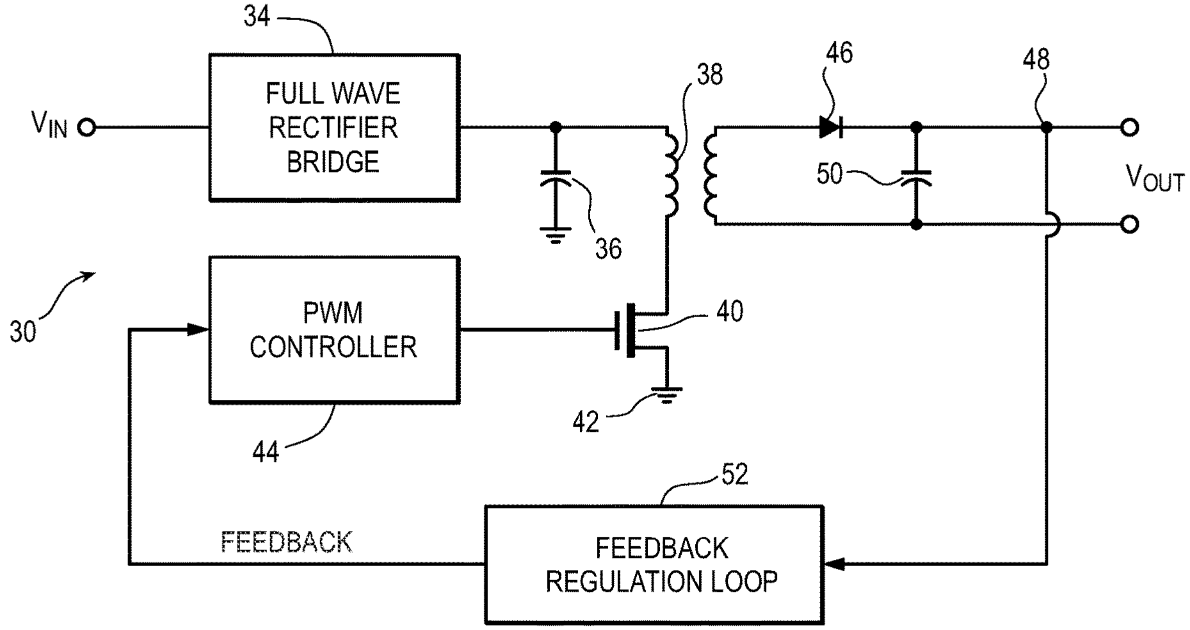
FIG. 2 is a schematic and block diagram of a pulse width modulated power supply.

Further detail of PWM power supply 30 is shown in FIG. 2. The input voltage $V_{IN}$ may be an AC signal, e.g., 110 VAC, or DC signal, e.g., 48 volts. For the case of an AC input voltage, power supply 30 has a full-wave rectifier bridge 34. The full-wave rectifier bridge 34 converts the AC input voltage to a DC voltage. In the case of a DC input voltage, the full-wave rectifier bridge 34 is omitted. Capacitor 36 smooths and filters the DC voltage. The DC voltage is applied to a primary winding or inductor of transformer 38. The primary winding of transformer 38 is also coupled through power transistor 40 to ground terminal 42. In one embodiment, power transistor 40 is a multi-cell vertical power MOSFET, as described in FIGS. 4*a*-4*an* and 6*a*-6*s*. The gate of MOSFET 40 receives a PWM control signal from PWM controller 44. The secondary winding of transformer 38 is coupled to rectifier diode 46 to create the DC output voltage $V_{OUT}$ of power supply 30 at node 48. Capacitor 50 filters the DC output voltage $V_{OUT}$. The DC output voltage $V_{OUT}$ is routed back through feedback regulation loop 52 to a control input of PWM controller 44. The DC output voltage $V_{OUT}$ generates the feedback signal which PWM controller 44 uses to regulate the power conversion process and maintain a relatively constant output voltage $V_{OUT}$ under changing loads. The aforedescribed electrical components of the power supply module are typically mounted to and electrically interconnected through a printed circuit board.

In the power conversion process, PWM controller 44 sets the conduction time duty cycle of MOSFET 40 to store energy in the primary winding of transformer 38 and then transfer the stored energy to the secondary winding during the off-time of MOSFET 40. The output voltage $V_{OUT}$ is determined by the energy transfer between the primary winding and secondary winding of transformer 38. The energy transfer is regulated by PWM controller 44 via the duty cycle of the PWM control signal to MOSFET 40. Feedback regulation loop 52 generates the feedback signal to PWM controller 44 in response to the output voltage $V_{OUT}$ to set the conduction time duty cycle of MOSFET 40.

Figure 3:
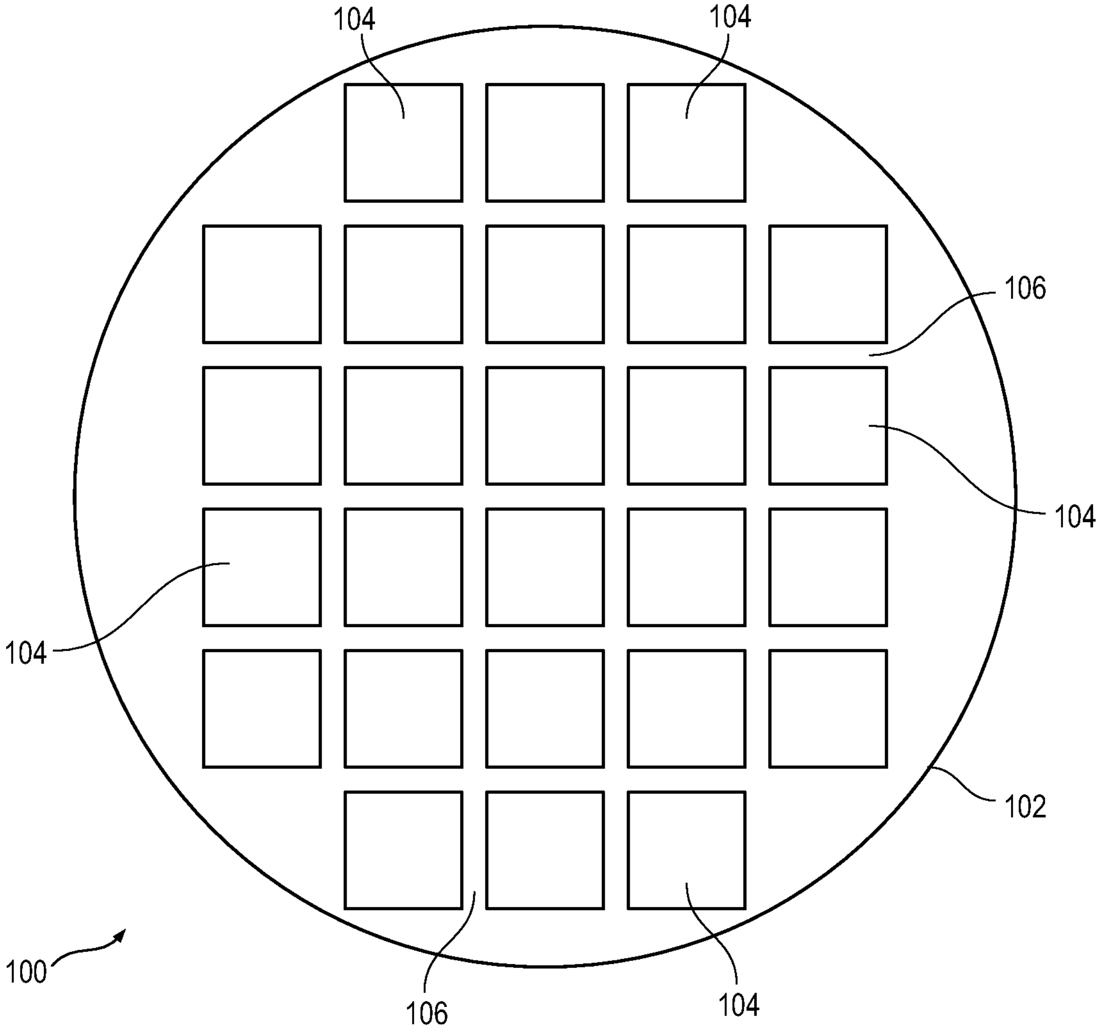
FIG. 3 illustrates a semiconductor wafer with a plurality of semiconductor die.

FIG. 3 shows semiconductor wafer or substrate 100 with a base substrate material 102, such as silicon (Si), SiC, cubic silicon carbide (3C-SiC), germanium, aluminum phosphide, aluminum arsenide, gallium arsenide, gallium nitride, indium phosphide, diamond, and all families of III-V and II-VI semiconductor materials for structural support. A plurality of semiconductor die or electrical components 104 is formed on wafer 100 separated by a non-active, inter-die wafer area or saw street 106. Saw street 106 provides cutting areas to singulate semiconductor wafer 100 into individual semiconductor die 104. In one embodiment, semiconductor wafer 100 has a width or diameter of 100-450 millimeters (mm).

Semiconductor die 104 can be a vertical or lateral power MOSFET with gate and source terminals on a first surface of the die and drain terminal on a second surface opposite the first surface of the die. Semiconductor die 104 can be contained in a semiconductor package, such as TO220, T0247, decawat package (DPAK), double decawat package (D2PAK), TSON, micro leadframe package (MLP), dual flat no-leads (DFN), and other packages for vertical discrete devices or lateral chip scale up-drain packages.

In the present embodiment, semiconductor die 104 contains a power MOSFET, applicable to MOSFET 40, with enhanced features to optimize resistance and/or capacitance. The new power MOSFET is referred to as junction enhanced dense island field effect transistor (JEDIFET) to combine features of charge balance by a field plate and super-junction to reduce $R_{DSON}$ and/or output capacitance $C_{OSS}$.

Figure 4A:
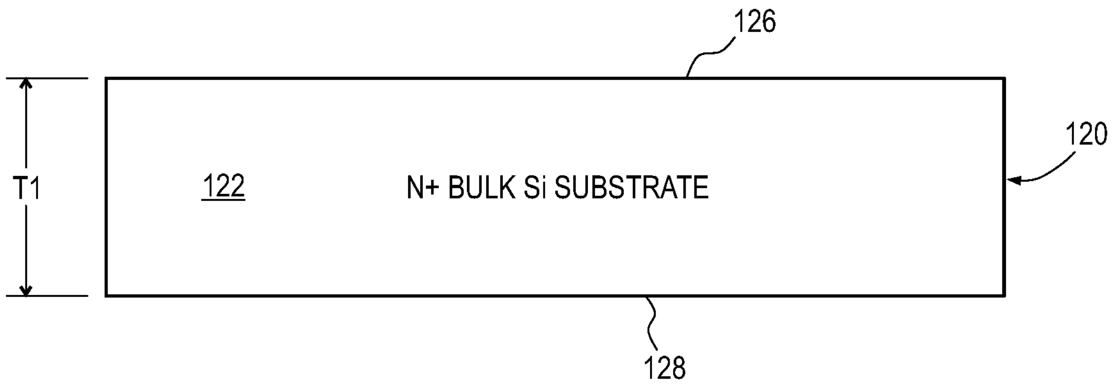
FIGS. 4*a*-4*an* illustrate a process of forming a multi-cell power MOSFET with a field plate optimized for $R_{DSON}$.

FIGS. 4*a*-4*an* illustrate a process of forming a JEDIFET optimized for resistance. FIG. 4*a* illustrates substrate 120 containing a base semiconductor material 122, such as Si, SiC, 3C-SiC, germanium, aluminum phosphide, aluminum arsenide, gallium arsenide, gallium nitride, indium phosphide, diamond, and all families of III-V and II-VI semiconductor materials for structural support. In one embodiment, substrate 120 contains N+ bulk Si with a thickness T1 of about 350 micrometers (μm). Substrate 120 includes a first surface 126 and second surface 128 opposite the first surface 126.

Figure 4B:
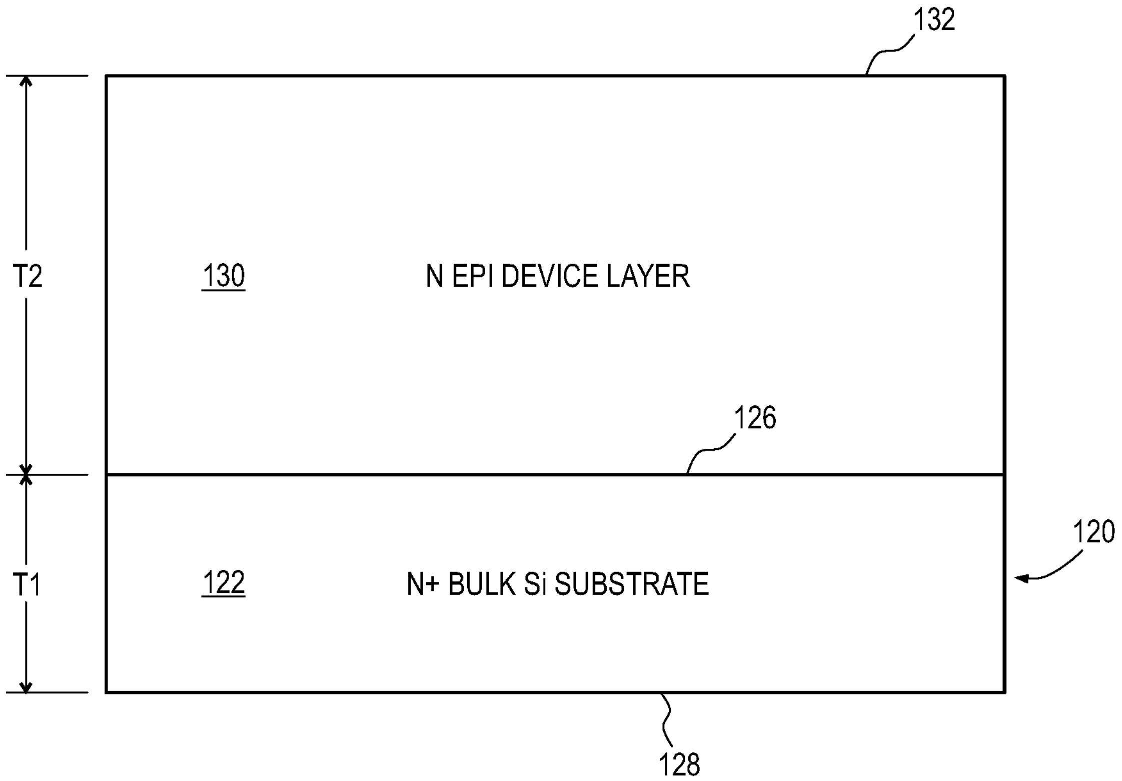

In FIG. 4*b*, semiconductor layer 130 with surface 132 is epitaxially grown over surface 126 of substrate 120. In one embodiment, thickness T2 can be 1.5-2.0 μm for 30V. More generally, thickness T2 is determined by the voltage rating with thicker epi required for a higher voltage. In super-junction technology, epi thickness or the length of drift region is substantially proportional to the voltage. For example, T2 of 4.0 μm for 60V and T2 of 20.0 μm for 200V.

Figure 4C:
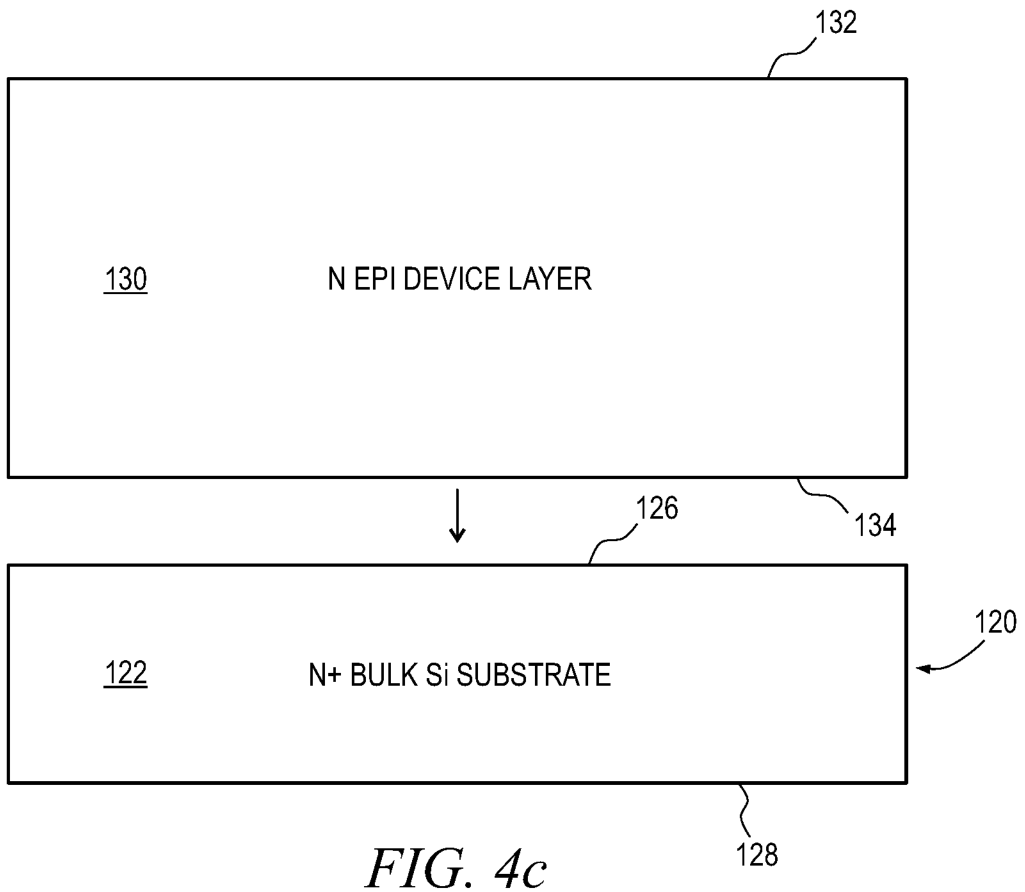
Figure 4D:
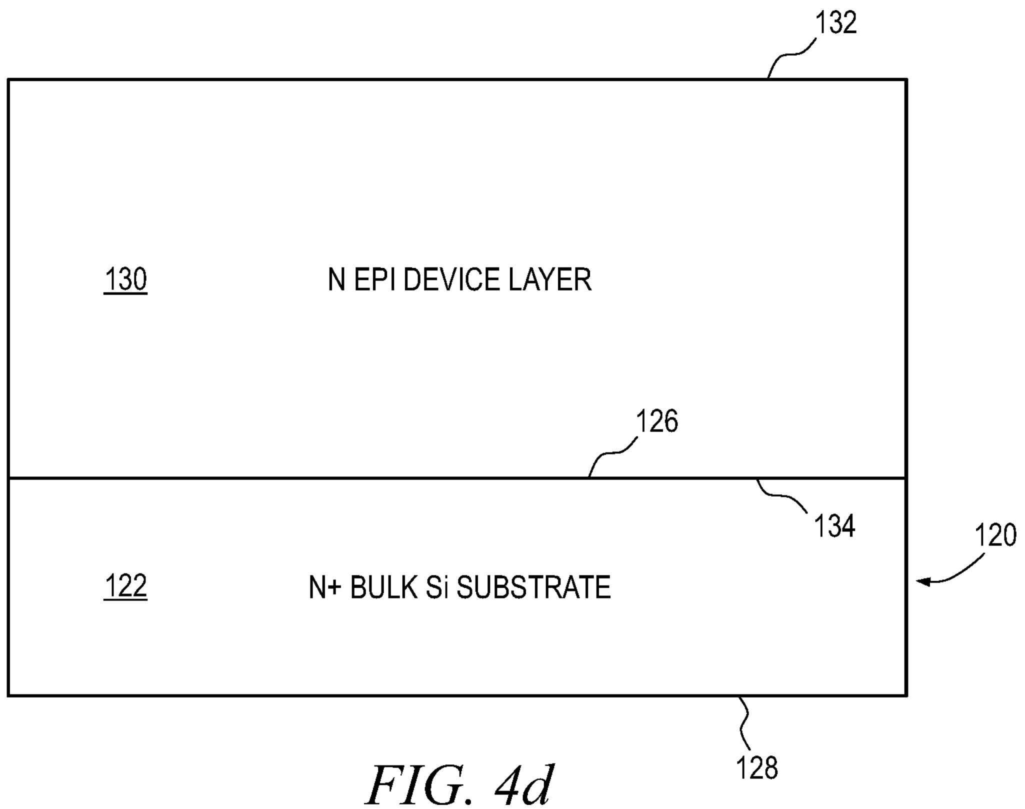

Alternatively, semiconductor layer 130 is joined to substrate 120 using a high temperature anneal, fusion bonding, plasma activated direct wafer bonding (DWB), or other DWB process. In FIG. 4*c*, semiconductor layer 130 is disposed over surface 126 of substrate 120. Surface 134 of semiconductor layer 130 and surface 126 of substrate 120 are planarized, polished, and cleaned to be flat and smooth, prior to bonding. The lattice structures of semiconductor layer 130 and substrate 120 can be aligned to optimize adhesion. Water molecules can be applied to surfaces 126 and 134 to aid in the bonding process. Surface 134 of semiconductor layer 130 is brought into contact with surface 126 of substrate 120. DWB is accomplished with chemical bonds and intermolecular interactions at temperature, including van der Waals forces, hydrogen bonds, and covalent bonds, between surface 134 and surface 126. DWB temperatures range from ambient to 100's ° C. FIG. 4*d* shows semiconductor layer 130 direct wafer bonded to surface 126 of substrate 120.

Semiconductor layer 130 is doped to change the physical and electrical characteristics of the layer. Doping is the intentional introduction of impurities (dopant) into the lattice structure of an intrinsic semiconductor material (equal numbers of free electrons and holes) for the purpose of modulating its electrical, optical, physical, and structural properties. The doped material becomes an extrinsic semiconductor material. The doping is said to be low or light, given one dopant atom per 100 million (1e8) atoms, or 5e14 dopant atoms/cm$^3$. The doping is referred to as high or heavy, given one dopant atom per ten thousand (1e4) atoms, or 5e18 dopant atoms/cm$^3$. The dopant can be n-type material or p-type material, depending on the type of semiconductor device being made. JEDIFET 230 can be an n-channel device (N-MOS) or a p-channel device (P-MOS), where "p" denotes a positive carrier type (hole) and "n" denotes a negative carrier type (electron). Although the present embodiment is described in terms of an N-MOS device, the opposite type semiconductor material can be used to form a P-MOS device.

In various implantation and diffusion steps described herein, the doping is performed by an initial ion implantation, solid diffusion, liquid diffusion, drive-in diffusion, spin-on deposits, plasma doping, vapor phase doping, laser doping, or the like to deposit impurities into the lattice structure of the region or layer. Doping with boron (B), aluminum (Al), or gallium (Ga) results in a more p-type region, and doping with phosphorus (P), antimony (Sb), or arsenic (As) impurities results in a n-type region. Other dopants may be utilized, such as bismuth (Bi) and indium (In), depending on the material of the substrate and the desired strength of the doping. First, the impurity is implanted in the surface of the intrinsic material, e.g., by ion implantation. After implantation of impurities at the surface, a drive-in diffusion step is typically required to disperse or distribute the impurities throughout the lattice structure of the layer or region. For example, following implantation of the dopant, a drive-in step at a temperature of 1200° C. for up to 12 hours. To minimize repetitive text, doping or doped refers to both the initial implanting of impurities and driving in or distributing the impurities to the lattice structure.

Figure 4E:
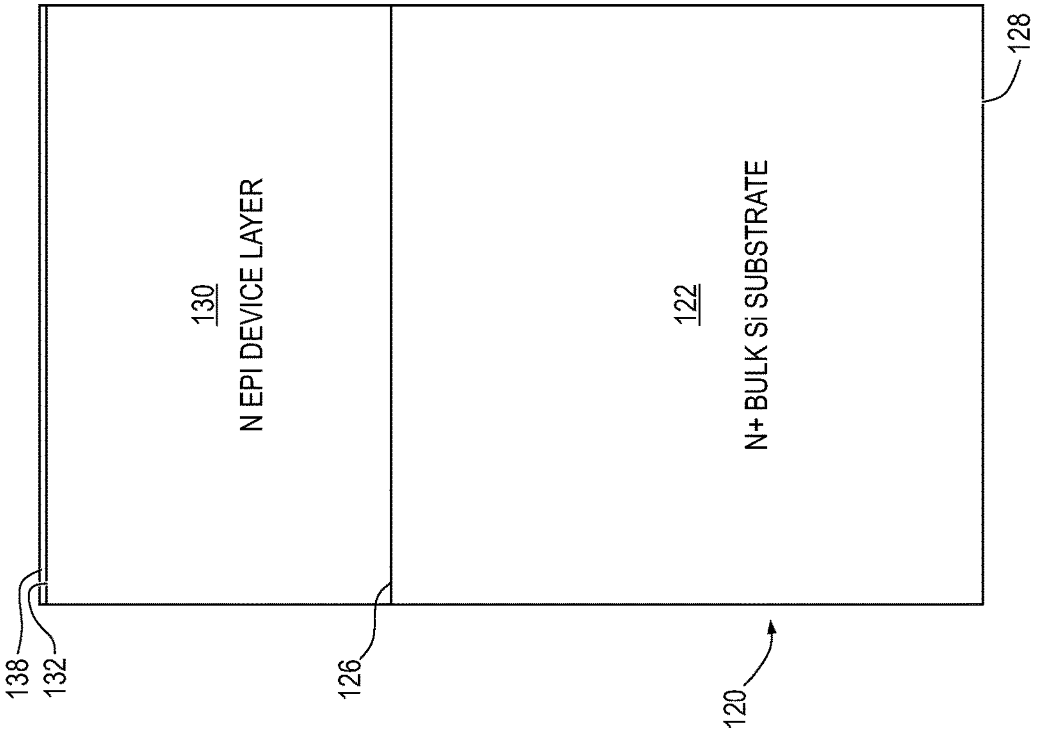

N doping concentration is determined by voltage rating. N doping concentration is also determined for edge termination. N-epi thickness is determined by the drift length. In one embodiment, semiconductor layer 130 is doped with n-type impurities, e.g., P, Sb, or As at 1e16 atoms/cm$^3$ for 30V and about 1e14 atoms/cm$^3$ for 600V, to form an N-epi device layer with a thickness dependent on design breakdown voltage. For example, the epi thickness is 1.5-2.0 μm for 30V and 4.0 μm for 60V. JEDIFET 230 will be formed in N-epi device layer 130. FIGS. 4*e*-4*an* represent a portion of substrate 120 showing formation of two cells of JEDIFET 230.

In FIG. 4*e*, insulating layer 138 is formed over surface 132 of semiconductor layer 130. Insulating layers, as described herein, can be silicon dioxide (SiO2), silicon nitride (Si3N4), silicon oxynitride (SiON), tantalum pentoxide (Ta2O5), aluminum oxide (Al2O3), polyimide, benzocyclobutene (BCB), polybenzoxazoles (PBO), or other suitable insulating or dielectric material formed using PVD, CVD, screen printing, spin coating, spray coating, sintering, or thermal oxidation. In one embodiment, insulating layer 138 is an initial oxide layer.

Figure 4F:
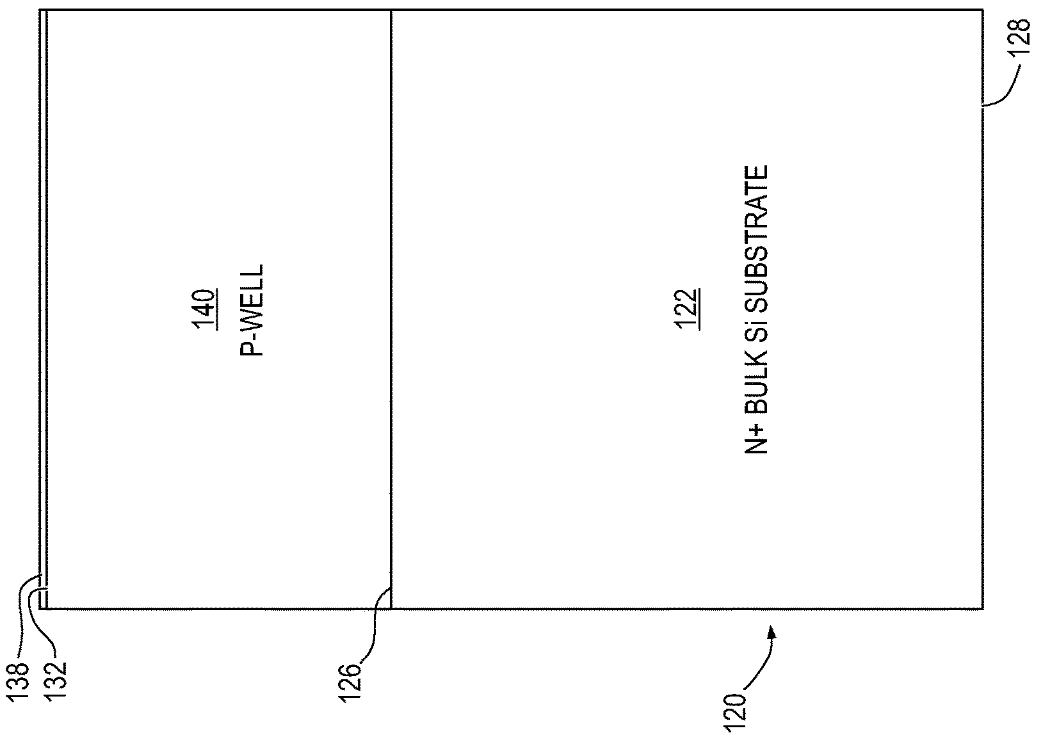
Figure 4H:
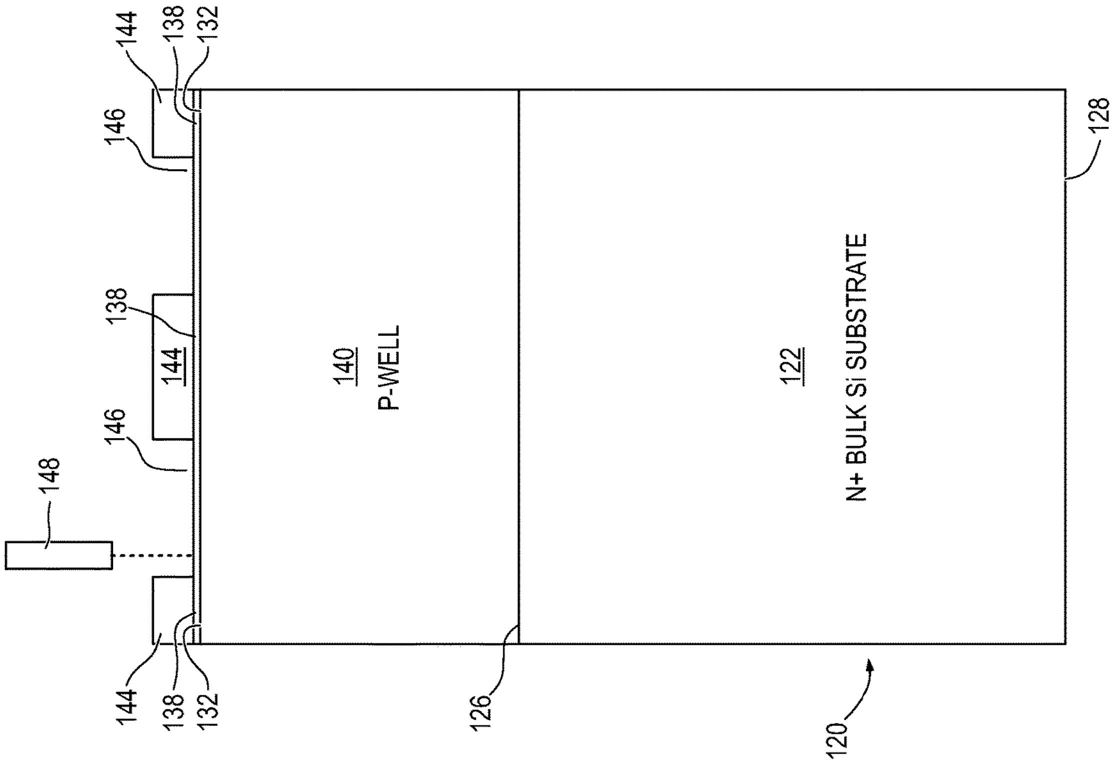
Figure 4G:
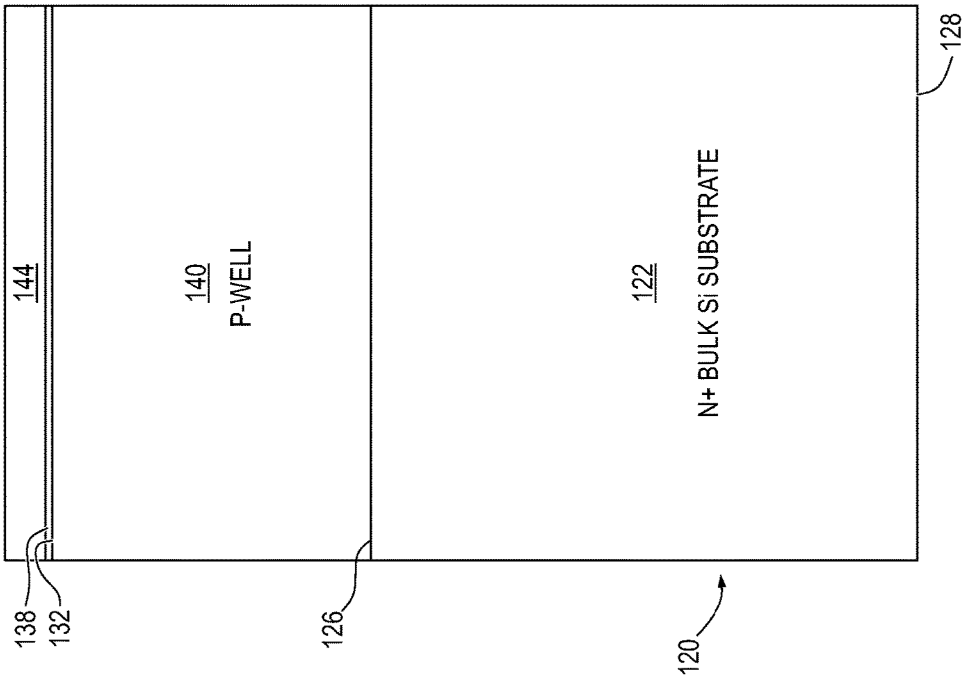

In FIG. 4*f*, P doping concentration is determined to achieve charge balance for n-drift region or column 198. Semiconductor layer 130 is doped with p-type impurities, e.g., B, Al, or Ga at 1e12 atoms/cm$^2$, to form p-well 140 with concentration as atoms/cm$^3$ determined by width of the p-well after all processes. In FIG. 4*g*, insulating layer 144 is formed over insulating layer 138 and surface 132 of semiconductor layer 130. In one embodiment, insulating layer 144 is a nitride layer. In FIG. 4*h*, a portion of insulating layer 144 is removed by an etching process to form openings 146 extending down to insulating layer 138. Alternatively, a portion of insulating layer 144 is removed by laser direct ablation (LDA) using laser 148.

Figure 4J:
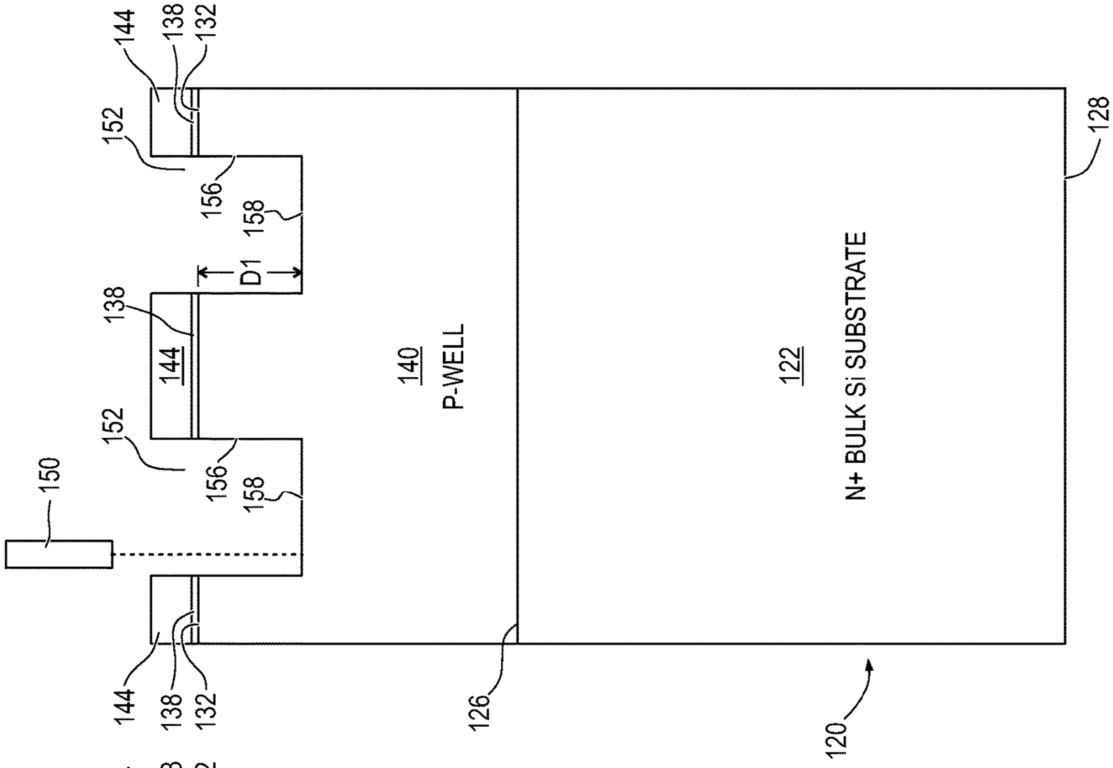
Figure 4I:
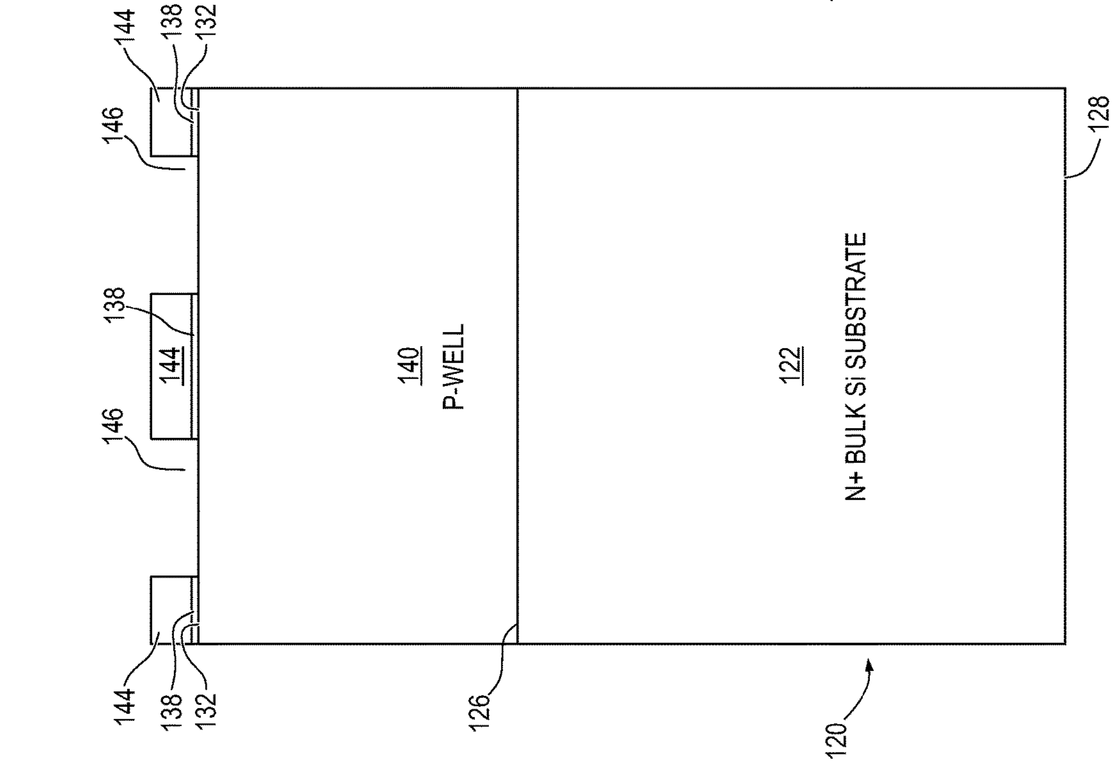

In FIG. 4*i*, a portion of insulating layer 138 is removed by an etching process to expose surface 132 of semiconductor layer 130. Alternatively, a portion of insulating layer 138 is removed by LDA to expose surface 132 of semiconductor layer 130, similar to FIG. 4*h*. In FIG. 4*j*, a portion of semiconductor material in P-well 140 (semiconductor layer 130) is removed by an etching process to form opening or trench 152 to a depth D1 of 0.1-1.0 μm, preferably about 0.5 μm, below surface 132 with side surfaces 156 and bottom surface 158. Alternatively, a portion of semiconductor material in P-well 140 is removed by LDA using laser 150.

Figure 4L:
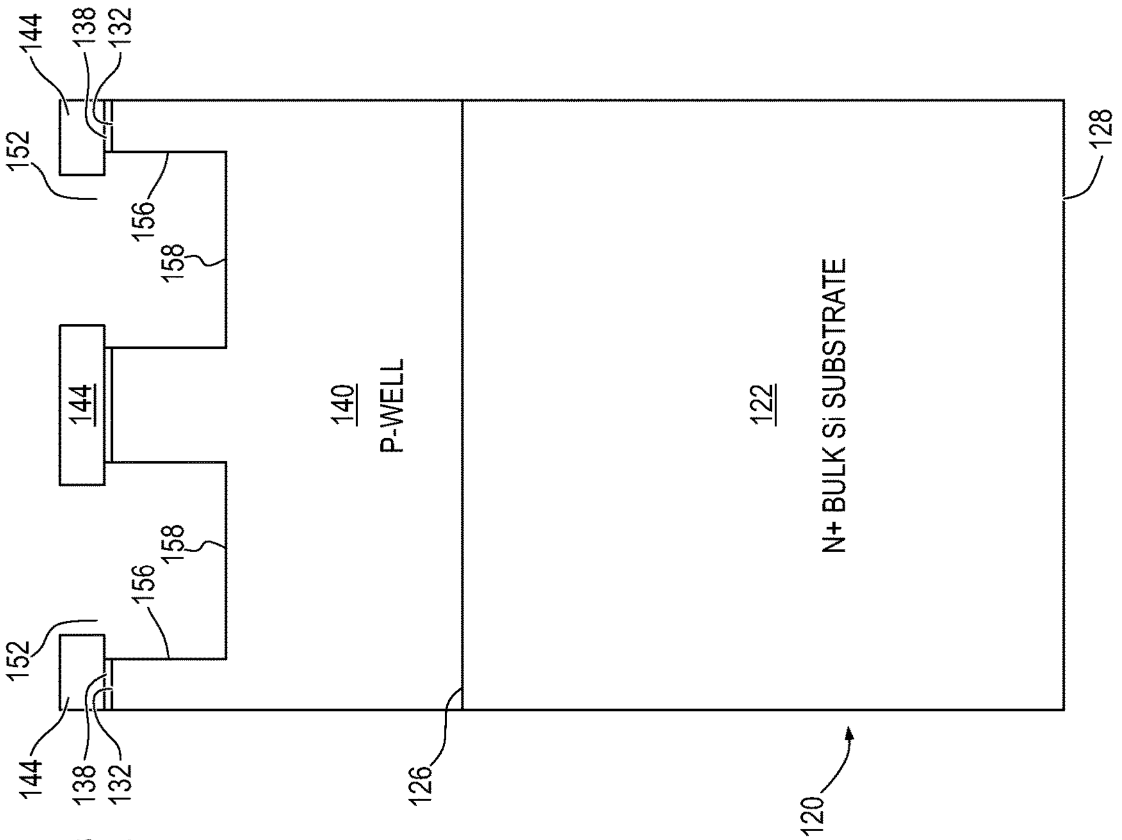
Figure 4K:
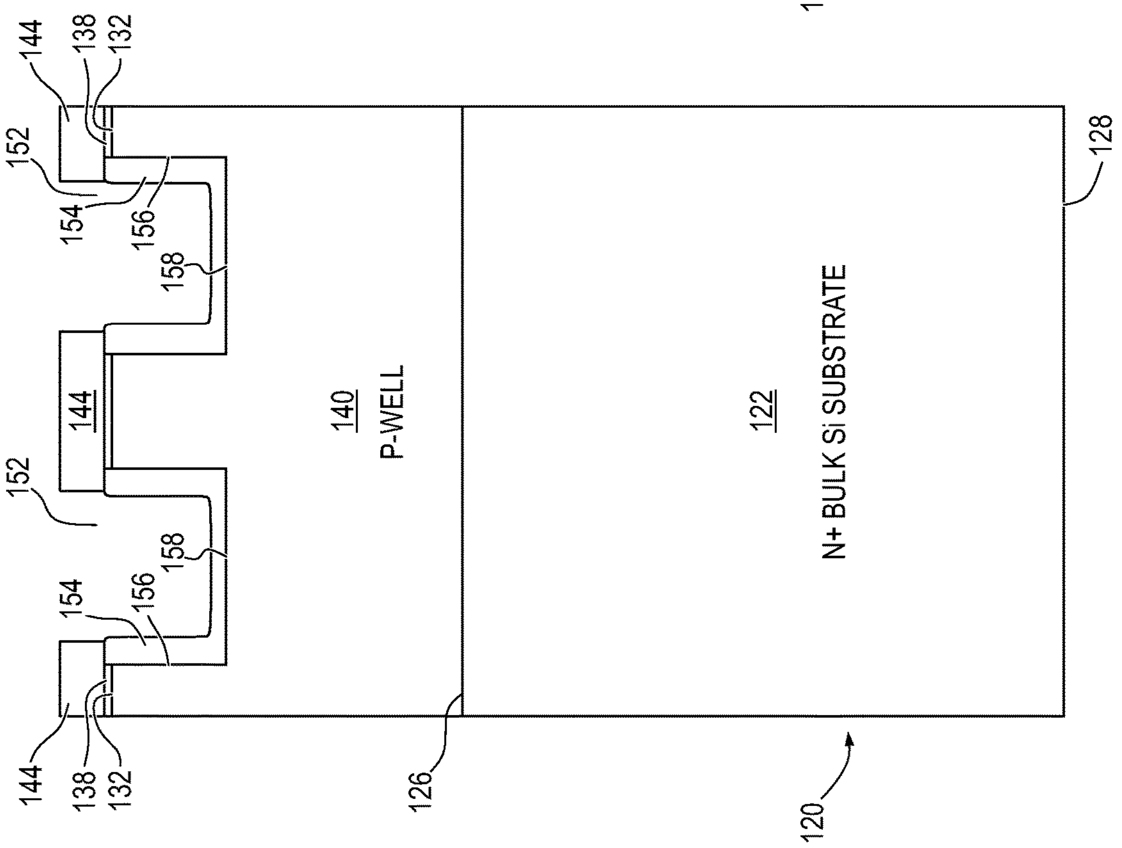

In FIG. 4*k*, insulating layer 154 is formed in trench 152. Insulating layer 154 conformally covers side surfaces 156 and bottom surface 158 of trench 152 and extends up to insulating layer 144. In one embodiment, insulating layer 154 is a first trench gate sacrificial oxide layer. In FIG. 4*l*, insulating layer 154 is removed by a wet etch. The sacrificial oxide layer 154 formation and removal tends to smooth side surfaces 156 and bottom surface 158 of trench 152.

Figure 4N:
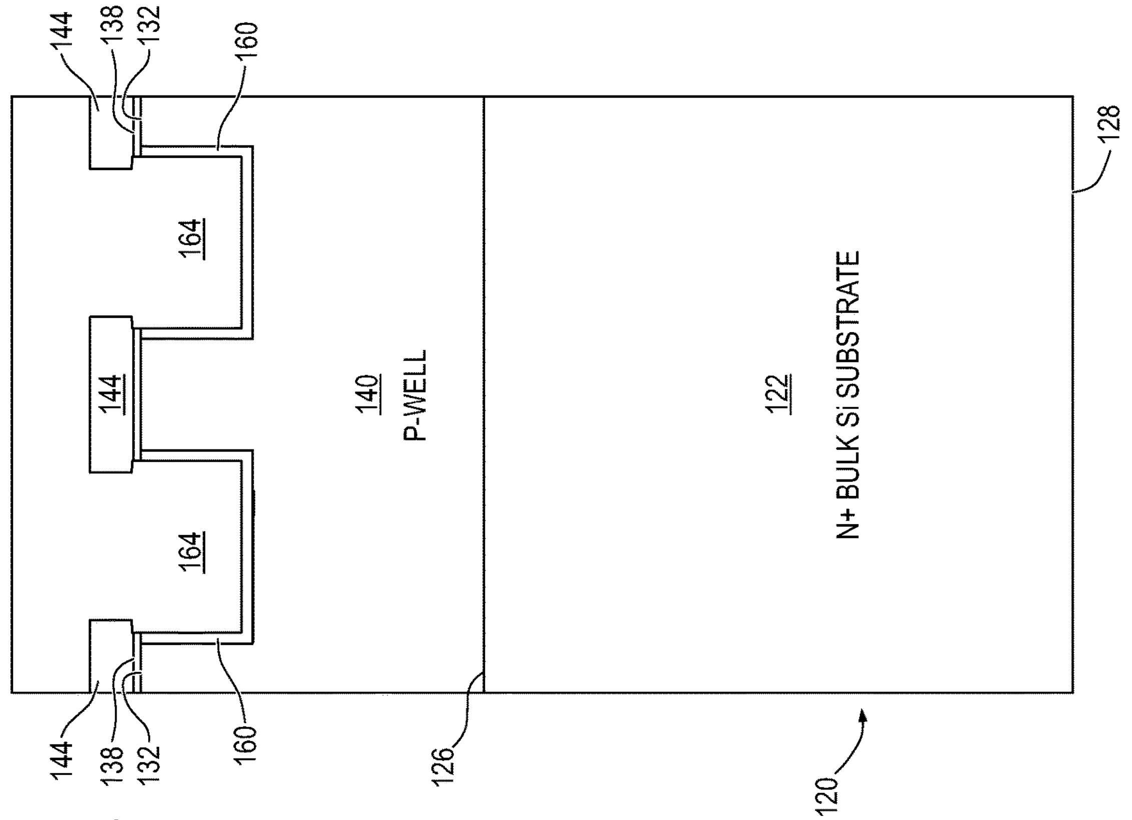
Figure 4M:
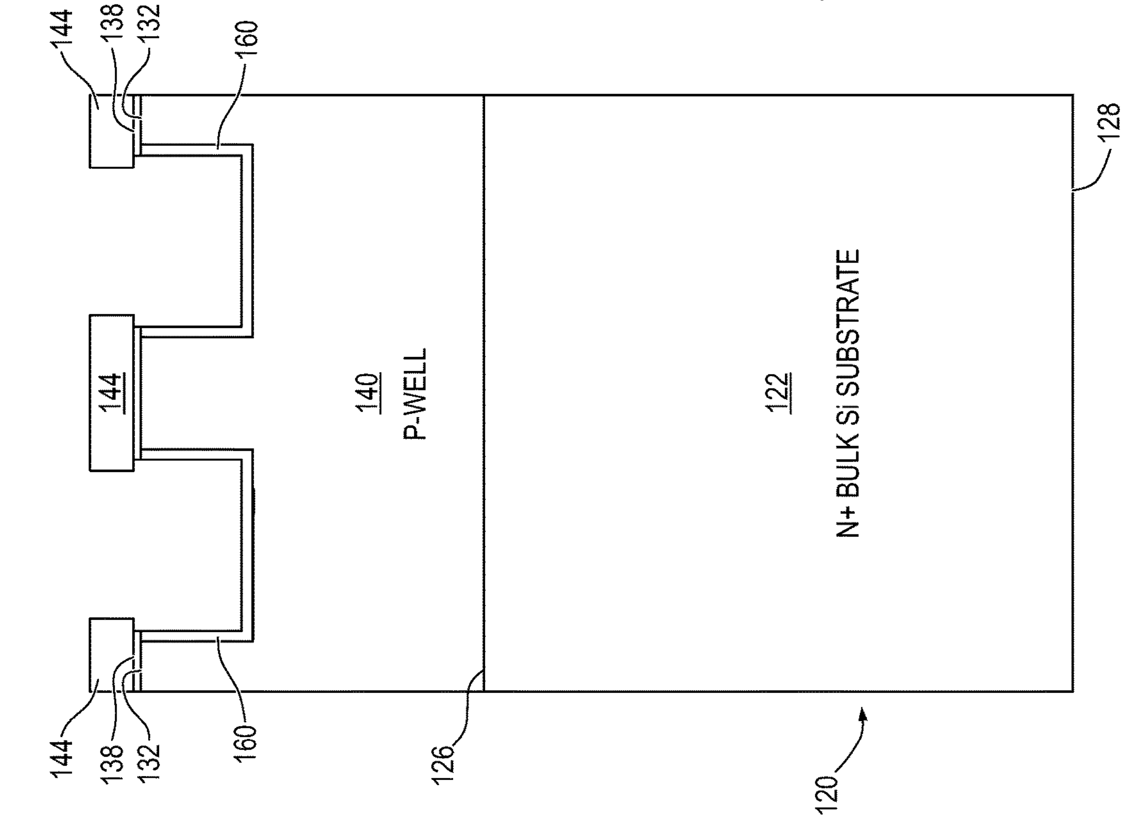
Figure 4P:
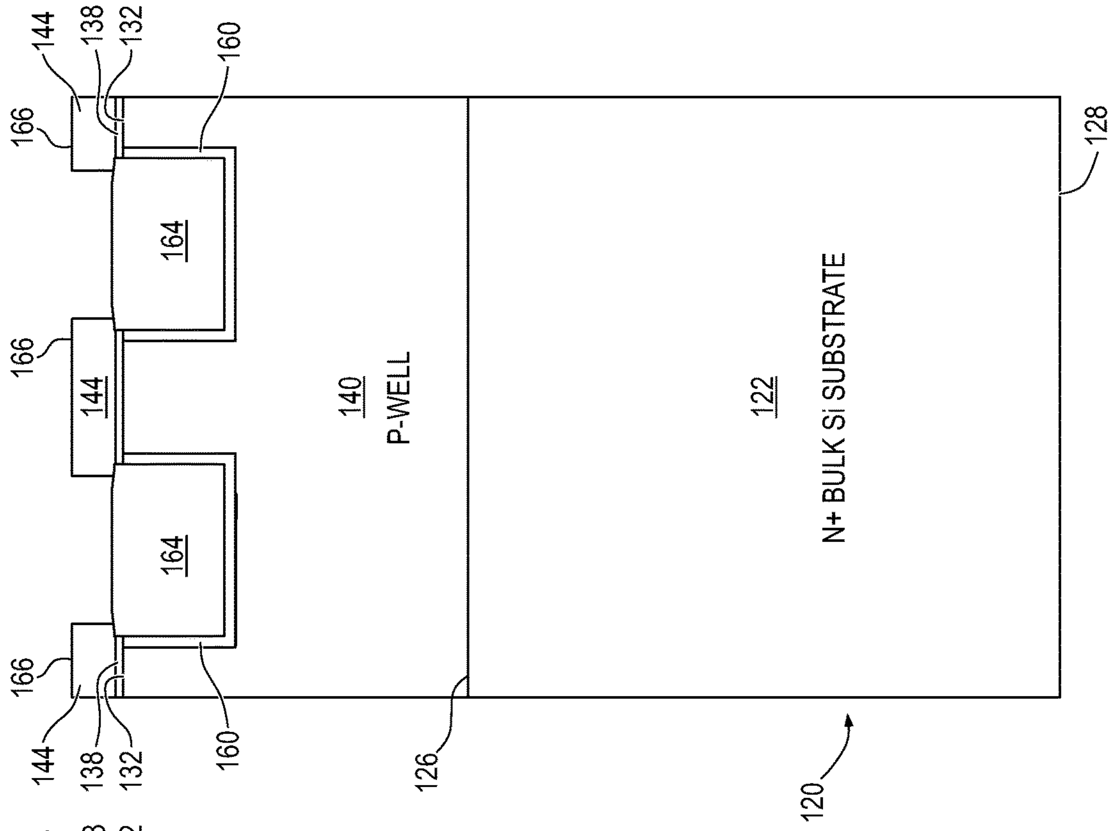
Figure 4O:
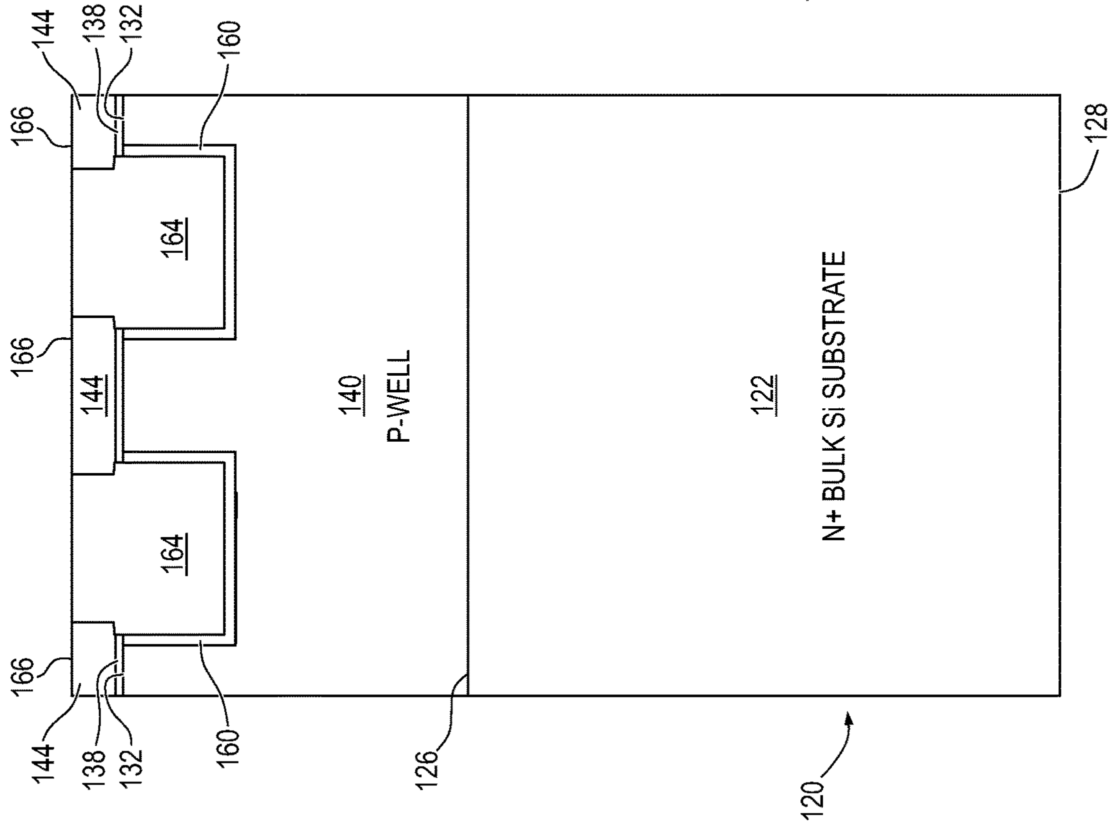

In FIG. 4*m*, insulating layer 160 is formed in trench 152. Insulating layer 160 conformally covers side surfaces 156 and bottom surface 158 of trench 152 and extends up to insulating layer 138/144. In one embodiment, insulating layer 160 is a gate oxide layer. In FIG. 4*n*, polysilicon material 164 is formed over insulating layer 144 and into trench 152 over gate oxide layer 160. Polysilicon material 164 can be formed by PVD, CVD, screen printing, spin coating, spray coating, or other suitable deposition process. In FIG. 4*o*, a portion of polysilicon material 164 is removed by chemical mechanical polishing (CMP) to planarize the polysilicon material to a level even with surface 166 of insulating layer 144. Alternatively, a portion of polysilicon material 164 is removed by LDA to planarize the polysilicon material to a level even with surface 166 of insulating layer 144. In FIG. 4*p*, another portion of polysilicon material 164 is removed by an etching process or LDA to a level even with insulating layer 138.

Figure 4R:
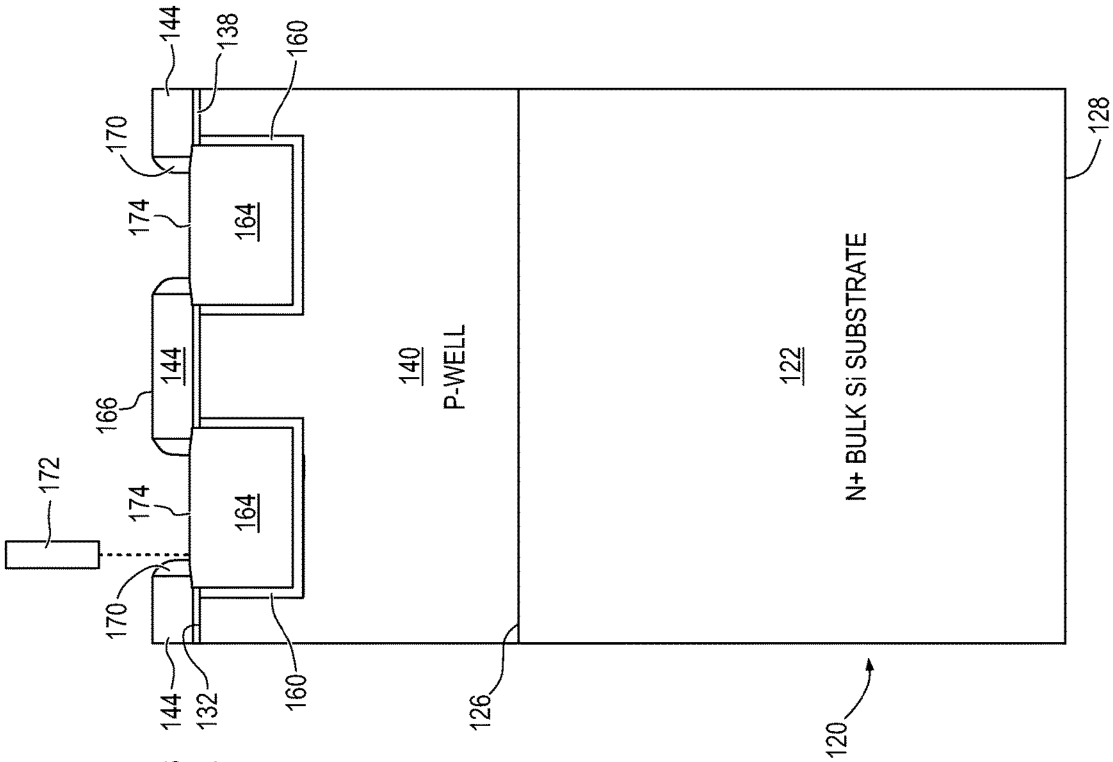
Figure 4Q:
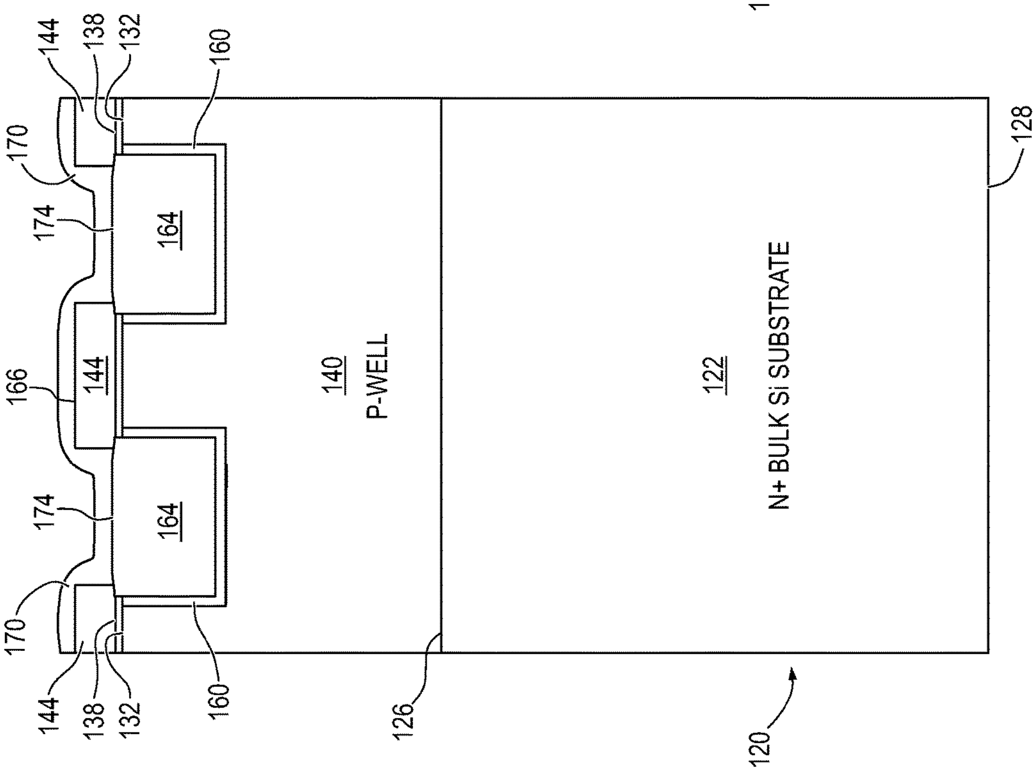

In FIG. 4*q*, insulating layer 170 is formed over insulating layer 144 and polysilicon material 164. Insulating layer 170 can be formed by PVD, CVD, screen printing, spin coating, spray coating, or other suitable deposition process. Insulating layer 170 conformally covers insulating layer 144 and polysilicon material 164. In one embodiment, insulating layer 170 is a spacer oxide layer. In FIG. 4*r*, a portion of insulating layer 170 is removed by an etching process or LDA to expose surface 166 of insulating layer 144 and surface 174 of polysilicon material 164.

Figure 4T:
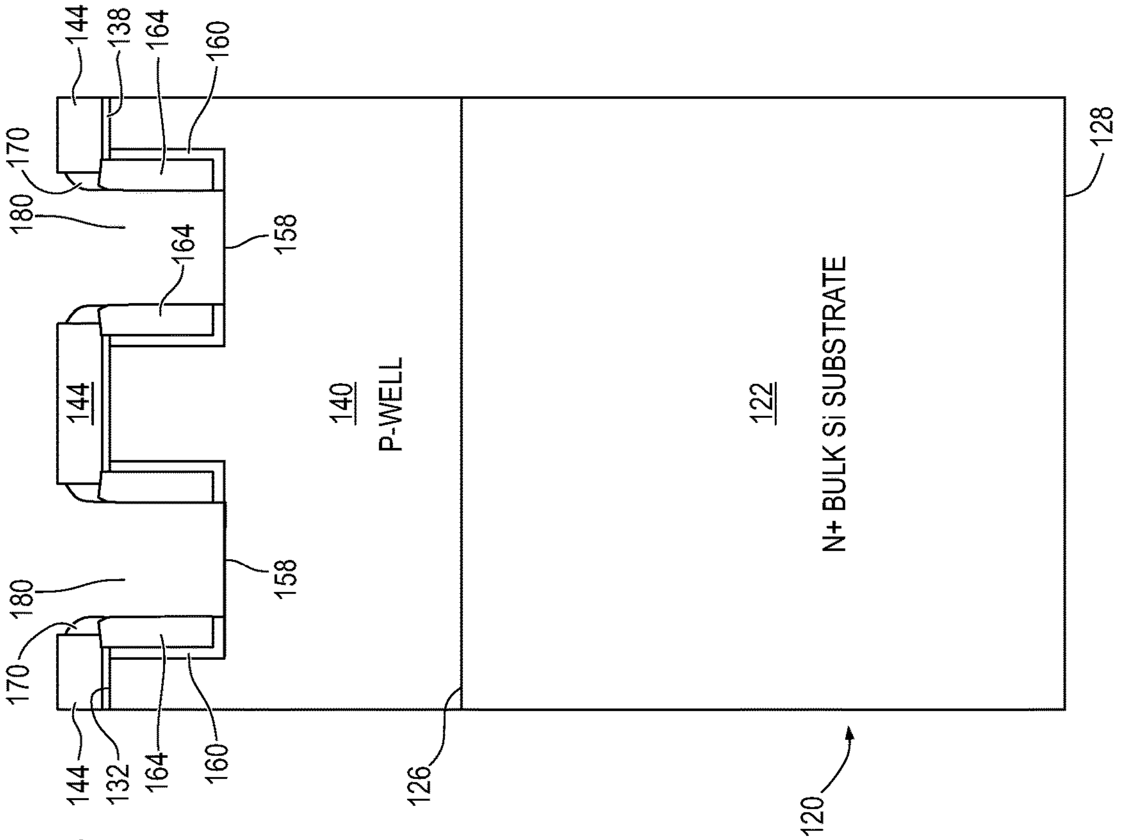
Figure 4S:
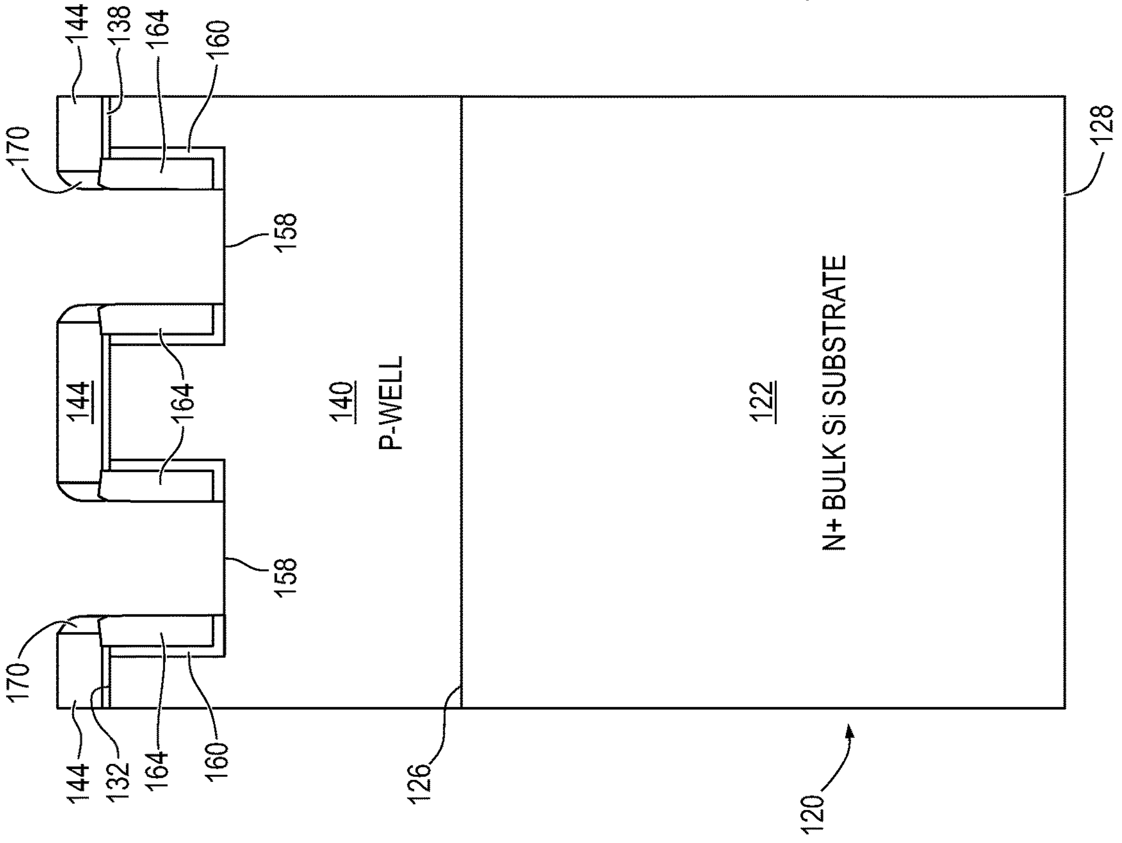

In FIG. 4*s*, a portion of polysilicon material 164 is removed by a trench gate etching process down to bottom surface 158 of trench 152. The remaining portion of insulating layer 170 can be used as a mask to remove a portion of polysilicon 164. Alternatively, a portion of polysilicon material 164 is removed by LDA down to bottom surface 158 of trench 152, similar to FIG. 4*r*. The remaining portion of polysilicon material 164 in FIG. 4*s* operates as the gate of JEDIFET 230. In FIG. 4*t*, a portion of insulating layer 170 is removed by a trench gate etching process to expose a portion of a top surface of polysilicon material a portion of a side surface of insulating layer 144, i.e., to reduce the amount of insulating layer remaining. Alternatively, a portion of insulating layer 170 is removed by LDA to reduce the amount of insulating layer remaining.

Figure 4V:
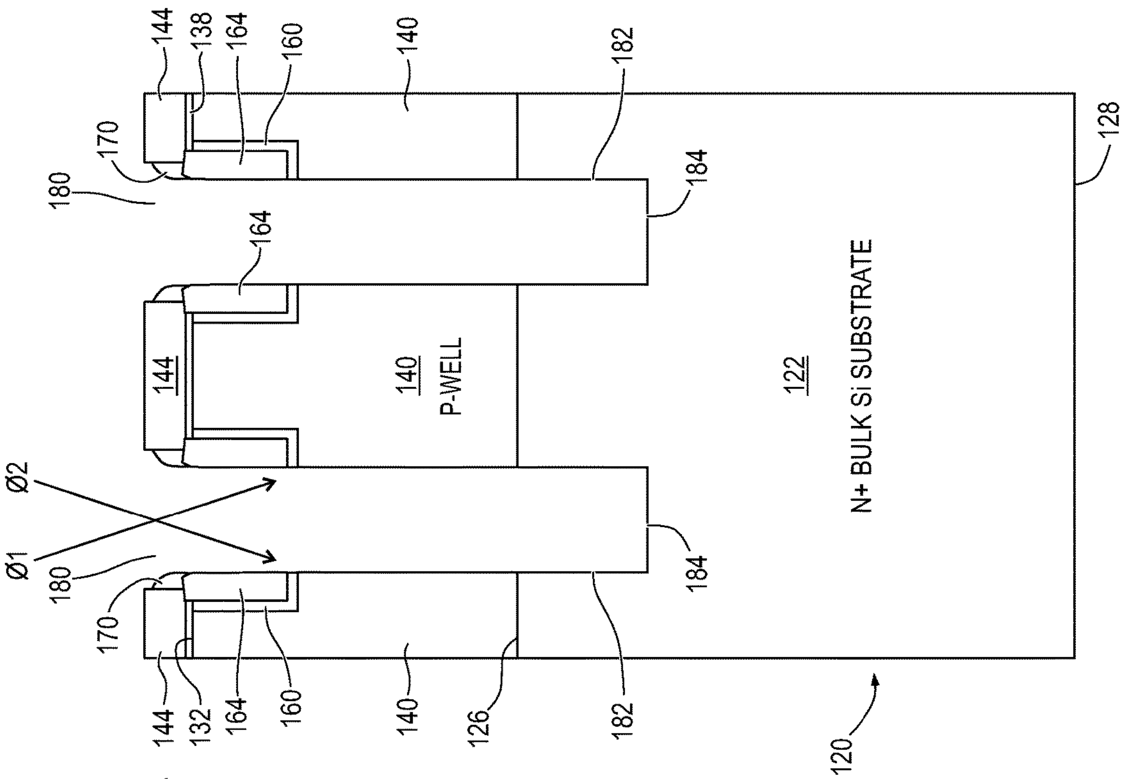
Figure 4U:
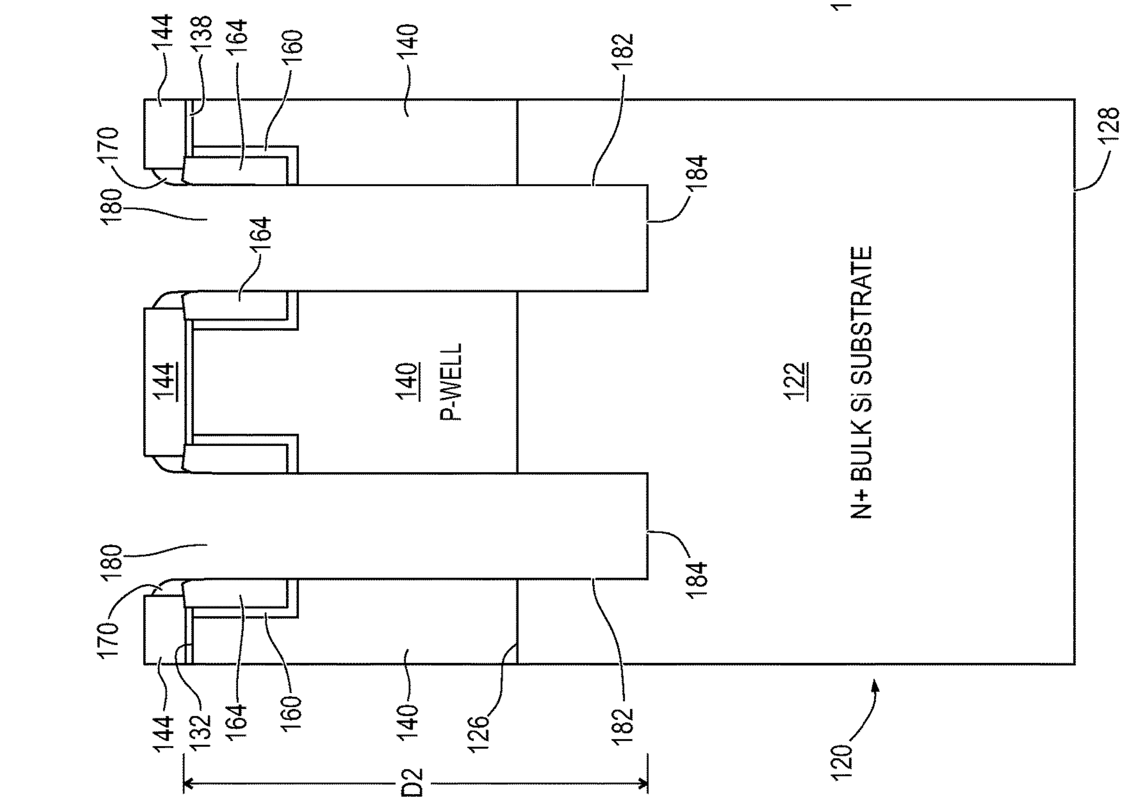

In FIG. 4*u*, a portion of semiconductor layer 130 is removed by a trench gate etching process to form trenches 180. Trench 180 must extend at least to surface 126, and in most cases, will extend past surface 126 into substrate material 122. Trenches 180 can be formed by deep reactive ion etching (DRIE) with a width of 0.1-1.0 μm, preferably 0.5 μm, and depth D2 of 1.5-2.0 μm, depending on epi thickness, to extend past surface 126 into substrate material 122. Depth D2 is greater for higher voltages and thicker epi. The DRIE is a highly anisotropic etch process used to create deep penetration, steep-sided holes, cavities, and trenches in wafers/substrates, typically with high aspect ratios. DRIE utilizes an ionized gas or plasma, such as sulfur hexafluoride ($SF_6$), to remove material from semiconductor layer 130 and semiconductor material 122. DRIE technology permits deeper trenches 180 with straighter side surfaces. To create deep anisotropic etching of silicon, the etch process switches between different plasma chemistries to provide fluorine-based etching of the silicon while protecting the side surface of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 180. Alternatively, trenches 180 can be formed by LDA, plasma etching, reactive ion etching (RIE), sputter etching, vapor phase etching, and chemical etching. A first mask (not shown) is typically formed over surface 132 to isolate trenches 180 during the etching process.

In FIG. 4*v*, side surfaces 182 of trenches 180 are implanted with an impurity, which may occur at predetermined angles Φ1, Φ2. The implantation angles are determined by the width of trenches 180 and the desired doping depth, and is typically from about 2° to 20° from vertical. More generally, tangent of implant angle is given by width/depth, i.e., tan(implant angle)=width/depth. An n-type impurity, such as P, Sb, or As, is implanted between surface 132 and surface 126. The implantation is done at angles Φ1, Φ2 so that bottom surface 184 of each trench 180 is not doped. The implant is performed at an energy level of about 30-200 kilo-electron-volts (KeV) with a dose between 1e16 to 1e18 atoms/$cm^3$. In this structure, implant dopant type is N and substrate 122 is N-type, thus it is not a matter if impurity is implanted into bottom surface or not.

Figure 4X:
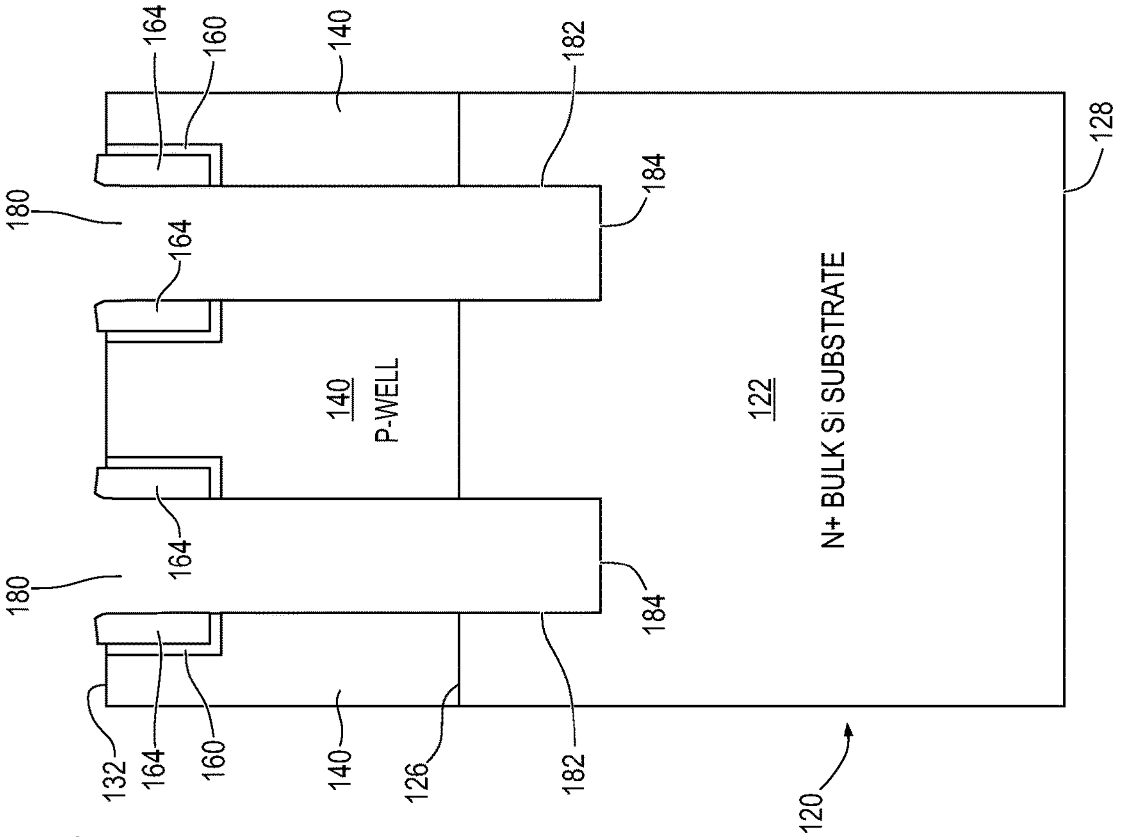
Figure 4W:
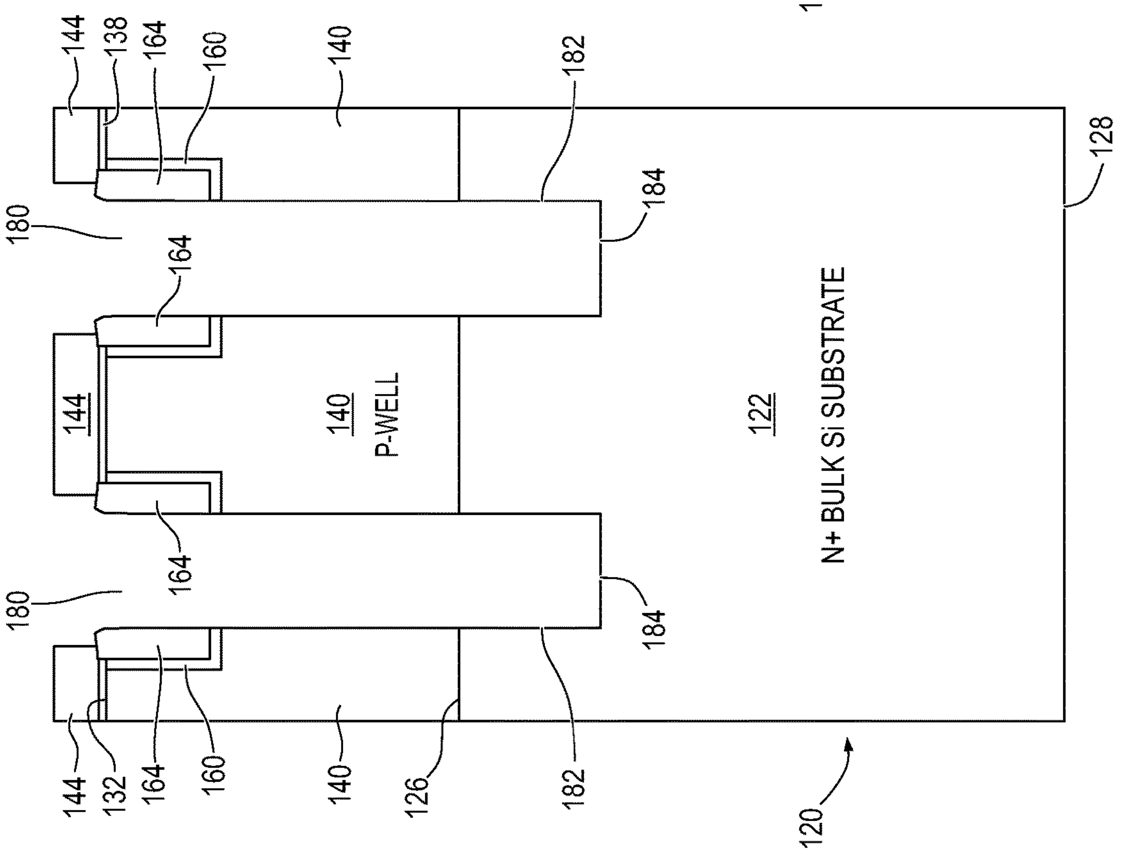

In FIG. 4*w*, the remaining portion of insulating layer 170 is removed by an etching process or LDA. In FIG. 4*x*, the remaining portion of insulating layers 138 and 144 is removed by an etching process or LDA.

Figure 4Z:
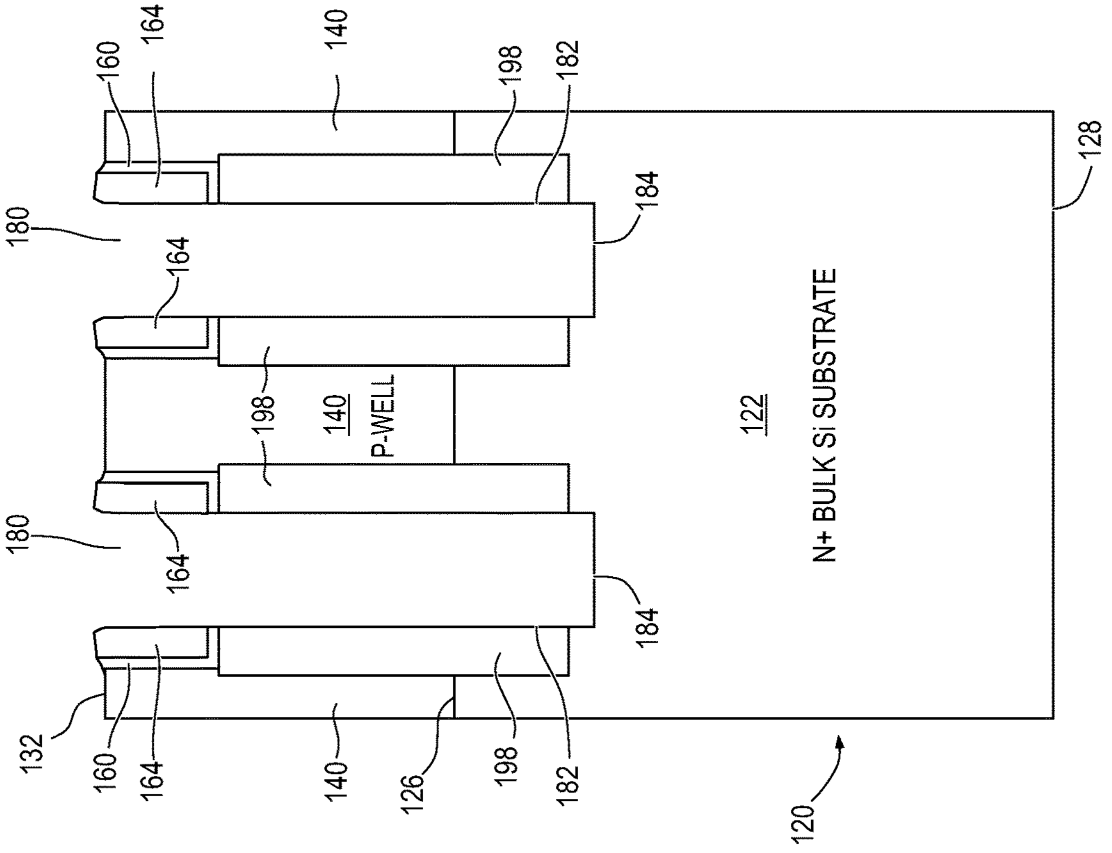
Figure 4Y:
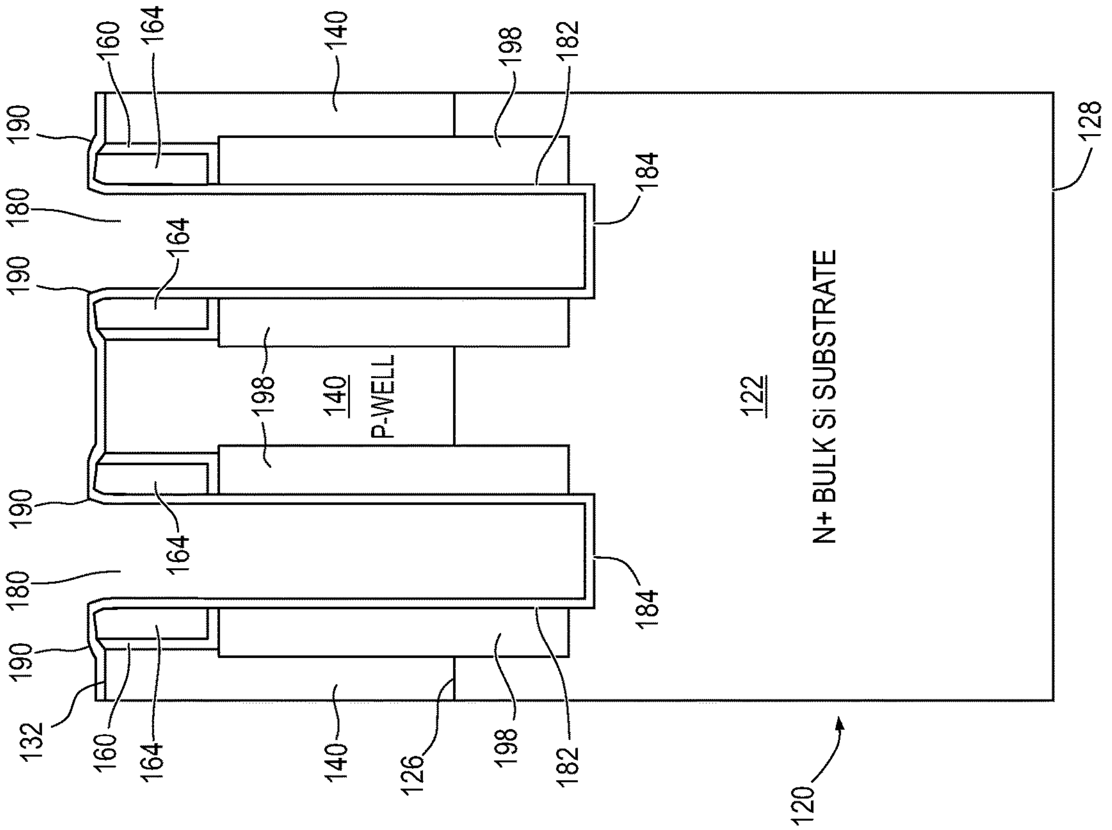
Figure 4A:
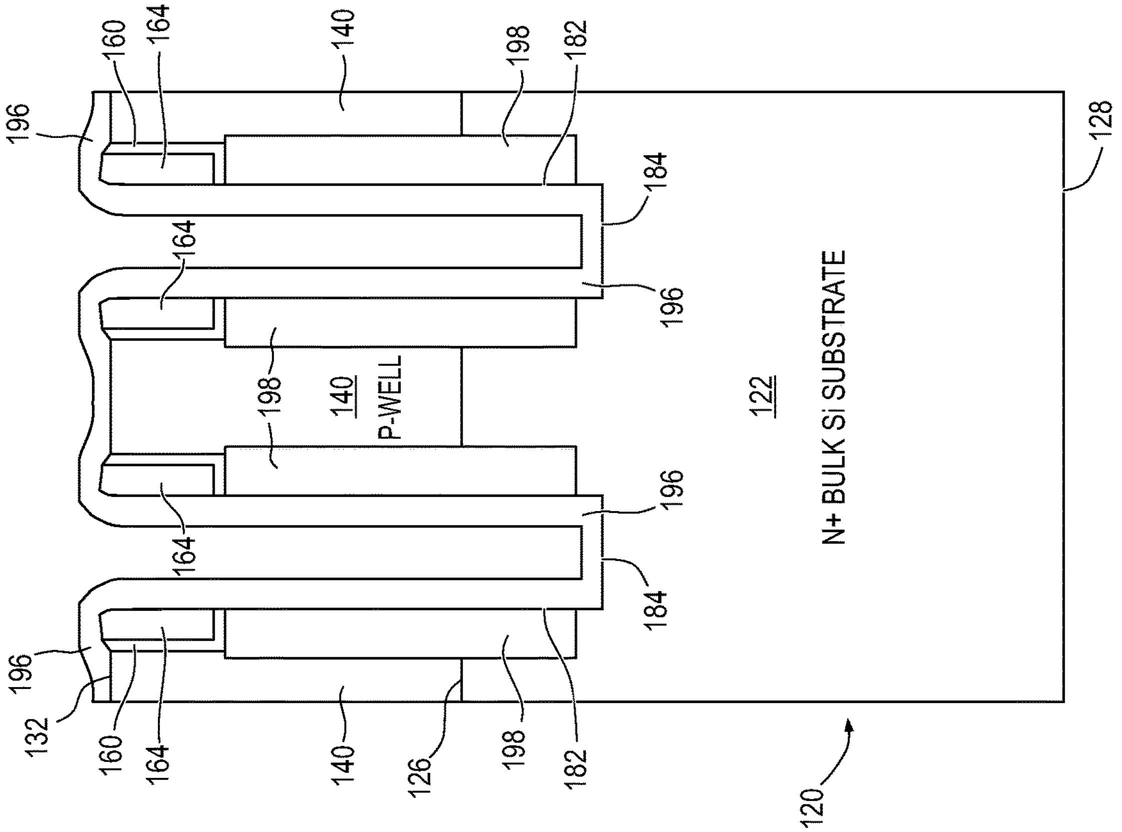
Figure 4A:
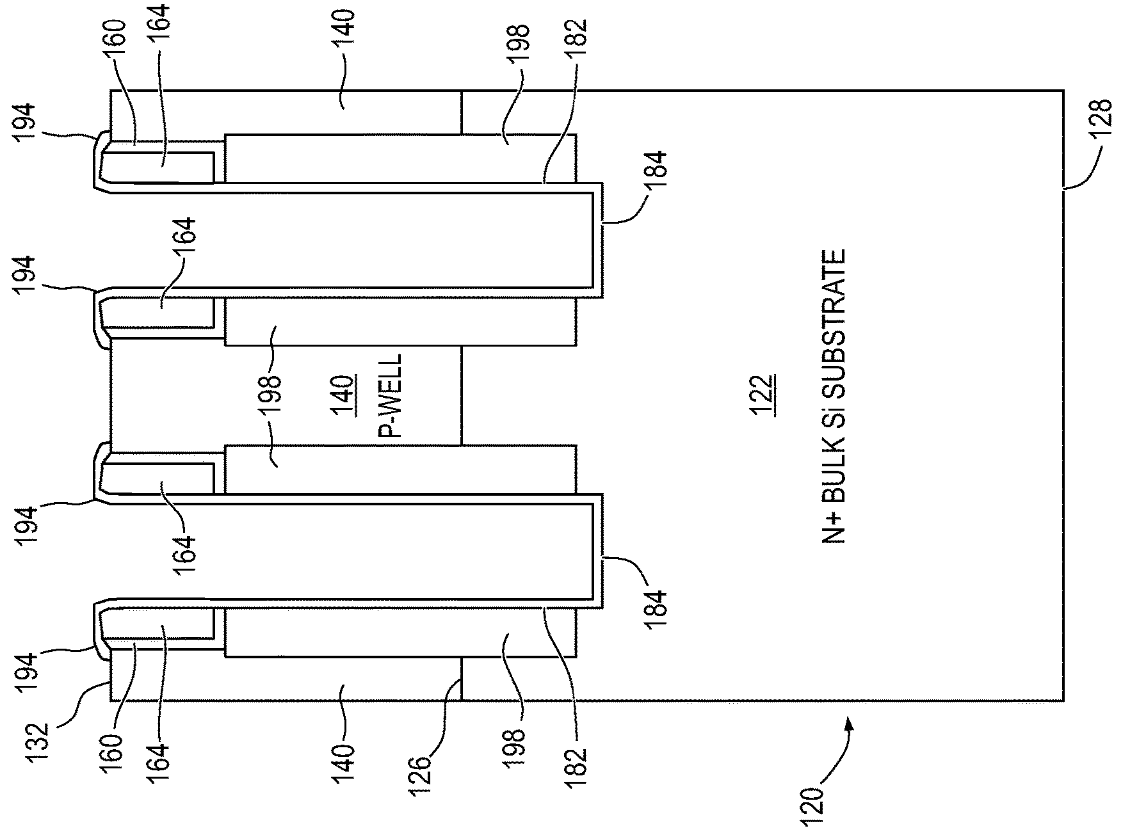
Figure 4A:
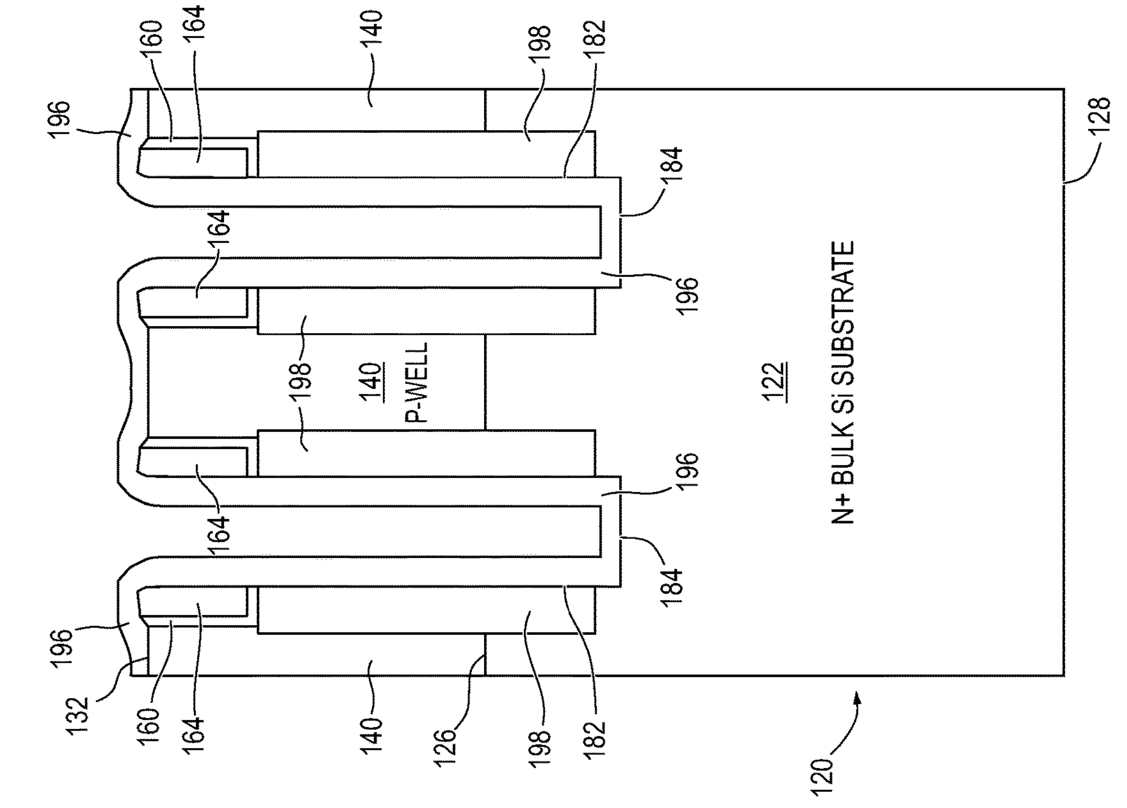
Figure 4A:
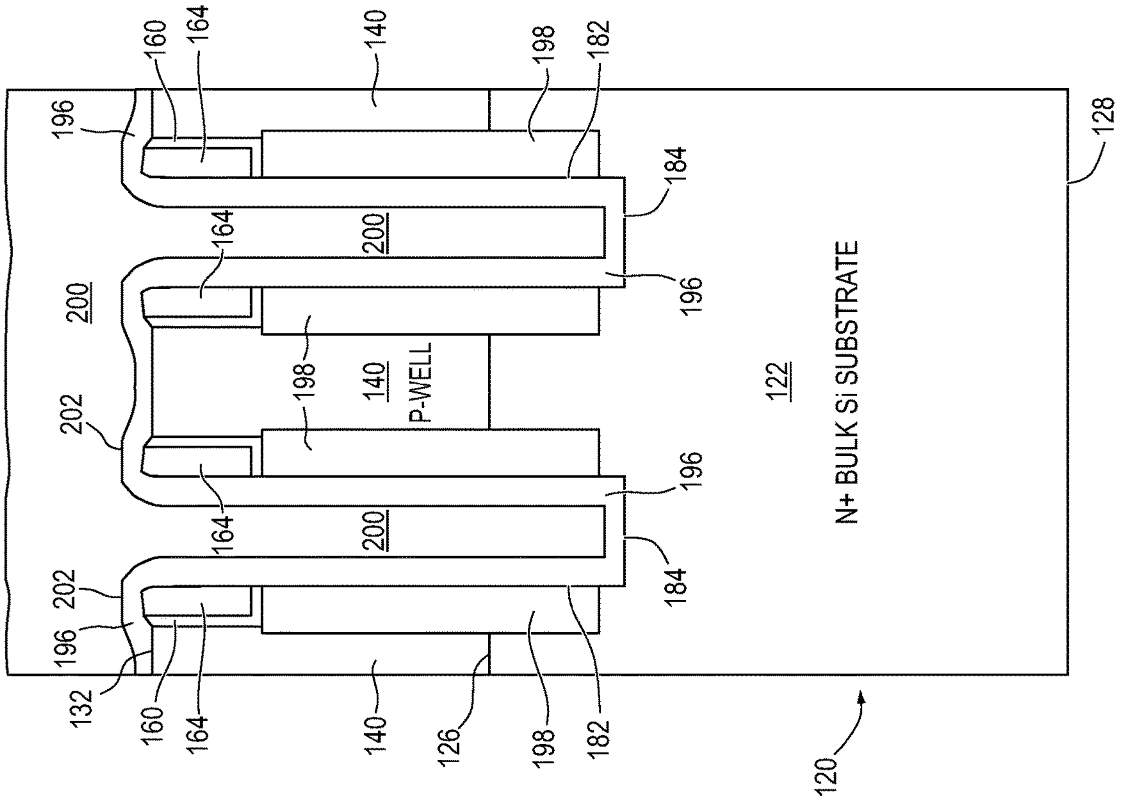
Figure 4A:
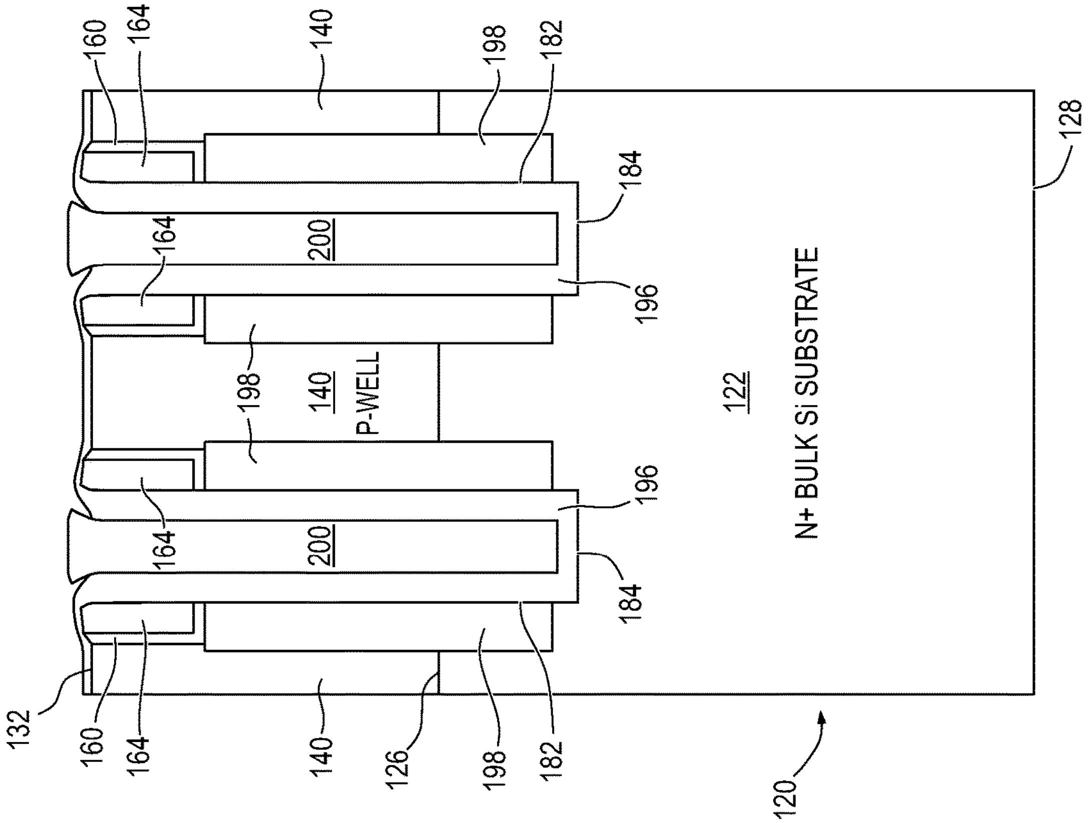
Figure 4A:
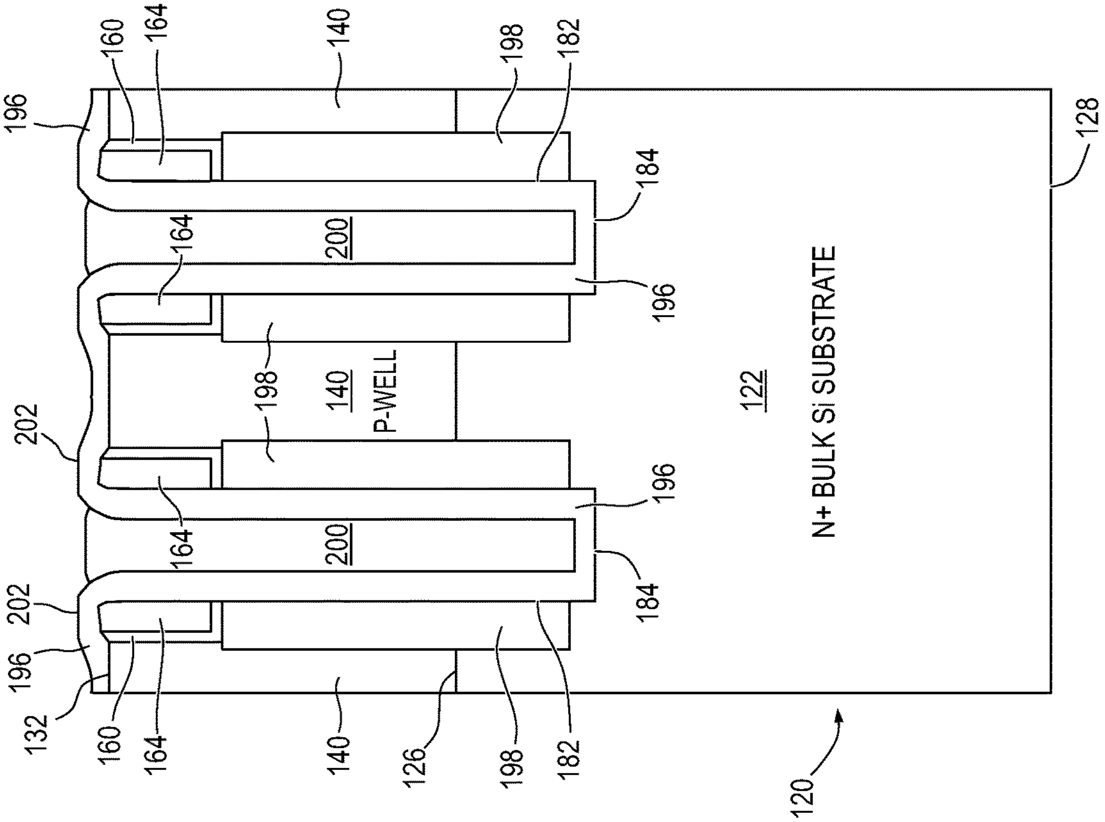
Figure 4A:
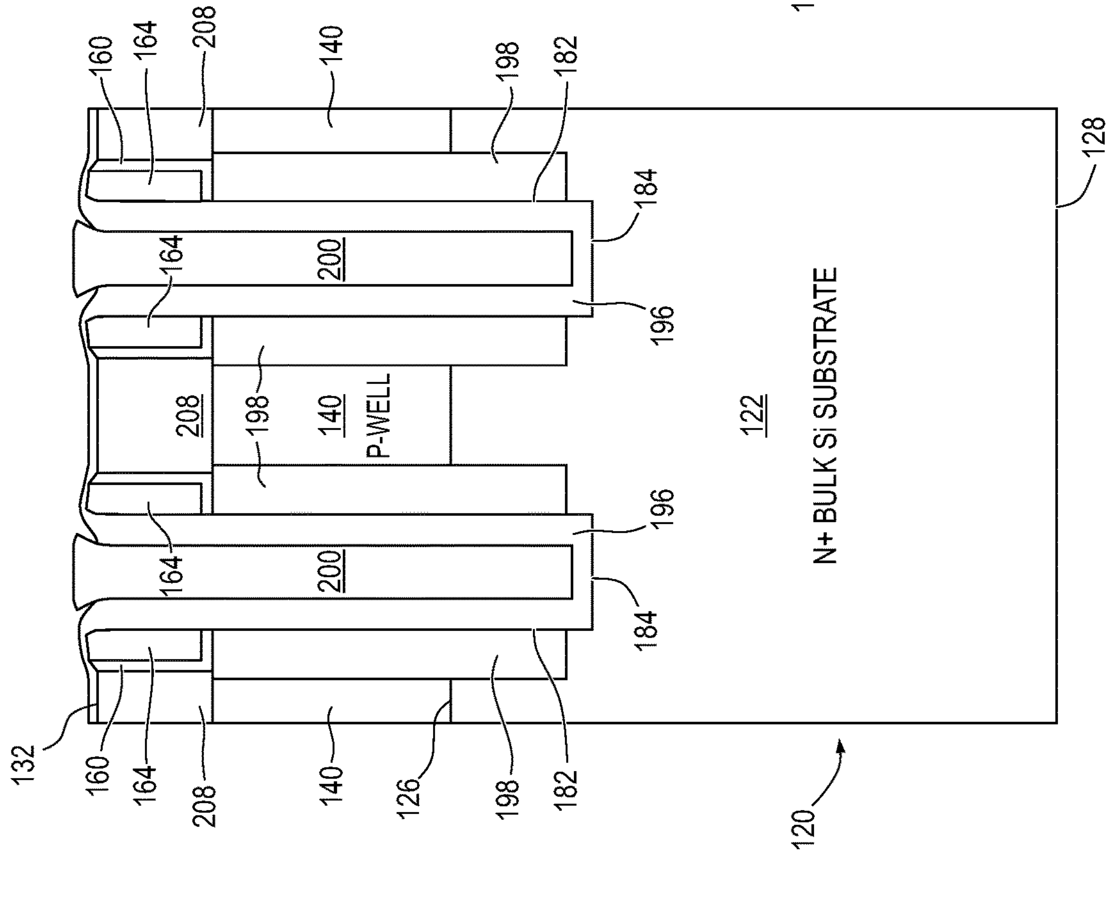
Figure 4A:
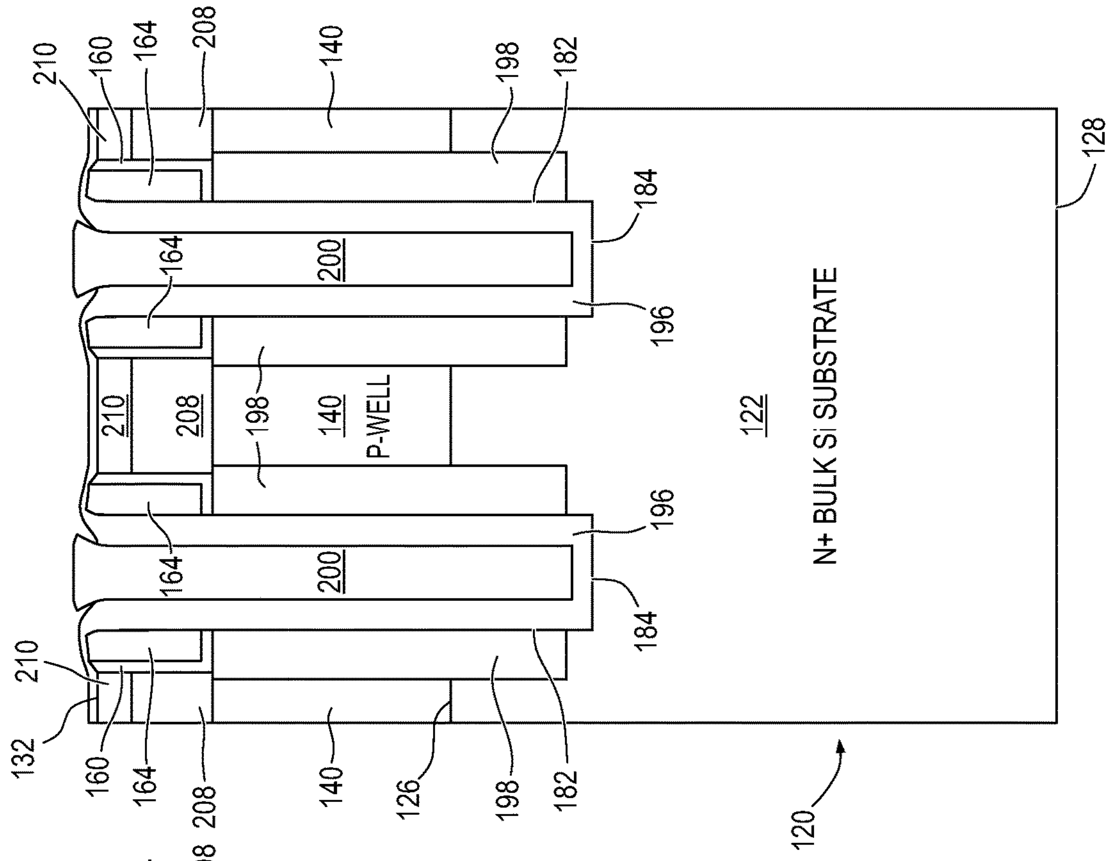
Figure 4A:
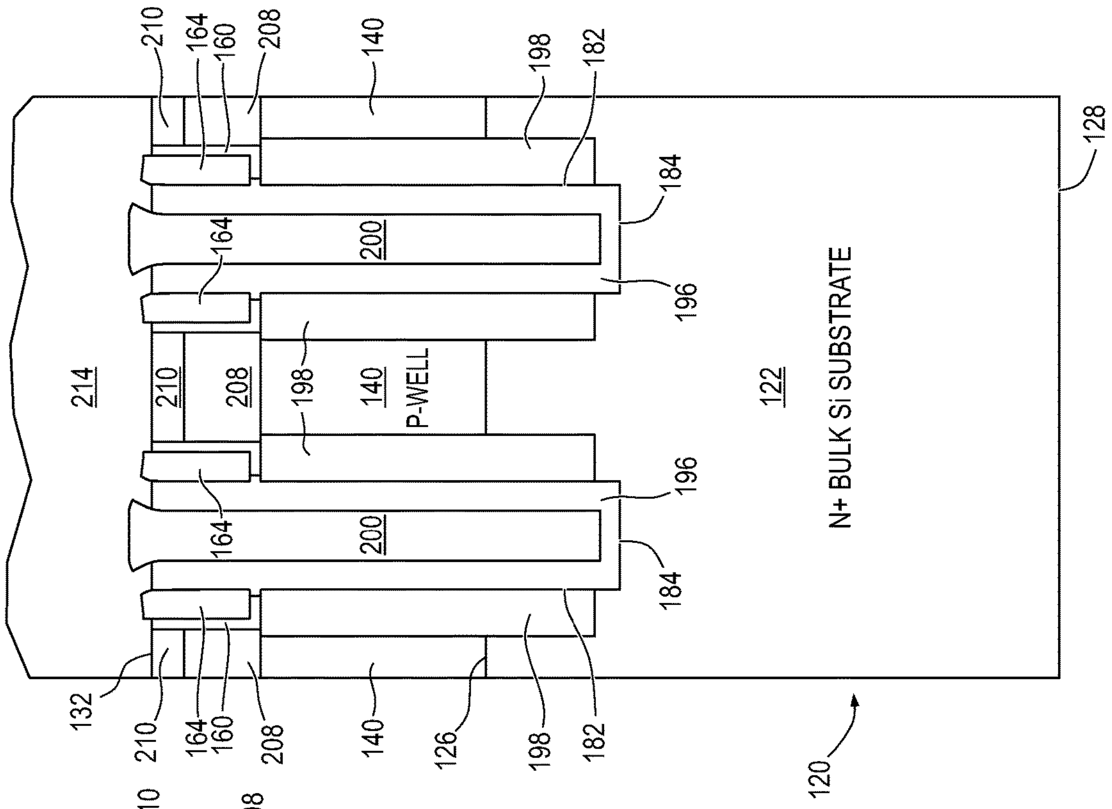
Figure 4A:
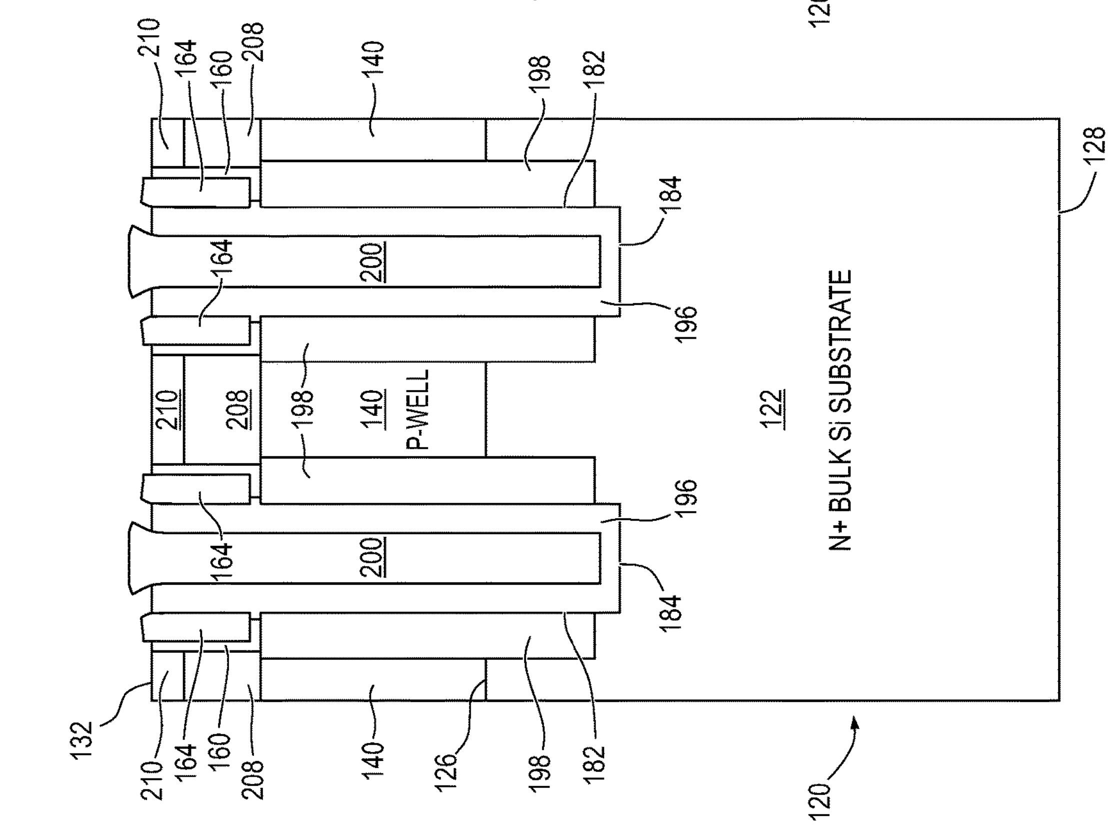
Figure 4A:
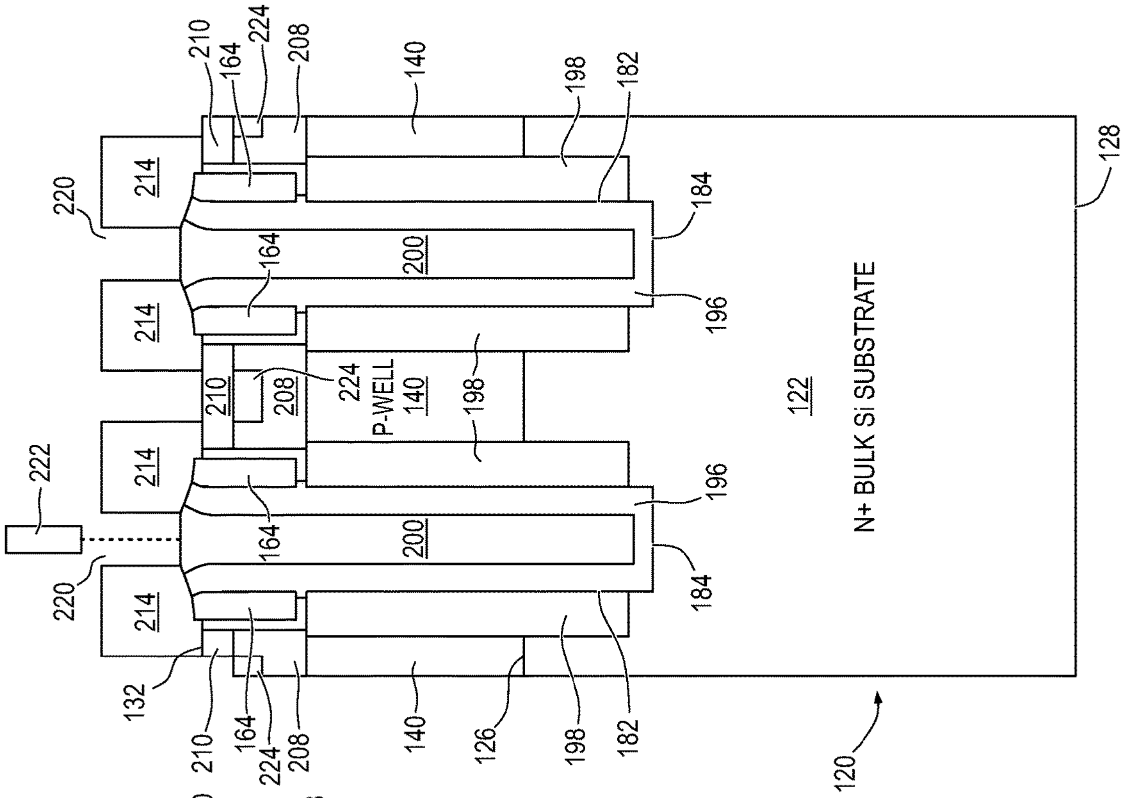
Figure 4A:
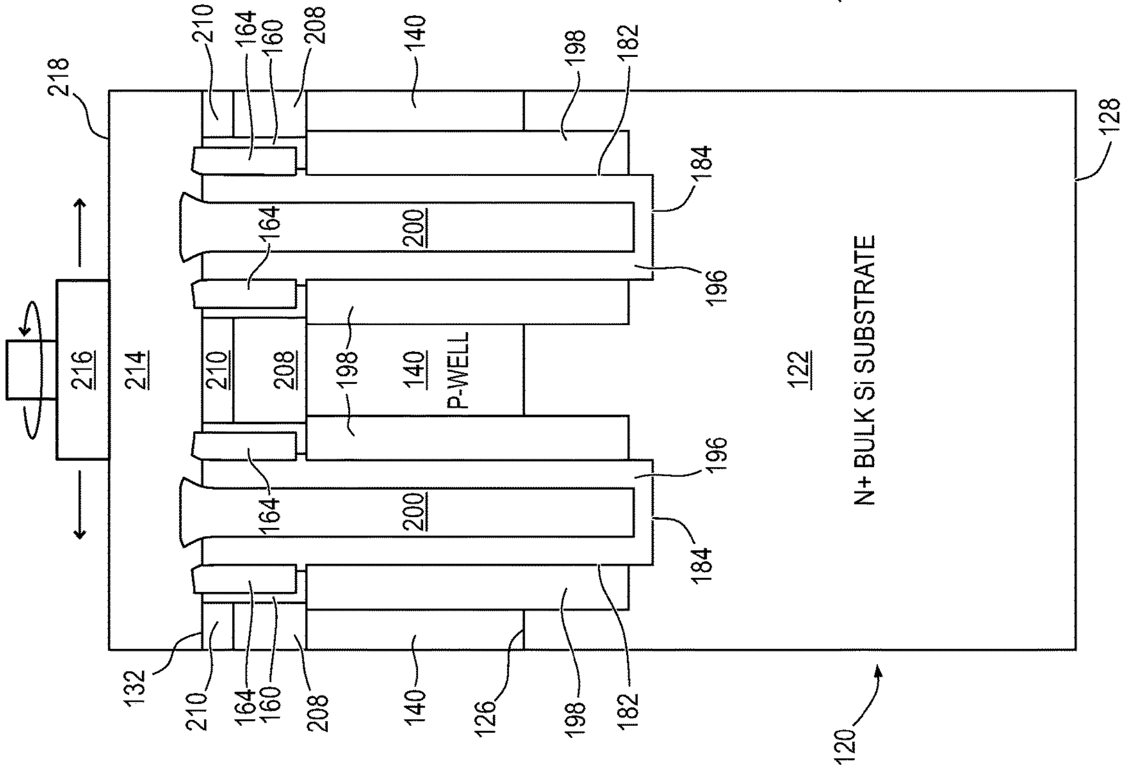
Figure 4A:
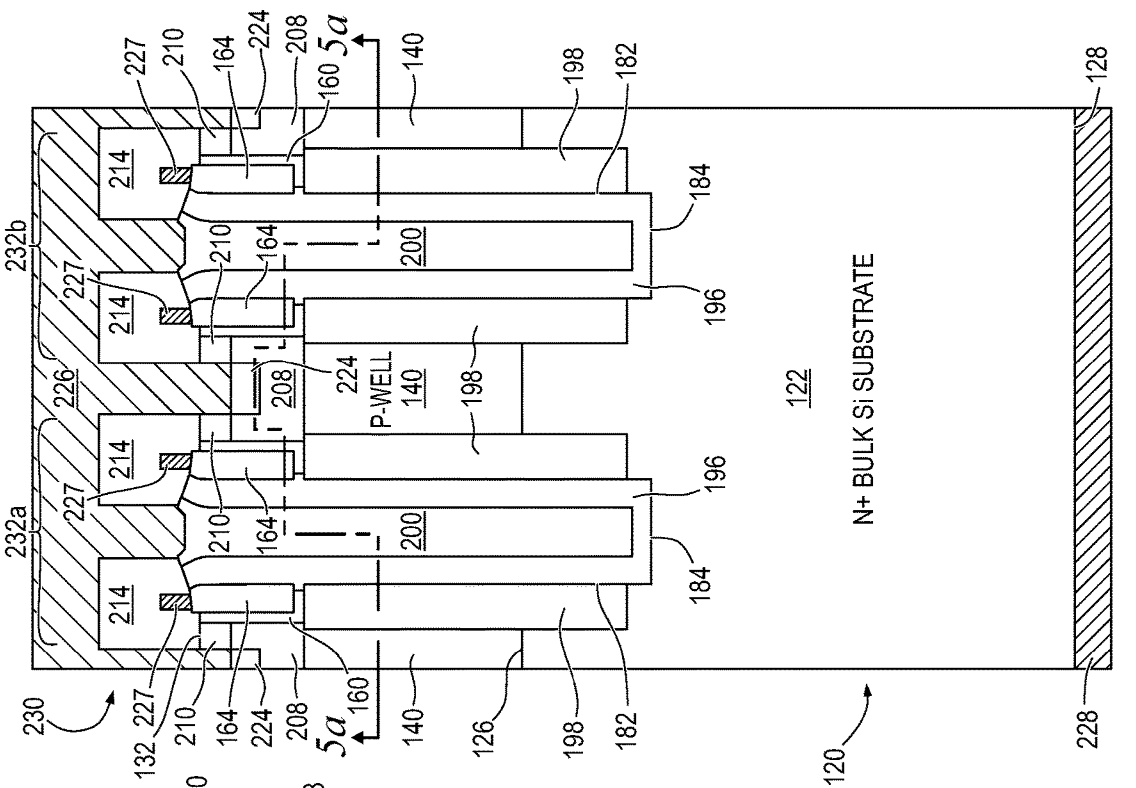
Figure 4A:
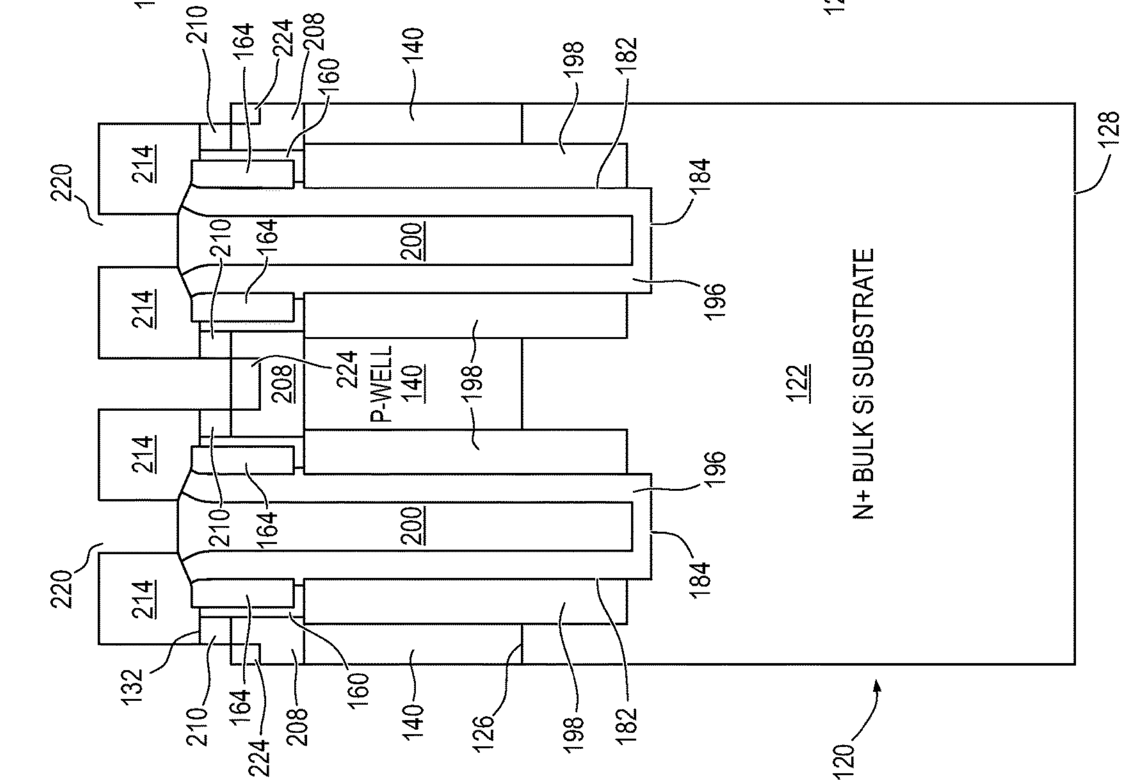

The side surfaces 182 of each trench 180 can be smoothed using an isotropic plasma etch and may be used to remove a thin layer of silicon, e.g., 100-1000 Angstroms (A) from the trench side surfaces. Alternatively, insulating layer 190 is formed over surface 126 of semiconductor layer 130, including over polysilicon material 164 and into trench 180, as shown in FIG. 4*y*. Insulating layer 190 conformally covers surface 132 of semiconductor layer 130, side surfaces 182, and bottom surface 184 of trench 180. In one embodiment, insulating layer 190 is a sacrificial oxide layer or silicon dioxide layer. The sacrificial thermal oxide 190 is then removed using an etch, such as a buffered oxide etch, or a diluted hydrofluoric (HF) acid etch, or other wet chemistry followed by HF vapor phase fuming, to smooth the inner wall, as shown in FIG. 4*z*. Another sacrificial thermal oxide layer 190 is again grown on side surfaces 182 of trenches 180, similar to FIG. 4*y*. The sacrificial thermal oxide layer 190 is again removed by wet chemistry followed by HF vapor phase fuming to smooth the inner wall, similar to FIG. 4*z*. The process of repetitive growth of thermal oxide and removal continues multiple times, in accordance with FIGS. 4*y*-4*z*, until side surface 182 of trench 180 is smooth. By eliminating the scalloping from the DRIE etch and using sacrificial thermal oxide layer 190 followed by HF fuming or any oxide and silicon etches, side surface 182 can be smoothed to a tapered form. The use of the smoothing techniques can produce smooth trench surfaces with rounded corners while removing residual stress and unwanted contaminates. The n-type impurities implanted in FIG. 4*v* are initially driven-in, at a temperature of up to 850-900° C. for 30-60 minutes, to form n-drift region or column 198 having a width of 0.15 μm.

In FIG. 4*aa*, insulating layer 194 is formed over polysilicon material 164 and at least part way into trench 180 to cover the polysilicon material. In one embodiment, insulating layer 194 is a gate oxide layer. In FIG. 4*ab*, insulating layer 196 is formed over surface 132 of semiconductor layer 130, insulating layer 194, and into trench 180. In one embodiment, insulating layer 196 is an oxide layer. Insulating layer 196 conformally covers surface 132 of semiconductor layer 130, side surfaces 182, and bottom surface 184 of trench 180.

In FIG. 4*ac*, the n-type impurities implanted in FIG. 4*v* are given a second driven-in to adjust the doping distribution of n-drift region or column 198. The formation of n-column 198 leaves p region or column 140 from the p well. The doping preferably occurs with the aid of a mask (not shown) placed over surface 132 of semiconductor layer 130.

In FIG. 4*ad*, polysilicon material 200 is formed over insulating layer 196 and into trench 180. Polysilicon material 200 can be formed by PVD, CVD, screen printing, spin coating, spray coating, or other suitable deposition process. In FIG. 4*ae*, a portion of polysilicon material 200 is removed by CMP to planarize the polysilicon material to a level even with surface 202 of insulating layer 196. Alternatively, a portion of polysilicon material 200 is removed by etching or LDA to planarize the polysilicon material to a level even with surface 202 of insulating layer 196. In FIG. 4*af*, a portion of insulating layer 196 is removed by an etching process to a level even with surface 132 of semiconductor layer 130. Polysilicon material 200 operates as a field plate.

In FIG. 4*ag*, surface 132 of semiconductor layer 130 is implanted with a p-type impurity, such as B, Al, or Ga. The implant is performed at an energy level of about 30-200 kilo-electron-volts (KeV) with a dose between 1e16 and 1e18 atoms/$cm^3$, preferably 4e17 atoms/$cm^3$. The p-type impurities are driven-in, at a temperature of 900° C. for 10-30 minutes, to form p body 208.

In FIG. 4*ah*, surface 132 of semiconductor layer 130 is implanted with an n-type impurity, such as P, Sb, or As. The implant is performed at an energy level of about 30-200 kilo-electron-volts (KeV) with a dose of 1e20 atoms/$cm^3$. The n-type impurities are driven-in, at a temperature of 900° C. for 60 minutes, to form n+ source region 210.

In FIG. 4*ai*, a portion of insulating layer 196 is removed by an etching process or LDA to expose a top surface of polysilicon material 164. In FIG. 4*aj*, insulating layer 214 is formed over surface 132 of semiconductor layer 130 and polysilicon material 164. In one embodiment, insulating layer 214 is an oxide layer and operates as an interlayer dielectric (ILD).

In FIG. 4*ak*, a portion of insulating layer 214 is removed by grinder 216 to planarize surface 218 of the insulating layer. Alternatively, a portion of insulating layer 214 is removed by CMP or LDA to planarize surface 218. In FIG. 4*al*, a portion of insulating layer 214 is removed by an etching process or LDA to form vias 220 through the insulating layer to polysilicon material 200 and to n+ source region 210. In FIG. 4*am*, a portion of n+ source region 210 is removed by an etching process or LDA to extend those vias 220 to p body 208. The p body 208 is implanted with a p-type impurity, such as B, Al, or Ga, through via 220. The implant is performed at an energy level of about 30-200 kilo-electron-volts (KeV) with a dose between 1e19 and 1e20 atoms/$cm^3$. The p-type impurities are driven-in, at a temperature of 850° C. for 10 minutes, to form p+ contact 224.

In FIG. 4*an*, conductive layer 226 is formed over insulating layer 214 and extending into vias 220 to polysilicon layer 200 (field plate) and n+ source region 210 and p+ contact 224 in p body 208. Conductive layer 227 is formed over insulating layer 214 and extends to polysilicon layer 164. Conductive layer 228 is formed over surface 128 of substrate 120 as the backside drain contact. Conductive layers 226-228 are formed using PVD, CVD, electrolytic plating, electroless plating process, or other suitable metal deposition process. Conductive layers 226-228 can be one or more layers of Al, Cu, Sn, Ni, Au, Ag, or other suitable electrically conductive material. Conductive layer 226 provides the source contact and is further electrically connected to field plate 200, conductive layer 227 is the gate contact, and conductive layer 228 is the backside drain contact. A passivation layer (not shown) is typically formed over conductive layer 226. FIG. 4*an* shows two cells 232*a* and 232*b* of JEDIFET 230.

Figure 5A:
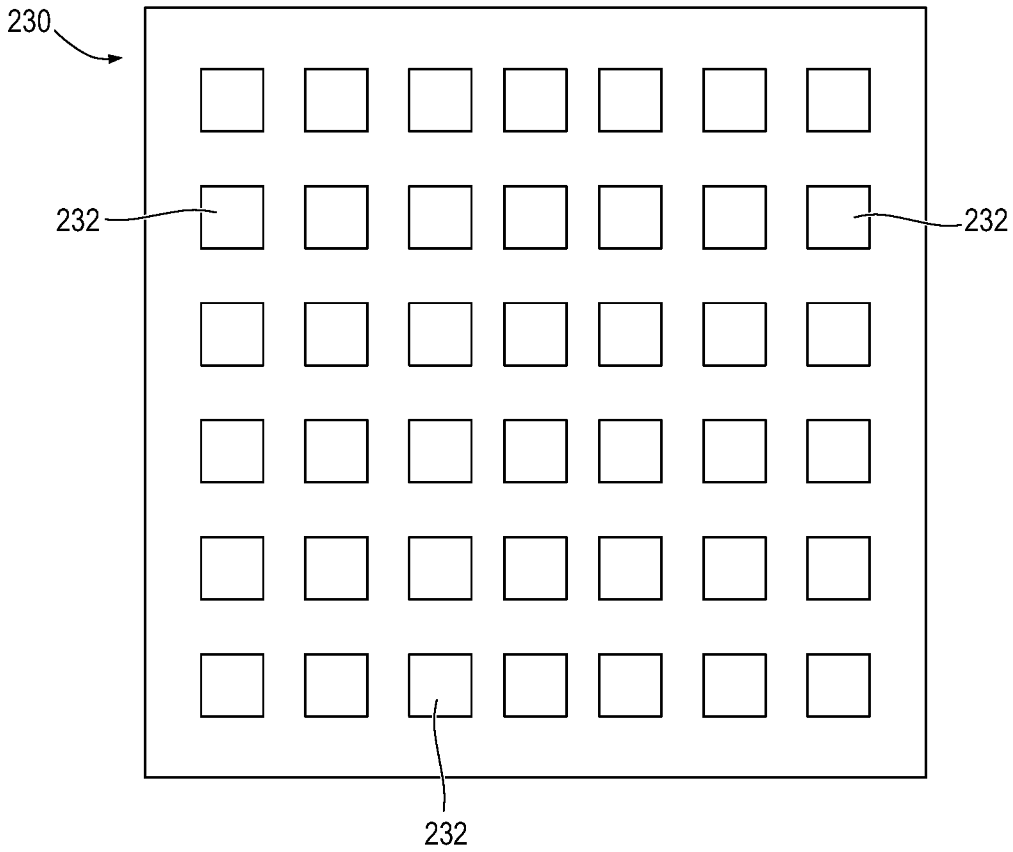
FIGS. 5*a*-5*c* illustrate a top view of the multi-cell power MOSFET and field plate.
Figure 5B:
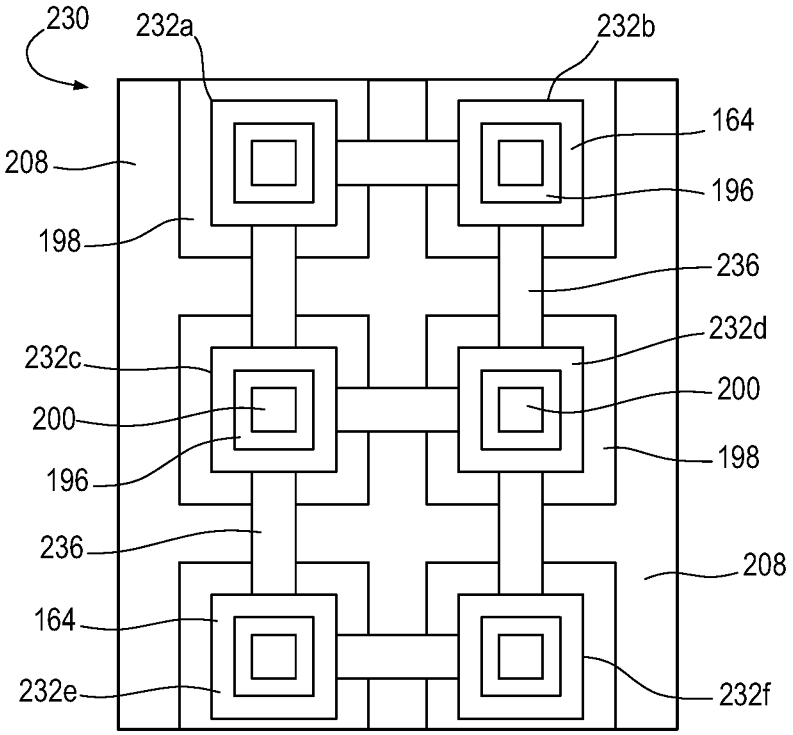

JEDIFET 230 is a multi-cell vertical power MOSFET having applications in DC-DC power converters, aerospace, and general purpose portable electrical devices, where the application requires minimum $R_{DSON}$ FIG. 5*a* is a top view showing multiple cells 232 arranged in an x by y array. In one embodiment, JEDIFET 230 contains 10 million cells. FIG. 5*b* is a top view of a portion of JEDIFET 230 showing six cells 232*a*-232*f*. In one embodiment, there is 1.0 μm between cell centers. JEDIFET 230 includes p column 140, n− column 258, gate region 164, insulating layer 196, and field plate 200. Polysilicon bridge 234 connects gate regions 164.

Figure 5C:
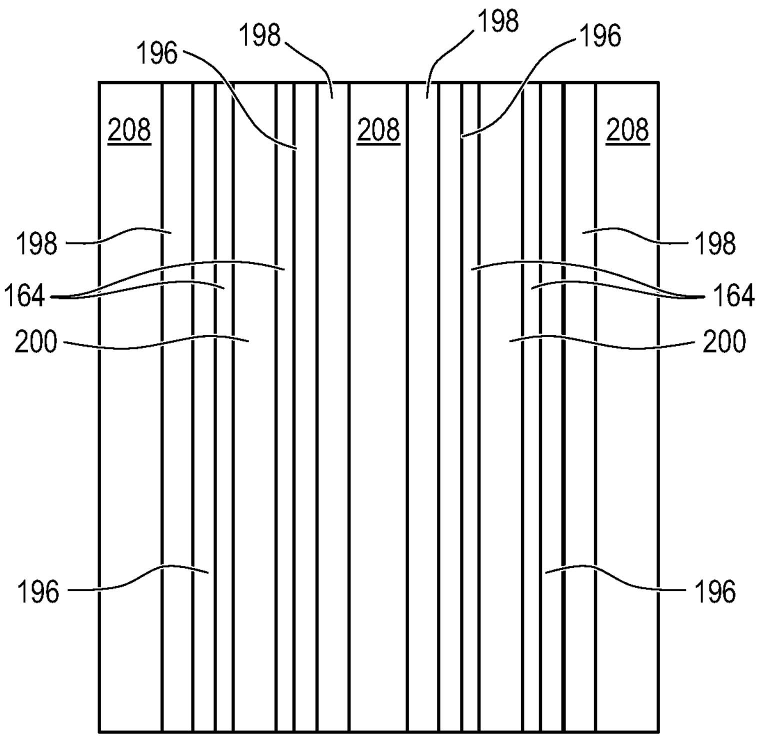

In another embodiment, FIG. 5*c* is a top view of a striped design for the JEDIFET including p body 208, n− column 198, gate regions 164, insulating layer 196, and polysilicon material 200.

JEDIFET 230 is a vertical transistor combining super-junction features (n− column 198 and p column 140) and field plate 200 to optimize or reduce drain-source resistance while the transistor is operating ($R_{DSON}$). JEDIFET 230 is also designated as JEDIFET R. The super-junction features (n− column 198 and p column 140) increase drain-source breakdown voltage (BVDSS). In JEFIFET 230, current flows vertically through n− drift region 198. A longer n− drift region increases BVDSS. The area utilization of n− column 198 is a function of the width of insulating layer 196, trench 180 spacing, and the width of the n− column. A square cell 232 shows larger n− column area utilization in the practical range of oxide width and n− column NC width. JEDIFET 230 is charge balanced by field plate 200, formed in trench 180 and electrically connected to source metal, in combination with n column 198 and p column 140, to assist with depletion of n column or drift region 198 and allow higher doping concentration to reduce $R_{DSON}$. The doping concentration in n column 198 can be increased to the reduced surface field (RESURF) limit to achieve a low on resistance per unit area (RONA). To increase cross sectional area of the n− drift region, field plate 200 is arranged separately as an island, with gate region 164 around each field plate. Gate region 164 of each island is bridged by polysilicon 234 between island on the surface. Silicide is used to reduce gate and bridge resistance.

Figure 6A:
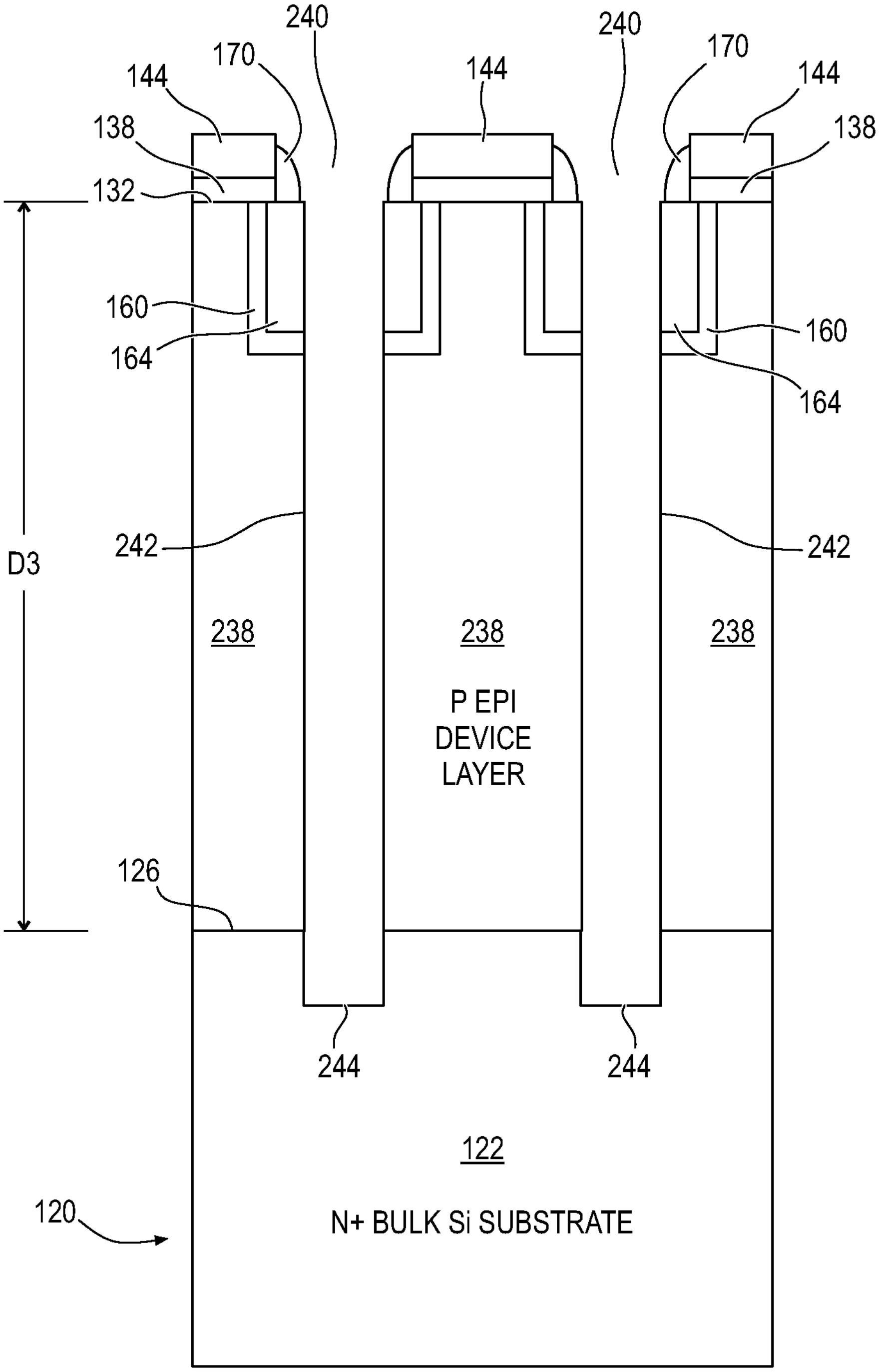
FIGS. 6*a*-6*s* illustrate a process of forming a multi-cell power MOSFET optimized for $C_{OSS}$.
Figure 6B:
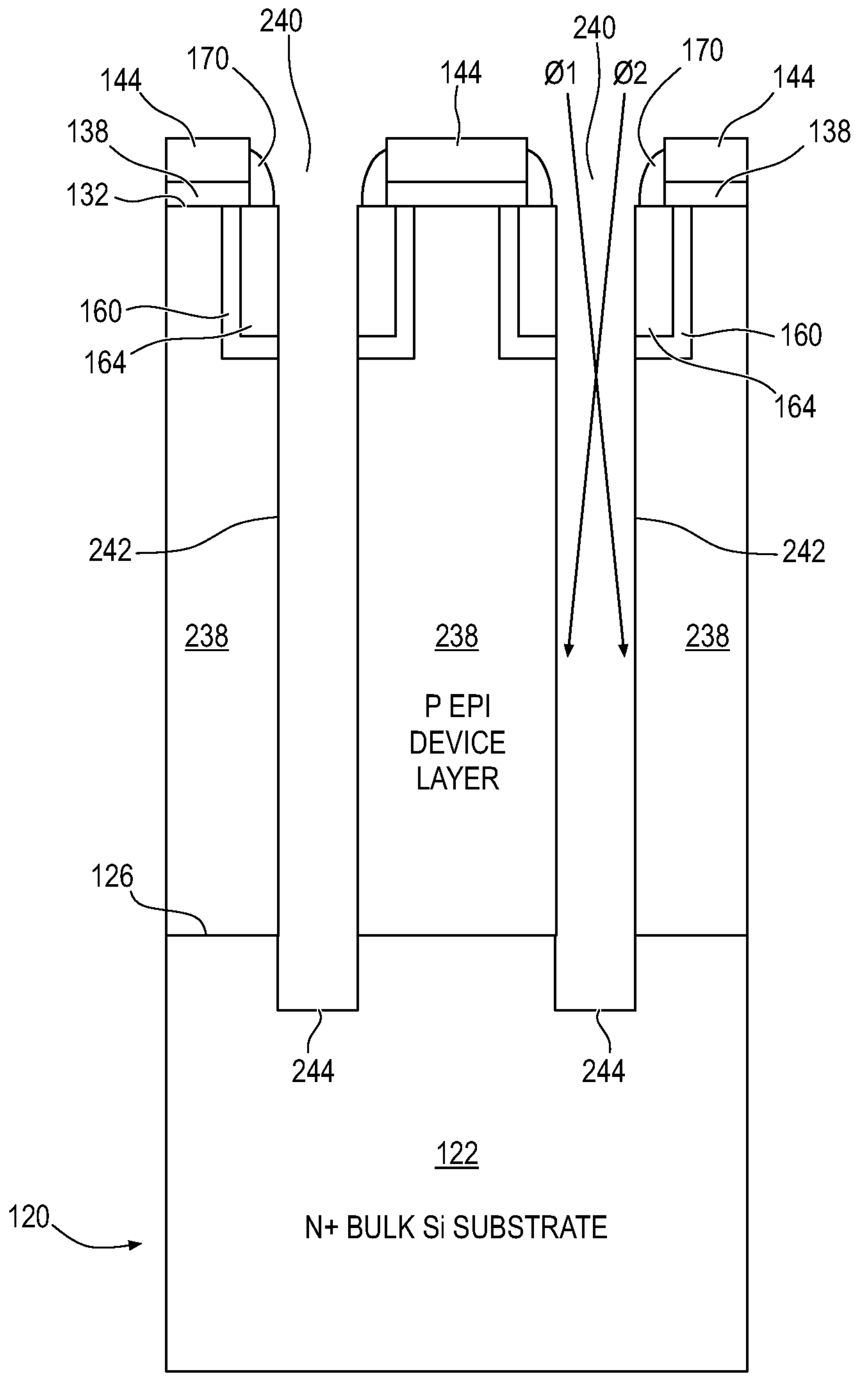
Figure 6C:
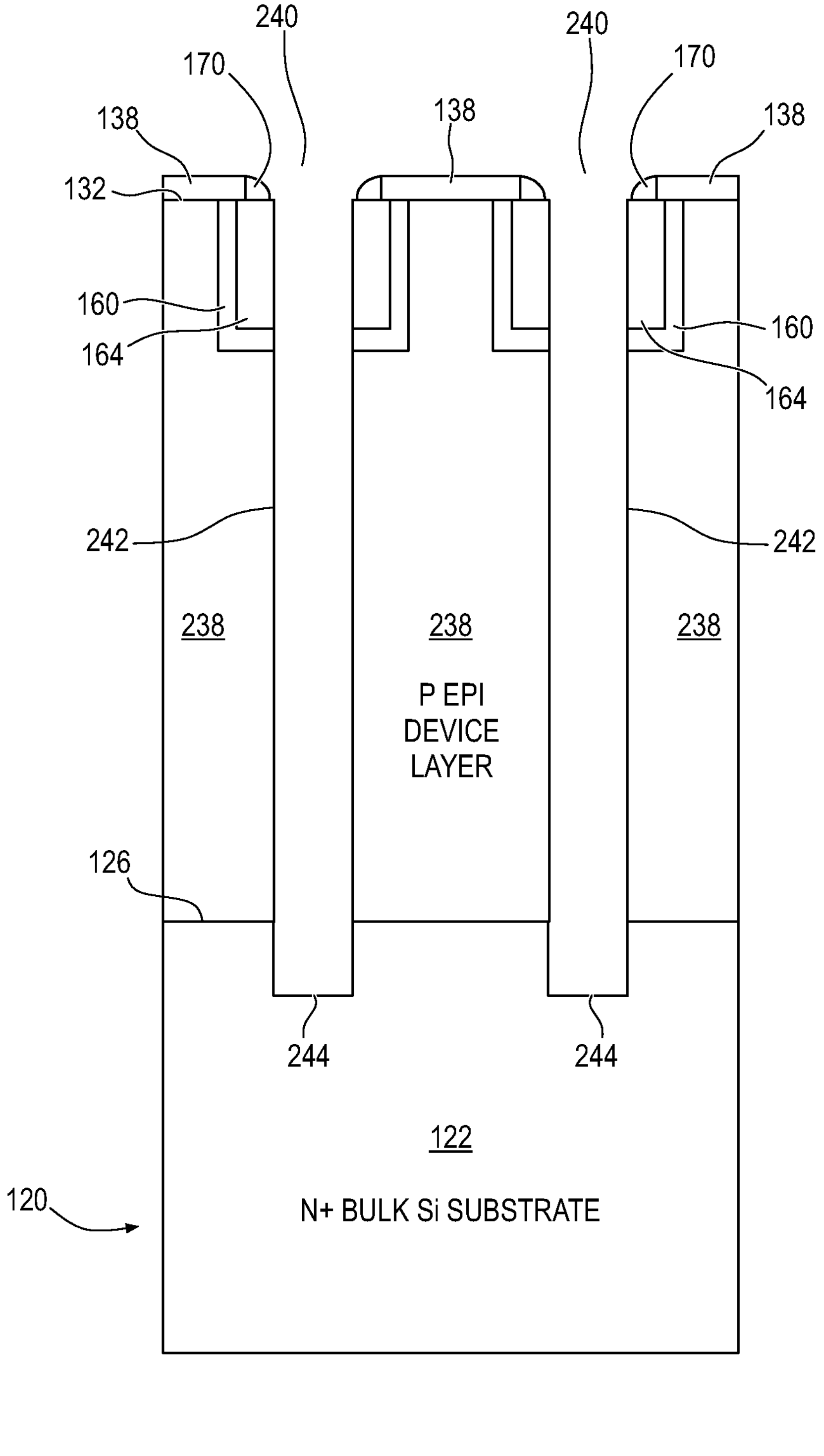
Figure 6D:
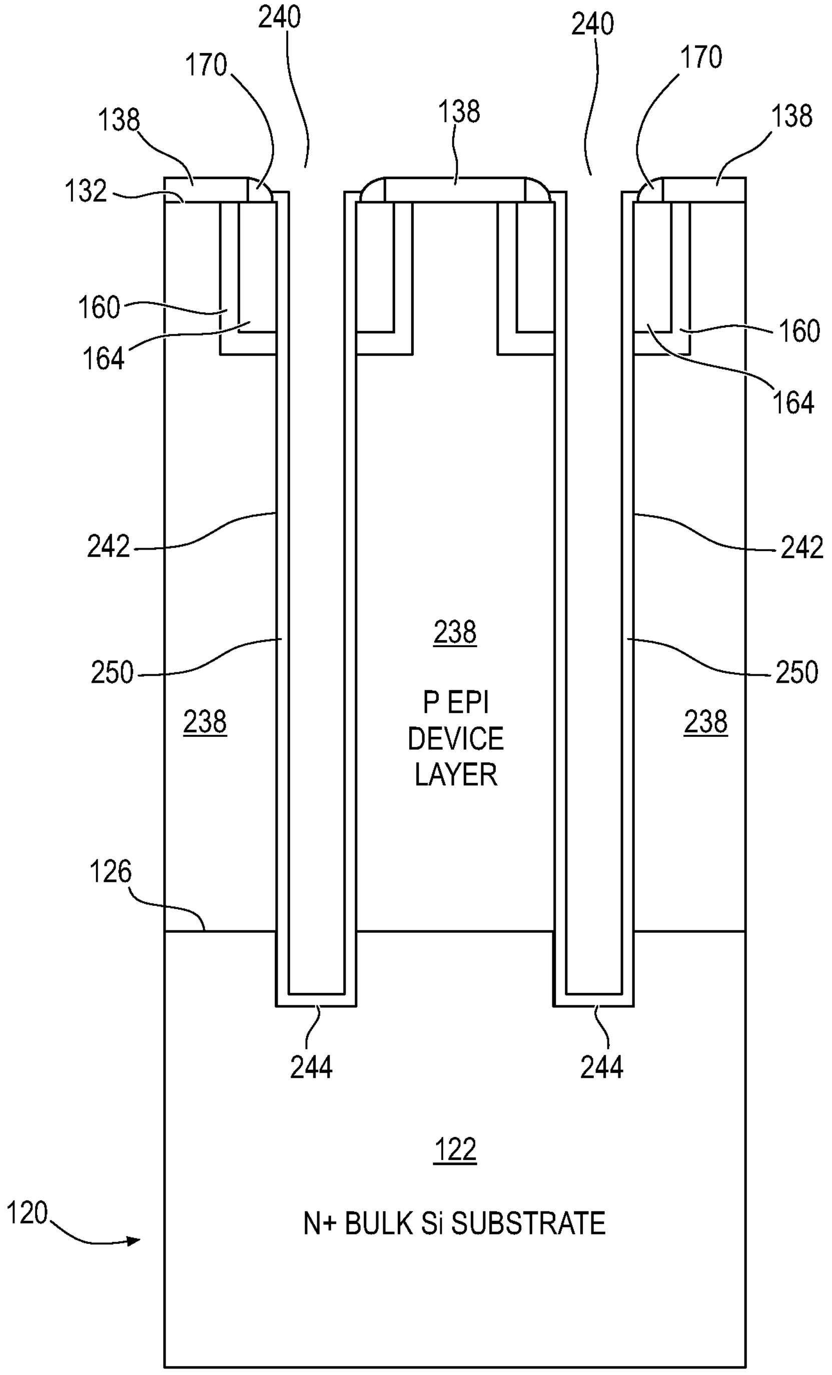
Figure 6E:
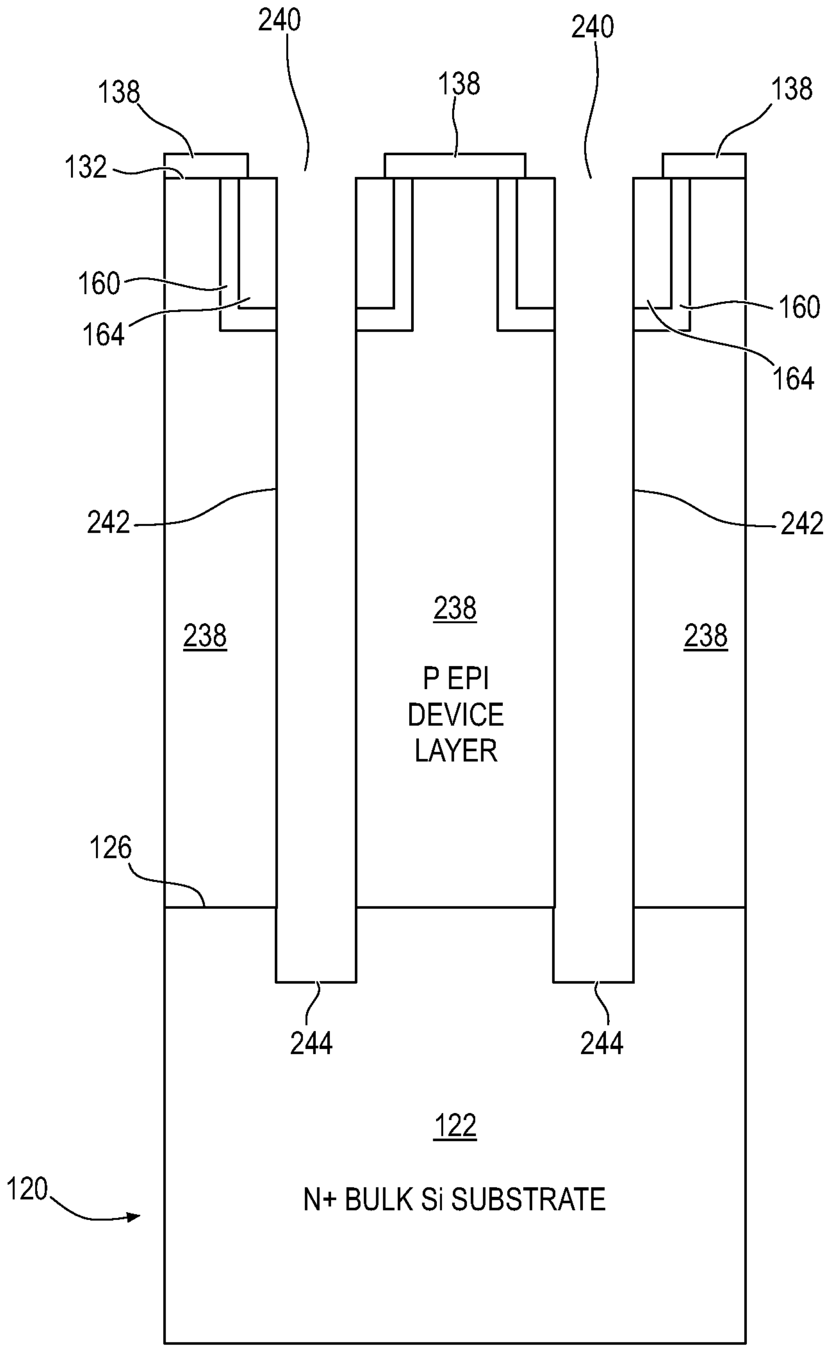
Figure 6F:
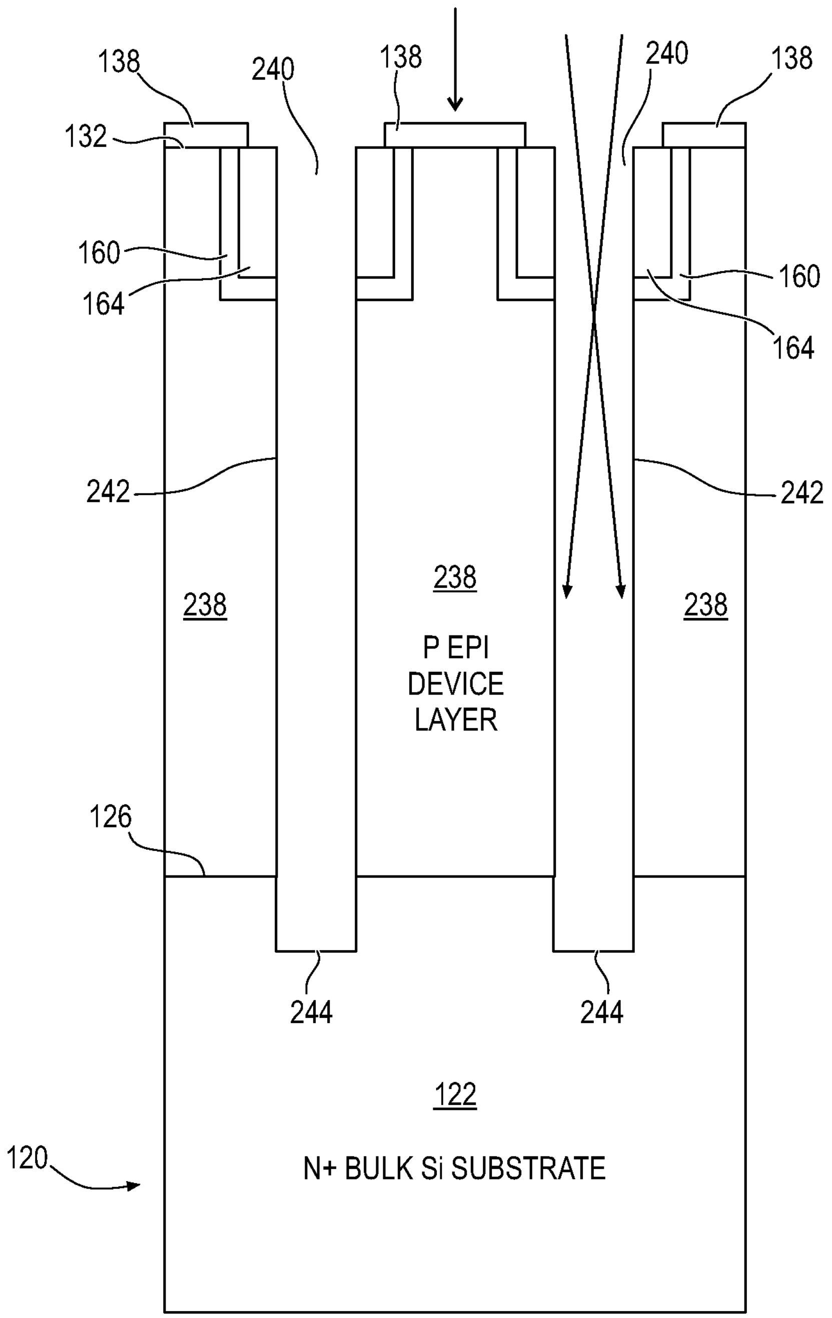
Figure 6G:
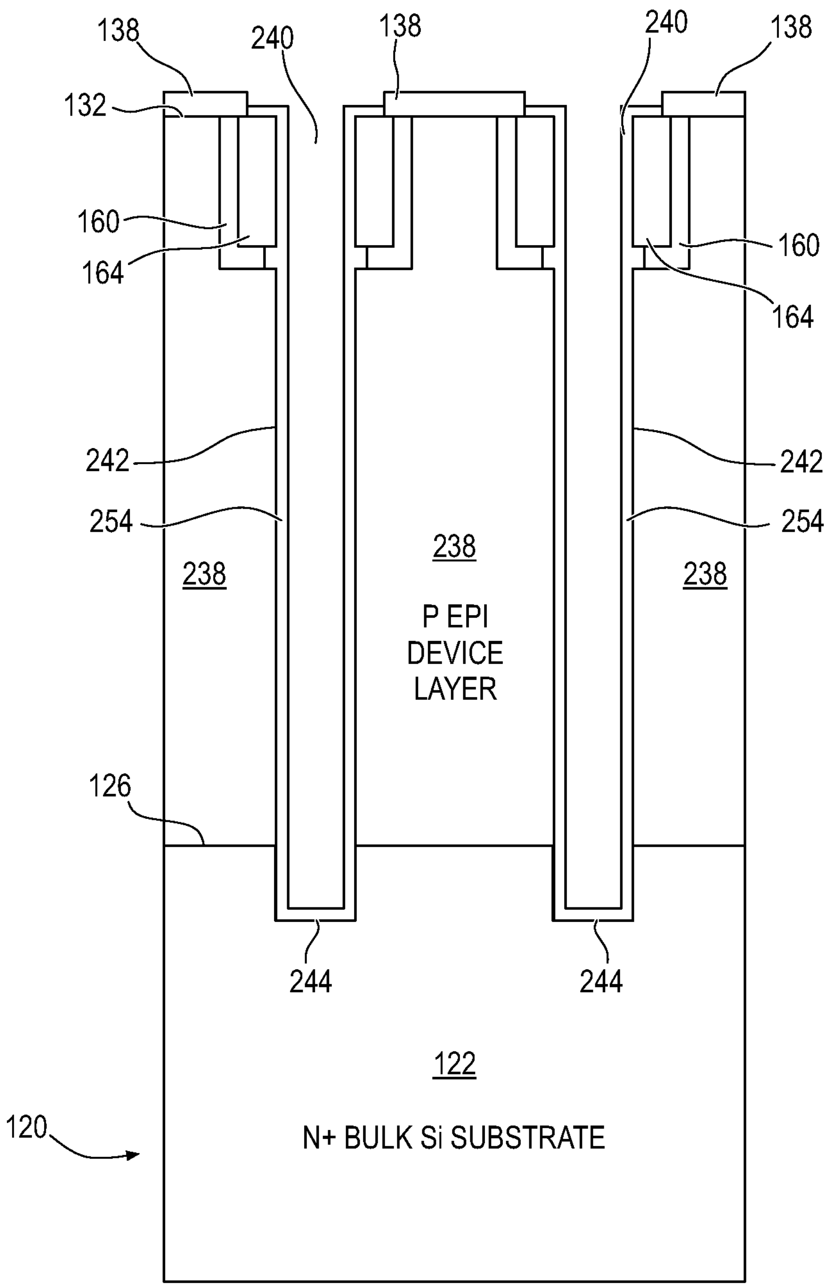
Figure 6H:
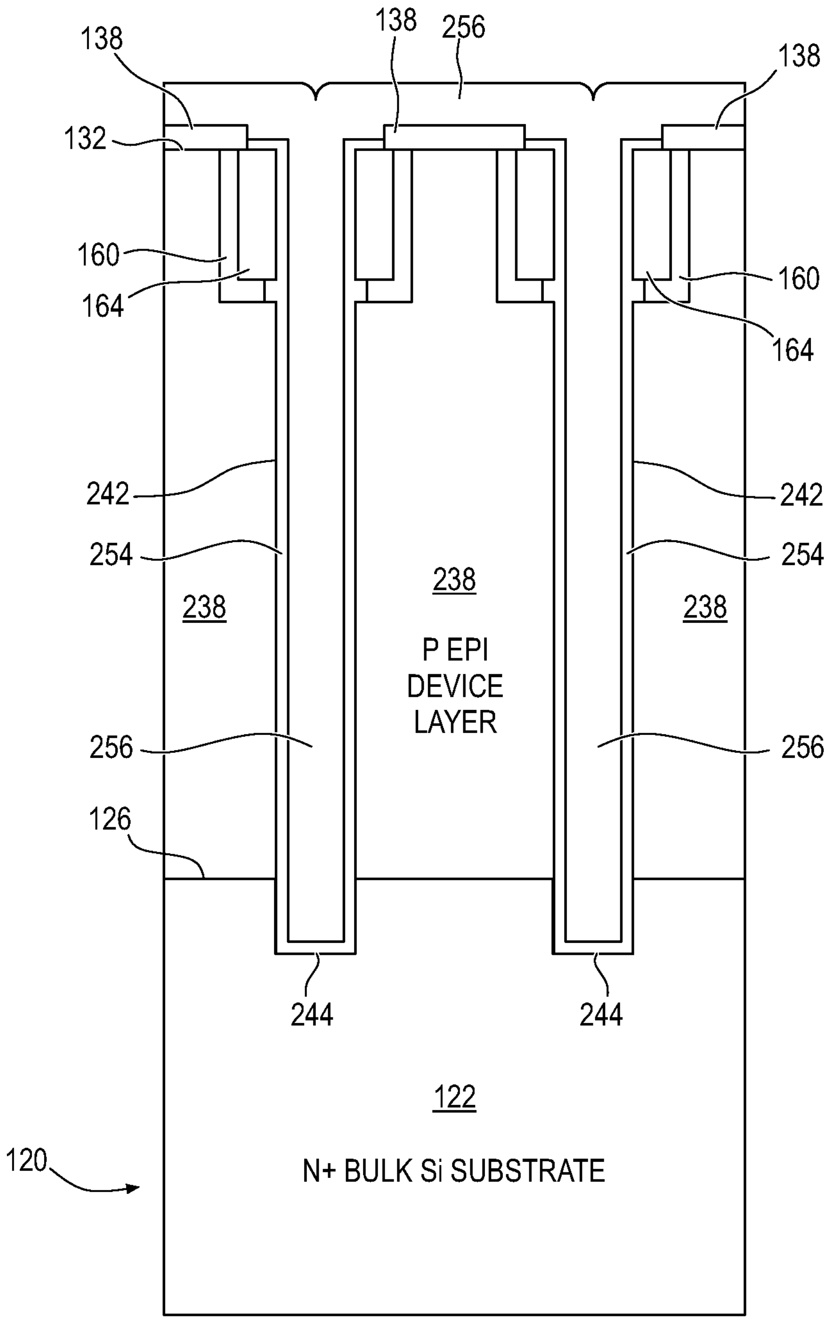
Figure 6I:
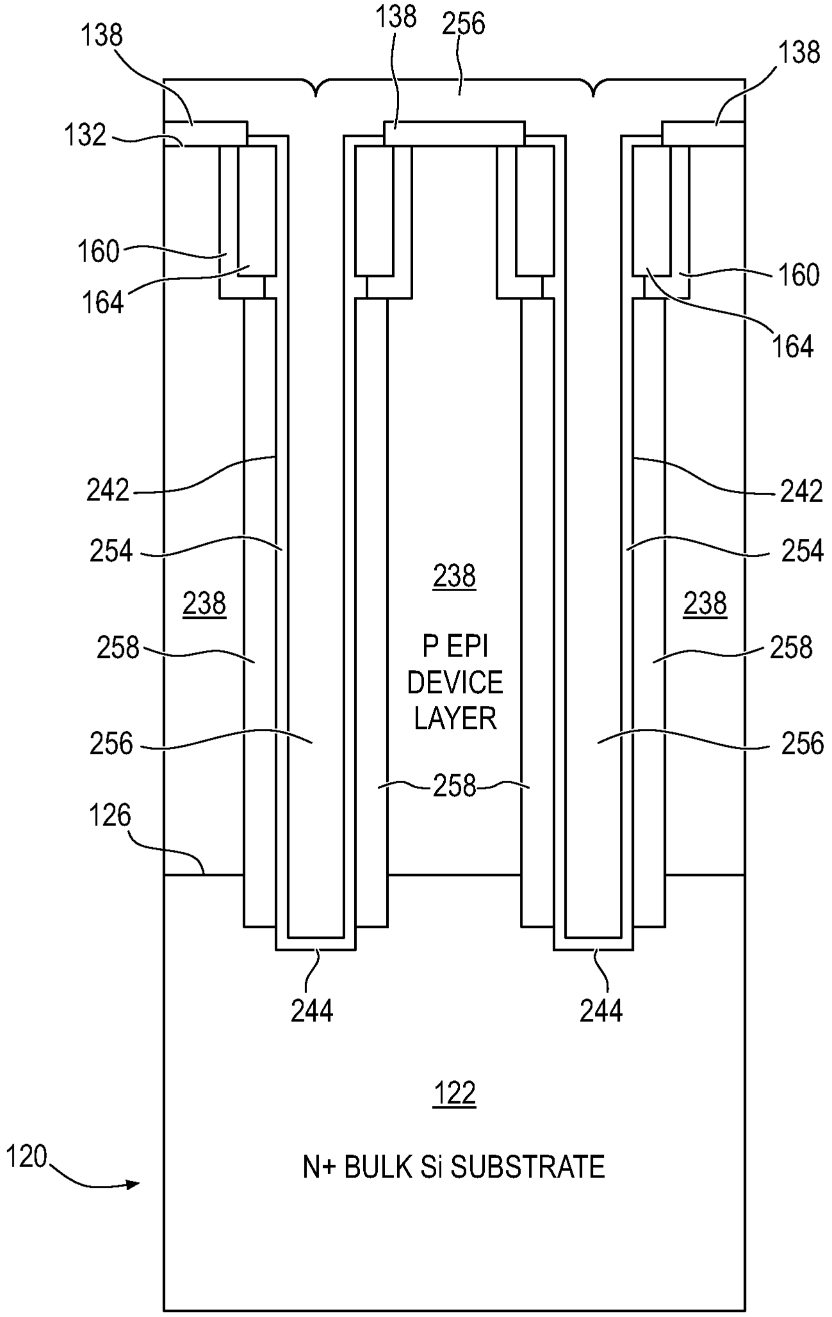
Figure 6J:
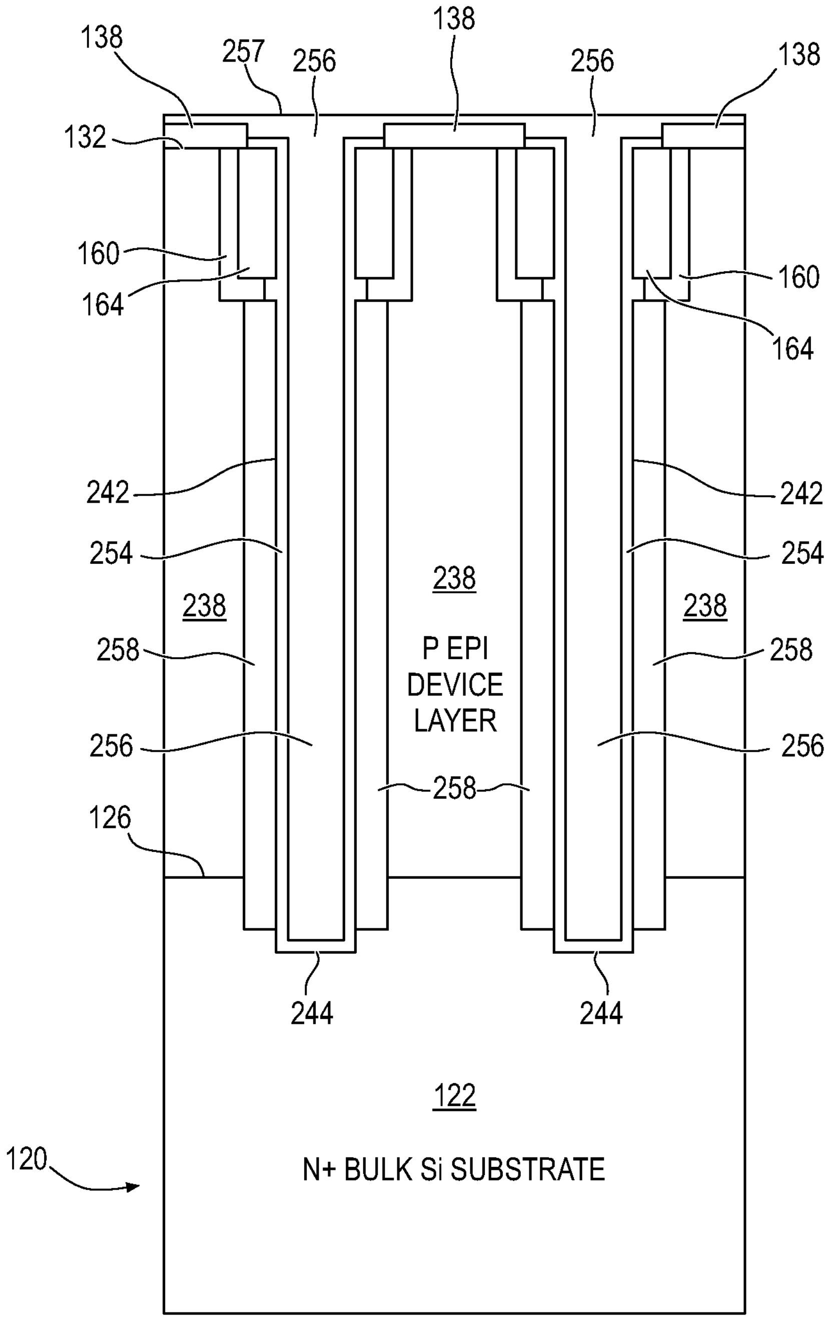
Figure 6K:
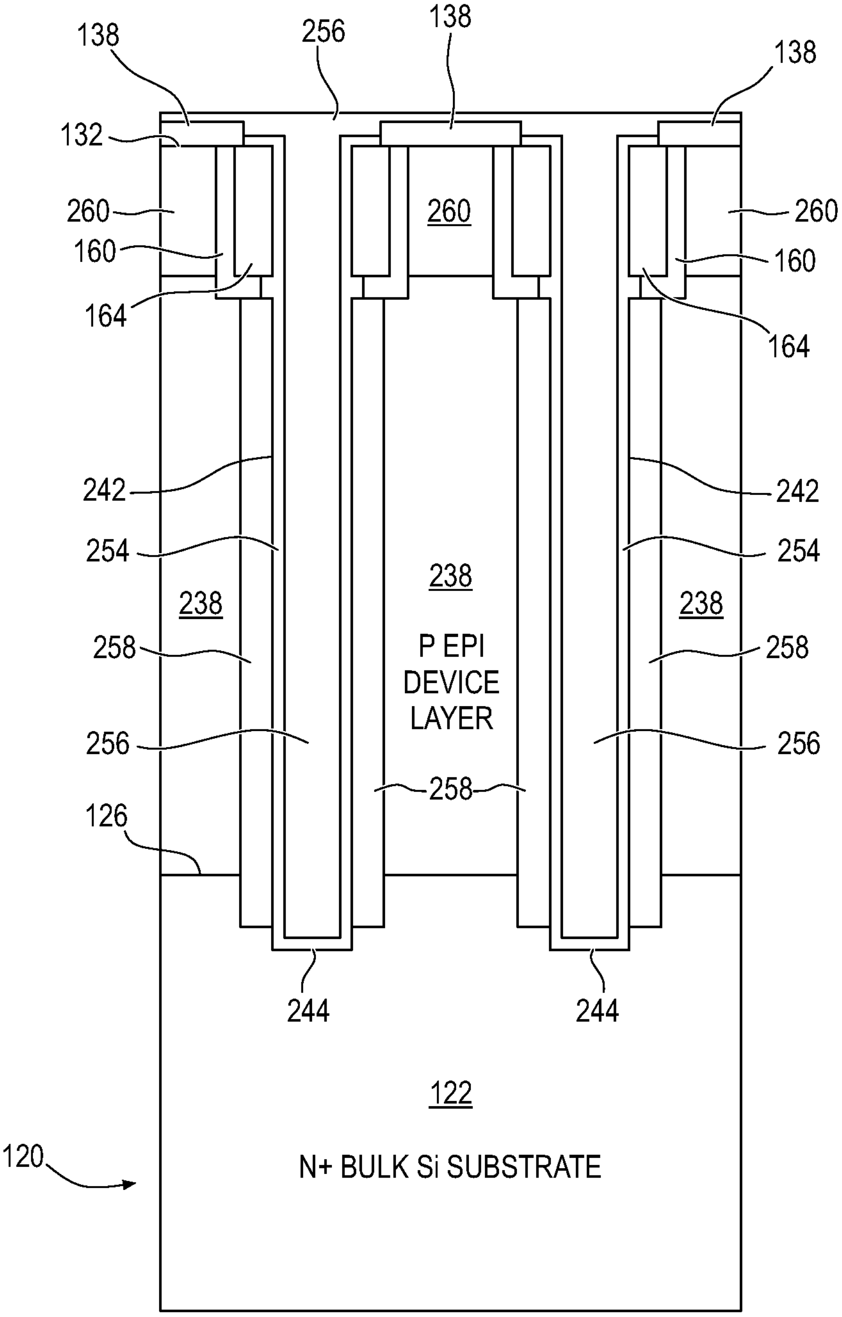
Figure 6L:
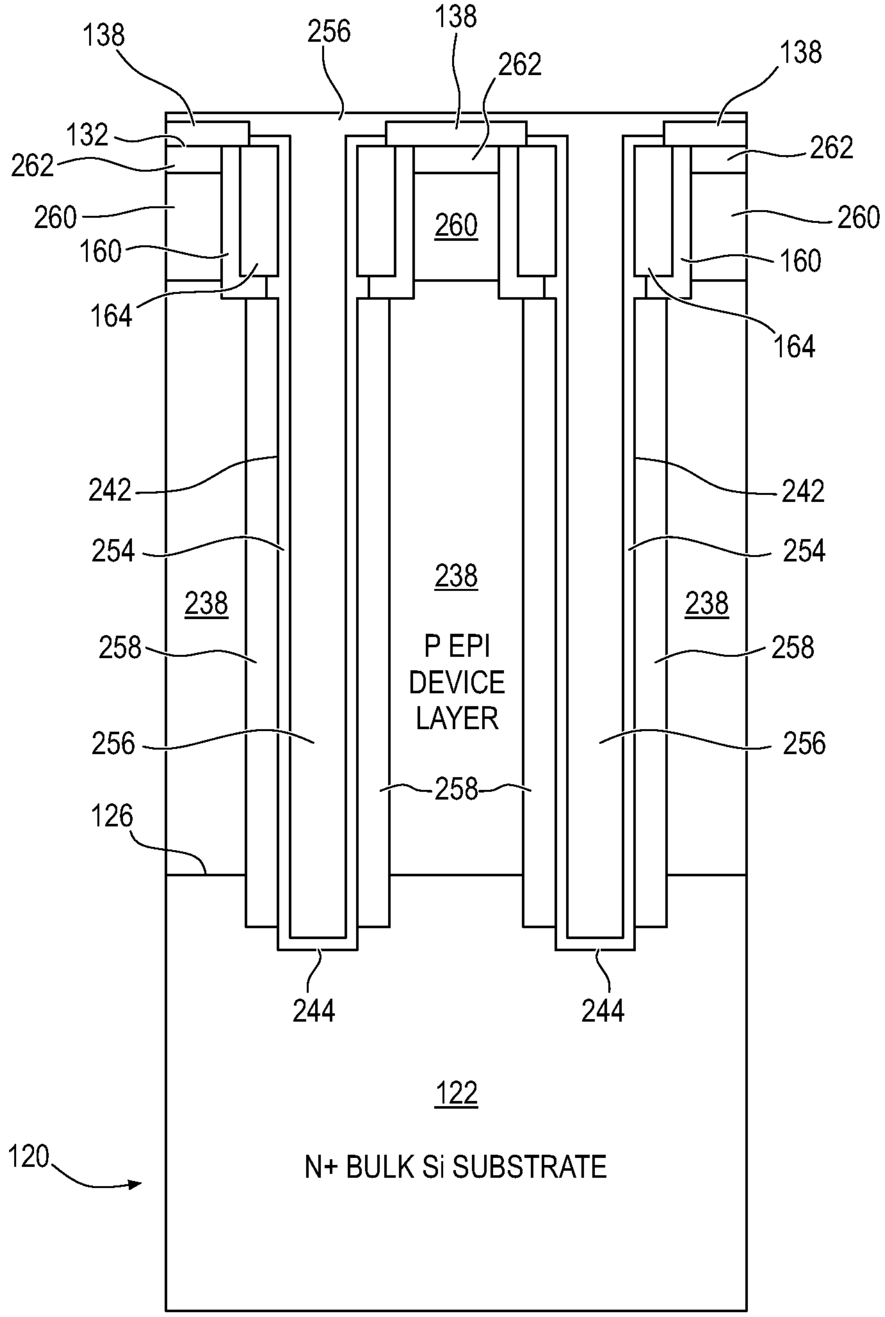
Figure 6M:
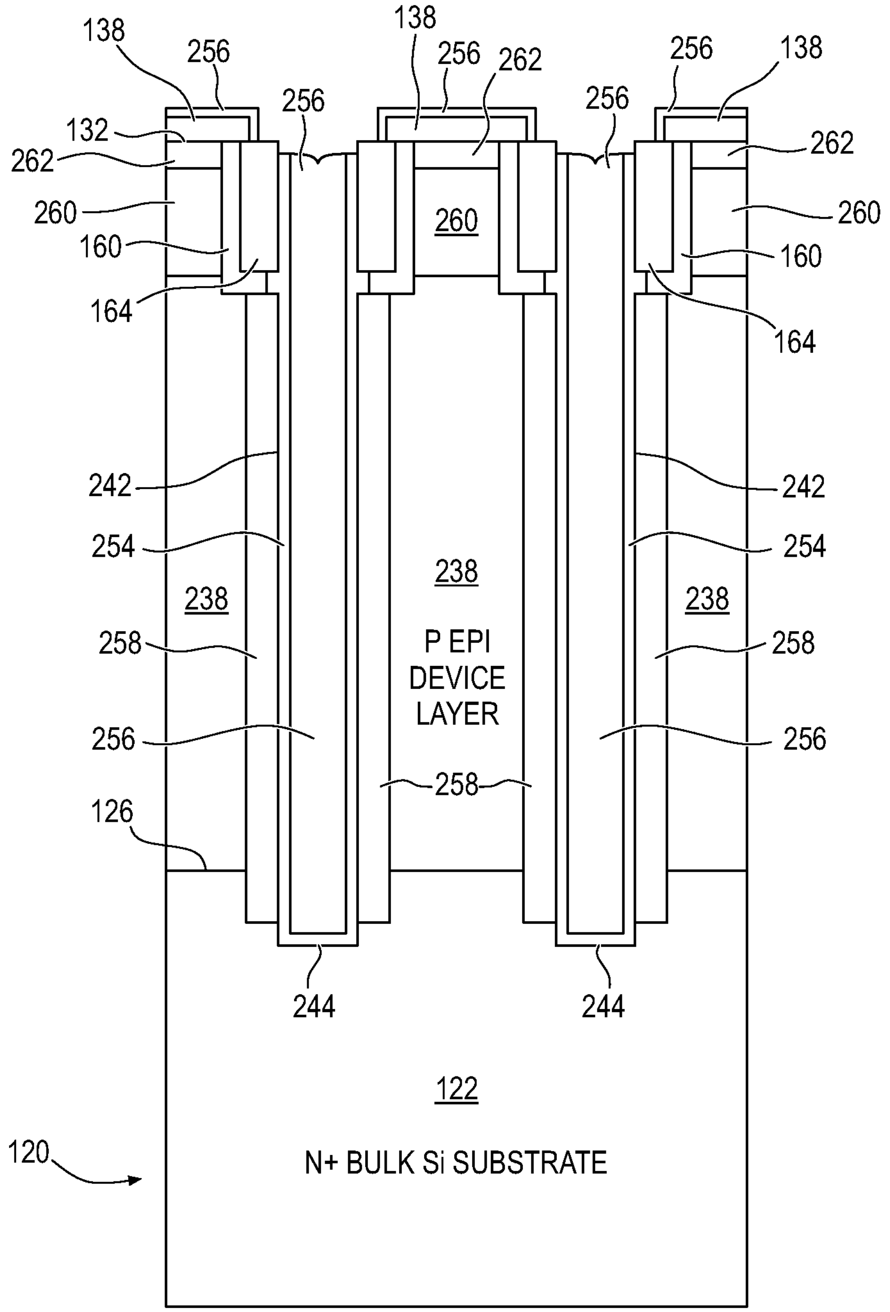
Figure 6N:
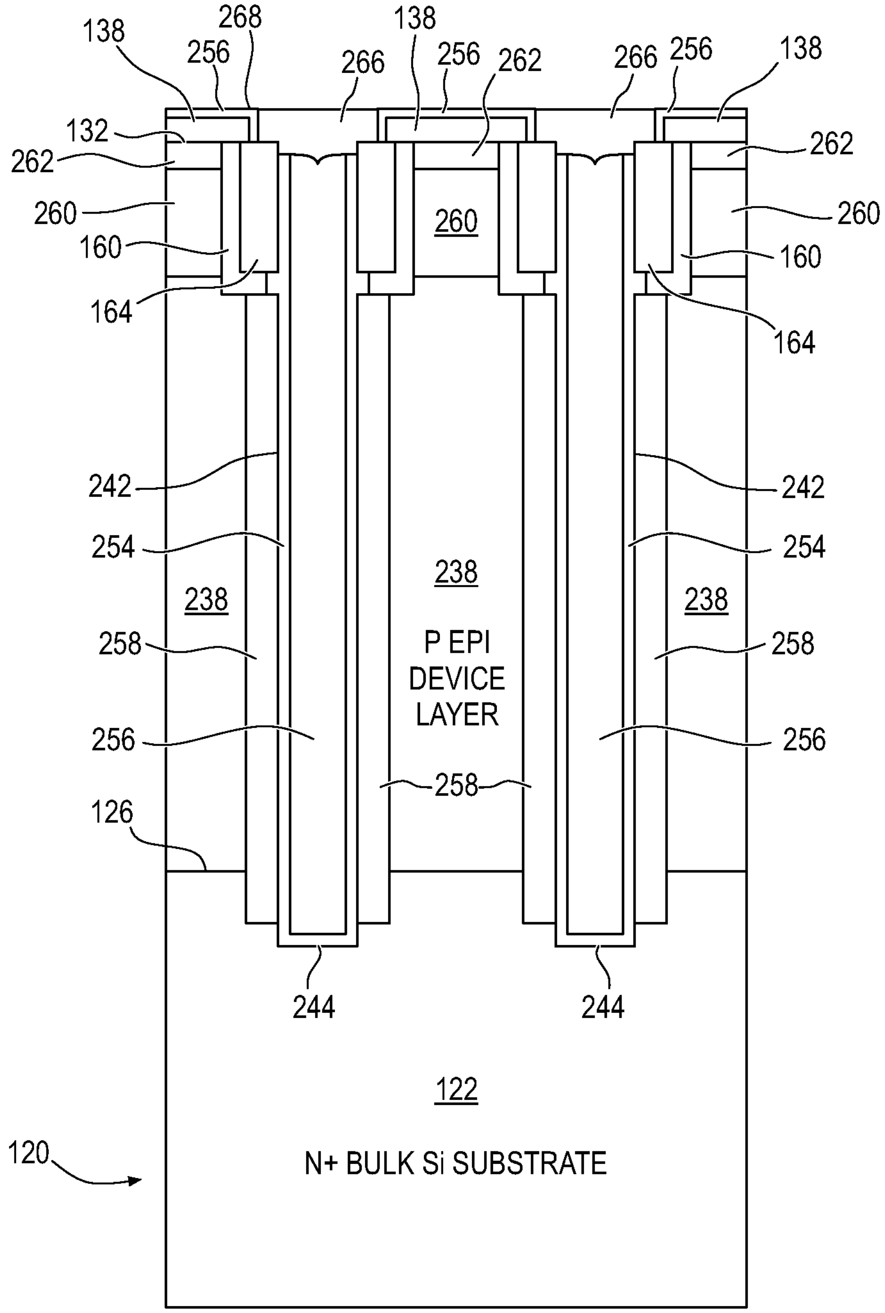
Figure 6O:
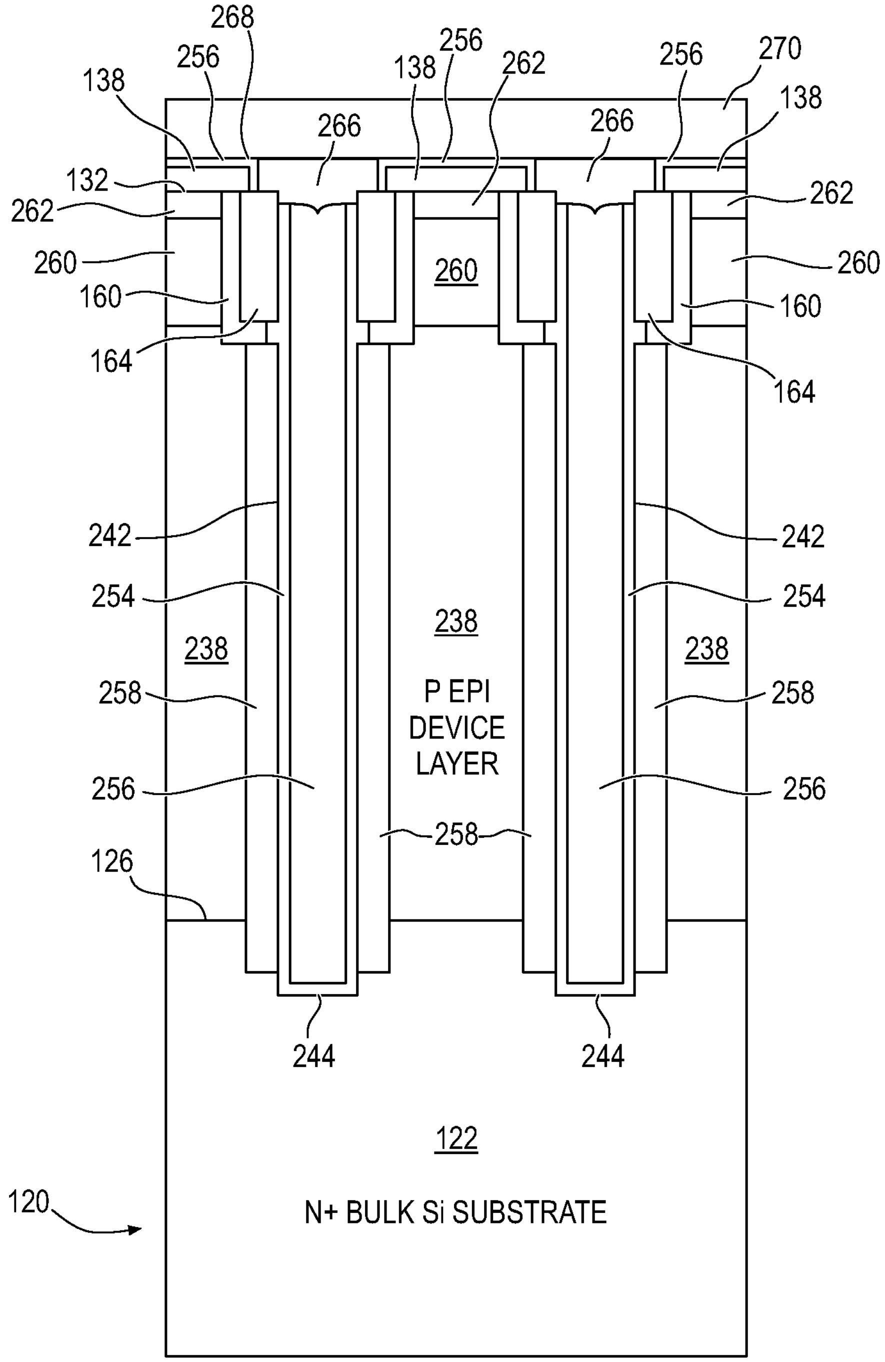
Figure 6P:
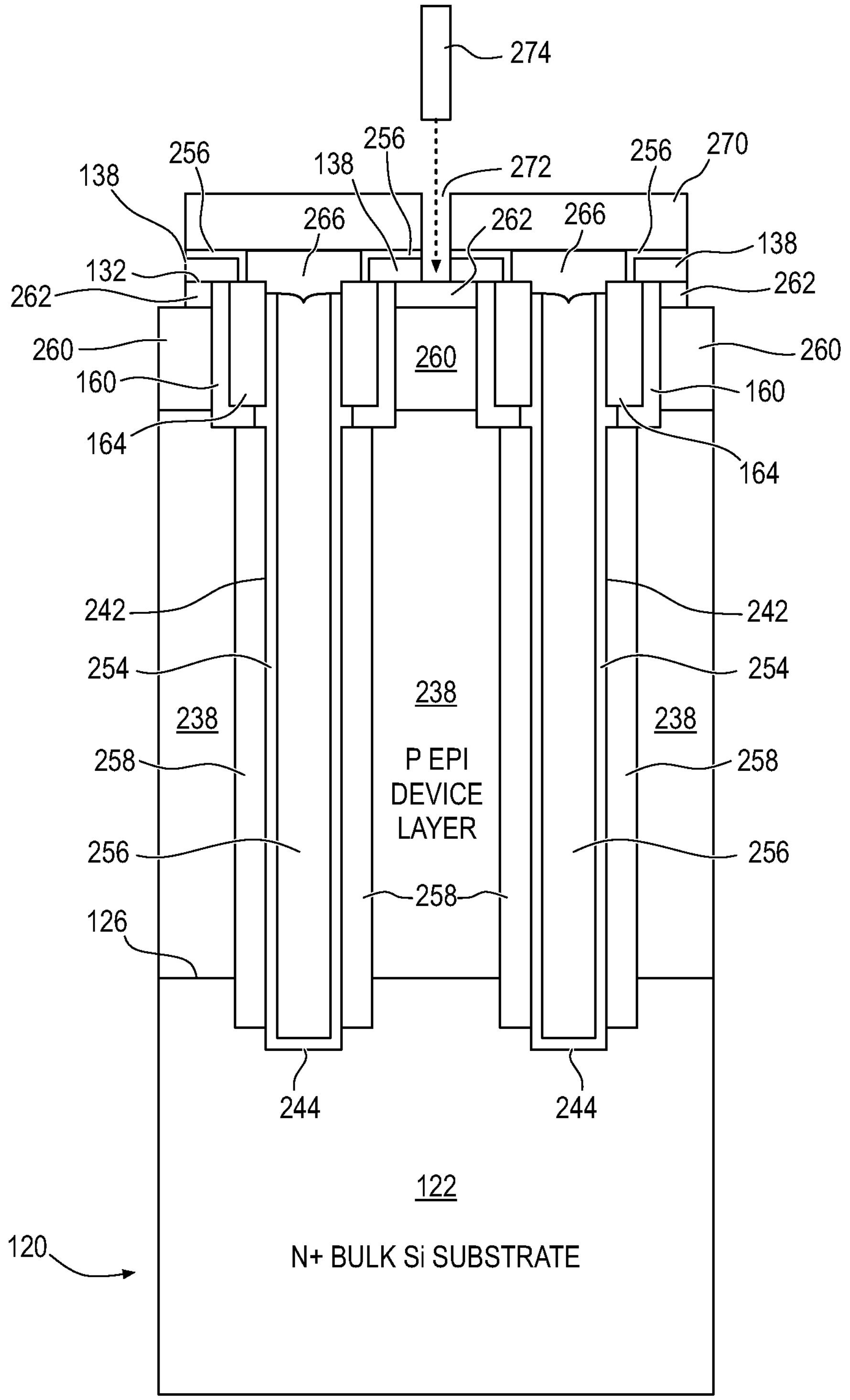
Figure 6Q:
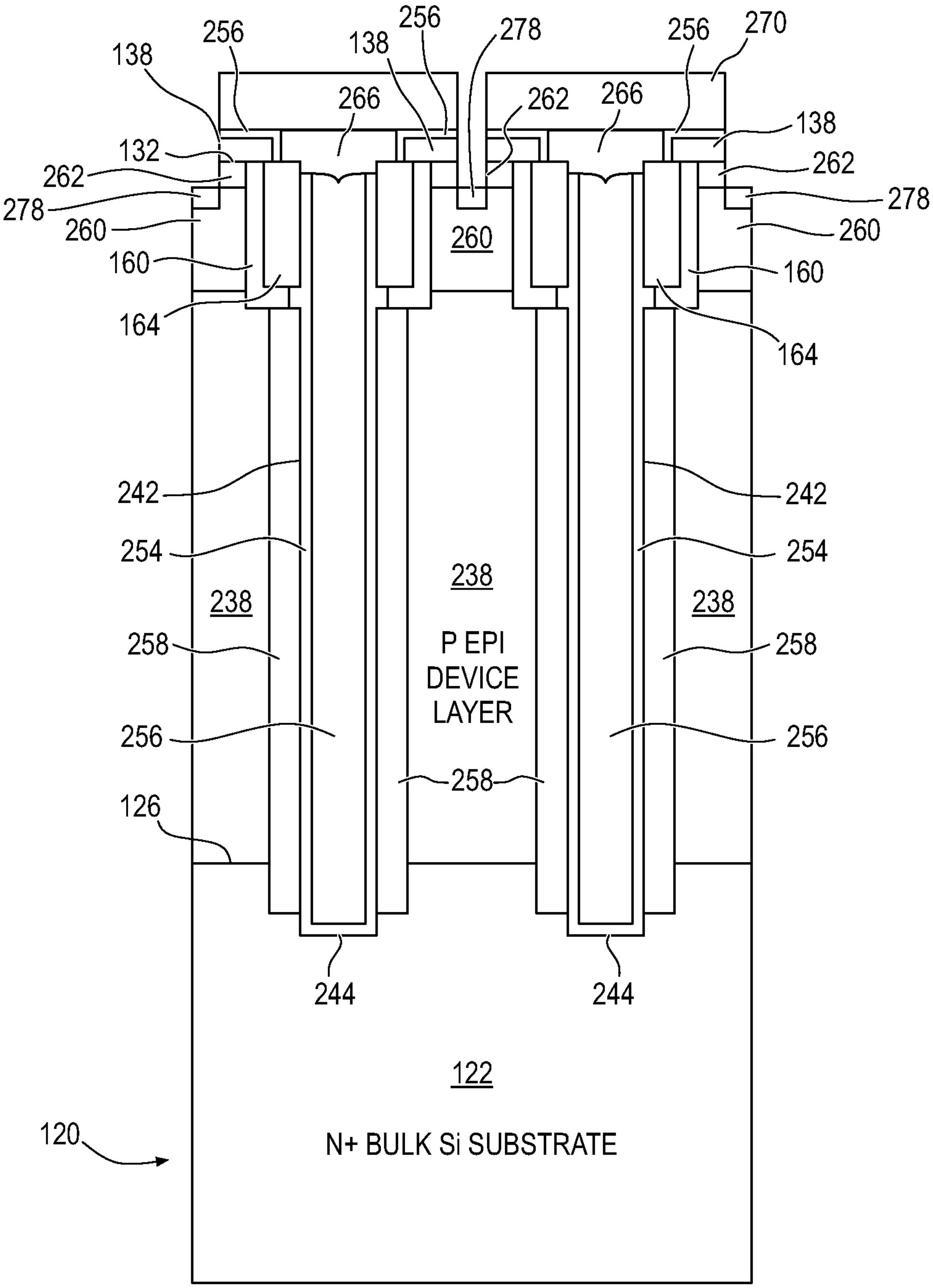
Figure 6R:
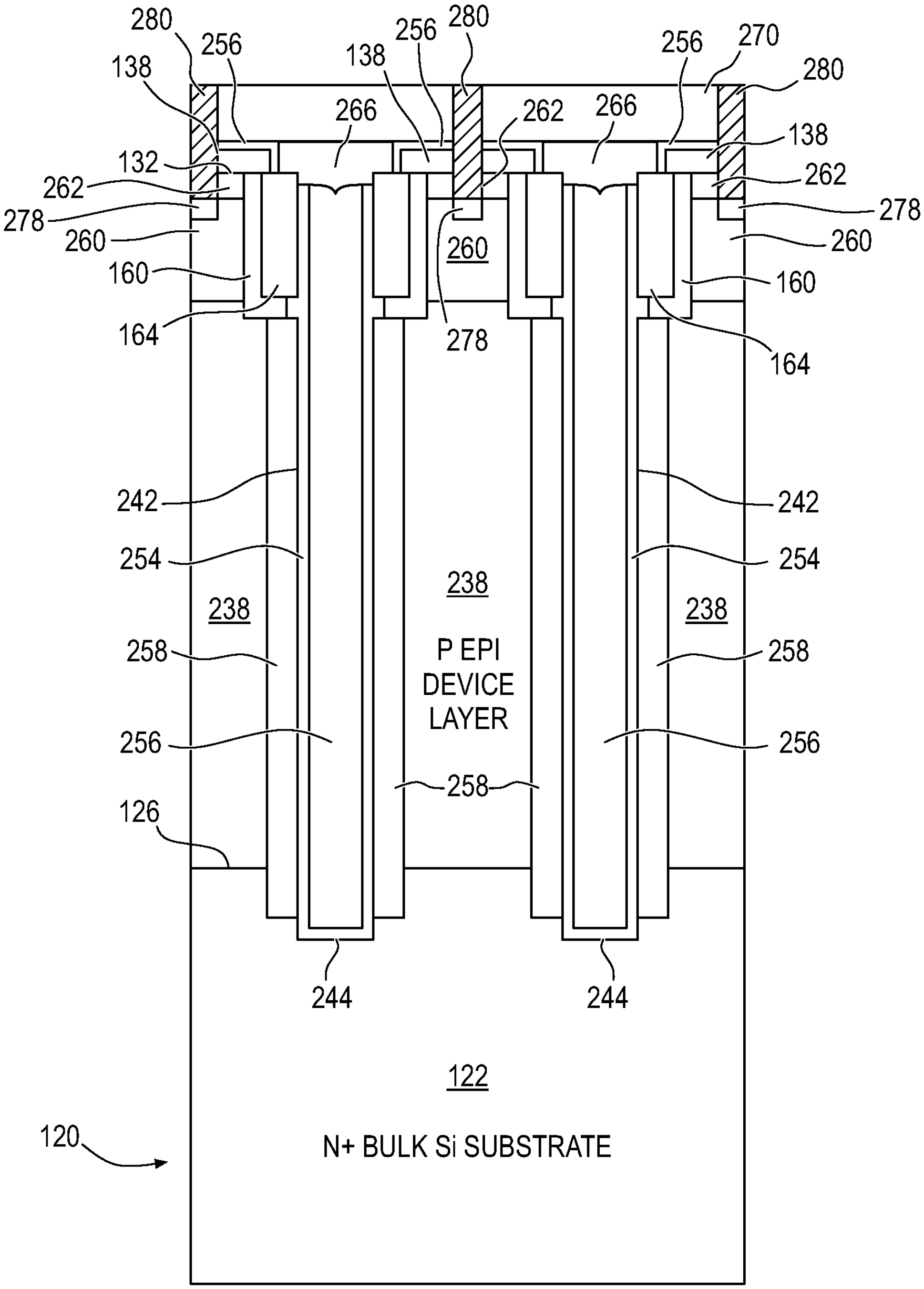
Figure 6S:
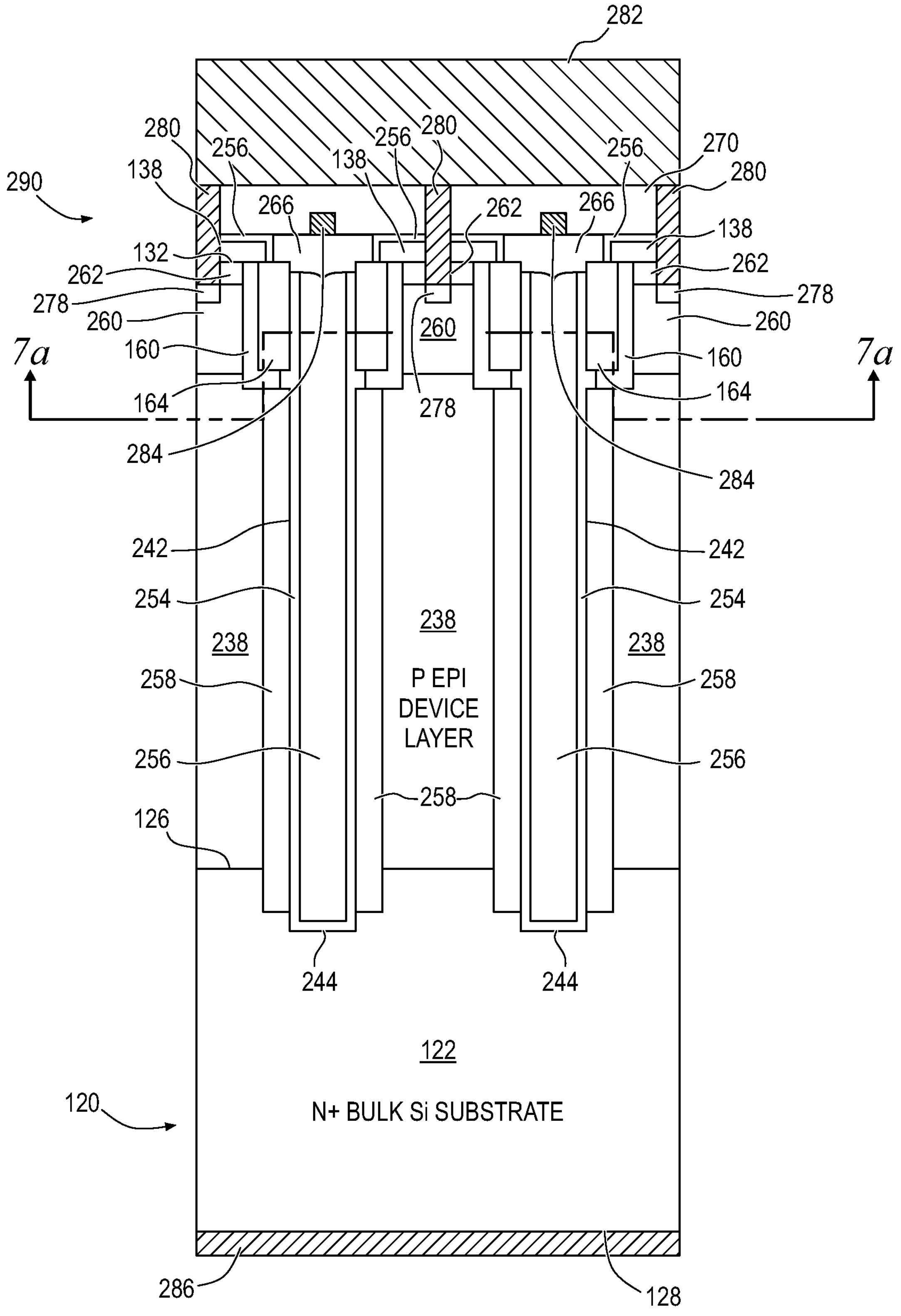

FIGS. 6*a*-6*s* illustrate a process of forming a JEDIFET optimized for low capacitance, in particular output capacitance $C_{OSS}$. Output capacitance $C_{OSS}$ is general defined as capacitance drain-source ($C_{DS}$)+capacitance gate-drain ($C_{GD}$). JEDIFET 290 is also designated as JEDIFET C. JEDIFET C has similarities to JEDIFET R, but at least one difference being polysilicon material (field plate) in the trench of JEDIFET R and insulating material in the trench of JEDIFET C. Also, p epi layer 238 is used for JEDIFET C, where an n epi is used for JEDIFET R. P epi is used for a higher voltage with a long drift region, which is appropriate for JEDIFET R and JEDIFET C. In one embodiment, JEDIFET R uses n epi for lower voltage, such as 30V, and JEDIFET C uses p epi for higher voltage, such as 70V. For 30V JEDIFET C, n epi can be used, and for 70V JEDIFET R, p epi can be used. Using insulating material in the trench, instead of polysilicon material, reduces capacitance.

Continuing from FIG. 4*t*, trenches 240 are formed by DRIE with a width of 0.1-1.0 μm, preferably 0.5 μm, and depth D3 dependent on epi thickness, e.g., 1.5-2.0 μm for 30 V and 3.5-4.0 μm for 70V, to extend past surface 126 into substrate material 122, as shown in FIG. 6*a*. Alternatively, a p epi can be used in lieu of p well 140. For a longer n− drift region, a thick p epi reduces thermal dissipation. The DRIE is a highly anisotropic etch process used to create deep penetration, steep-sided holes, cavities, and trenches in wafers/substrates, typically with high aspect ratios. DRIE utilizes an ionized gas or plasma, such as $SF_6$, to remove material from semiconductor layer 130 and semiconductor material 122. DRIE technology permits deeper trenches 180 with straighter side surfaces. To create deep anisotropic etching of silicon, the etch process switches between different plasma chemistries to provide fluorine-based etching of the silicon while protecting the side surface of the growing feature with a fluorocarbon layer. A $C_4F_8$ plasma deposits a fluoropolymer passivation layer onto the mask and into the etched feature. A bias from the platen causes directional ion bombardment resulting in removal of the fluoropolymer from the base of the feature and the mask. The fluorine free radicals in the $SF_6$ plasma etch the exposed silicon at the base of the etch feature isotropically. The DRIE process repeats multiple times to achieve a vertical etch profile for trenches 180. Alternatively, trenches 240 can be formed by LDA, plasma etching, RIE, sputter etching, vapor phase etching, and chemical etching. A first mask (not shown) is typically formed over surface 132 to isolate trenches 240 during the etching process.

In FIG. 6*b*, side surfaces 242 of trenches 240 are implanted with an impurity, which may occur at predetermined angles Φ1, Φ2. The implantation angles are determined by the width of trenches 180 and the desired doping depth, and is typically from about 2° to 20° from vertical. More generally, tangent of implant angle is given by width/depth, i.e., tan(implant angle)=width/depth. An n-type impurity, such as P, Sb, or As, is implanted between surface 132 and surface 126. The implantation is done at angles Φ1, Φ2 so that bottom surface 244 of each trench 240 is not doped. Since JEDIFET C does not have field plate, the n− drift region concentration is about one half that of n− drift region 198 in JEDIFET R.

In FIG. 6*c*, the remaining portion of insulating layer 144 is removed by an etching process or LDA. The side surfaces 242 of each trench 240 can be smoothed using an isotropic plasma etch and may be used to remove a thin layer of silicon, e.g., 100-1000 A from the trench side surfaces. Alternatively, insulating layer 250 is formed into trench 240, as shown in FIG. 6*d*. In one embodiment, insulating layer 250 is a sacrificial oxide layer or silicon dioxide layer. The sacrificial thermal oxide 250 is then removed using an etch, such as a buffered oxide etch, or a diluted HF acid etch, or other wet chemistry followed by HF vapor phase fuming, to smooth the inner wall, as shown in FIG. 6*e*. Another sacrificial thermal oxide layer 250 is again grown on side surfaces 242 of trenches 240, similar to FIG. 6*d*. The sacrificial thermal oxide layer 250 is again removed by wet chemistry followed by HF vapor phase fuming to smooth the inner wall, similar to FIG. 6*e*. The process of repetitive growth of thermal oxide and removal continues multiple times, in accordance with FIGS. 6*d*-6*e*, until side surface 242 of trench 240 is smooth. By eliminating the scalloping from the DRIE etch and using sacrificial thermal oxide layer 240 followed by HF fuming or any oxide and silicon etches, side surface 242 can be smoothed to a tapered form. The use of the smoothing techniques can produce smooth trench surfaces with rounded corners while removing residual stress and unwanted contaminates. The remaining portion of insulating layer 170 is also removed by the etching process or LDA.

In FIG. 6*f*, side surfaces 242 of trenches 240 are implanted with an impurity, which may occur at predetermined angles Φ1, Φ2. The implantation angles are determined by the width of trenches 180 and the desired doping depth, and is typically from about 2° to 20° from vertical. More generally, tangent of implant angle is given by width/depth, i.e., tan(implant angle)=width/depth. A p-type impurity, such as B, Al, or Ga, is implanted into surface 132 and between surface 132 and surface 126 by way of trench 240. The implantation is done at angles Φ1, Φ2 so that bottom surface 244 of each trench 240 is not doped. In addition, the same impurity is implanted in surface 132 under insulating layer 138. The implant is performed at an energy level of about 30-200 KeV with a dose between 1e16 and 1e17 atoms/$cm^3$ to cancel high concentration of n− drift region along the interface of silicon and oxide. The p-type implant aids with a low $C_{OSS}$ transition voltage.

In FIG. 6*g*, insulating layer 254 is formed over polysilicon material 164 and into trench 240. In one embodiment, insulating layer 254 is a gate oxide layer. Insulating layer 254 conformally covers surface 132 of semiconductor layer 130, side surfaces 242, and bottom surface 244 of trench 240. In FIG. 6*h*, insulating layer 256 is formed over surface 132 of semiconductor layer 130, insulating layer 254, and into trench 240. In one embodiment, insulating layer 256 is an oxide layer. Insulating layer 256 fills trench 240.

In FIG. 6*i*, the n-type impurities implanted in FIG. 6*b* are driven-in, at a temperature of 850-900° C. for 30-60 minutes, to form n− drift region or column 258 having a width of 0.15 μm. The formation of n− column 258 leaves p region or column 140 from the p well. The doping preferably occurs with the aid of a mask (not shown) placed over surface 132 of semiconductor layer 130.

In FIG. 6*j*, surface 257 of insulating layer 256 is planarized with a grinder, similar to FIG. 4*ak*. Alternatively, surface 257 of insulating layer 256 is planarized by CMP or LDA.

In FIG. 6*k*, surface 132 of semiconductor layer 130 is implanted with a p-type impurity, such as B, Al, or Ga. The implant is performed at an energy level of about 30-200 kilo-electron-volts (KeV) with a dose between 1e16 and 1e18 atoms/$cm^3$, preferably 4e17 atoms/$cm^3$. The p-type impurities are driven-in, at a temperature of 900° C. for 10-30 minutes, to form p body 260.

In FIG. 6*l*, surface 132 of semiconductor layer 130 is implanted with an n-type impurity, such as P, Sb, or As. The implant is performed at an energy level of about 30-200 kilo-electron-volts (KeV) with a dose of 1e20 atoms/$cm^3$. The n-type impurities are driven-in, at a temperature of 900° C. for 60 minutes, to form n+ source region 262.

In FIG. 6*m*, a portion of insulating layer 256 is removed by an etching process or LDA to expose a top surface of polysilicon material 164. In FIG. 6*n*, polysilicon material 266 is formed over polysilicon layer 164 and insulating layer 256 in trench 240. Polysilicon material 266 can be formed by PVD, CVD, screen printing, spin coating, spray coating, or other suitable deposition process. A portion of polysilicon material 266 can be removed by CMP to planarize the polysilicon material to a level even with surface 268 of insulating layer 256. Alternatively, a portion of polysilicon material 266 can be removed by etching or LDA to planarize the polysilicon material to a level even with surface 268 of insulating layer 256. An optional silicide can be formed over polysilicon material 266 to reduce gate resistance. In FIG. 6*o*, insulating layer 270 is formed over insulating layer 256 and polysilicon material 266. In one embodiment, insulating layer 270 is an oxide layer and operates as an ILD.

In FIG. 6*p*, a portion of insulating layer 270, insulating layer 256, and insulating layer 138 is removed by an etching process to form vias 272 through the insulating layers to n+ source region 262 and p body 260. Alternatively, a portion of insulating layer 270, insulating layer 256, and insulating layer 138 is removed by LDA using laser 274 to form vias 272 through the insulating layers to n+ source region 262 and p body 260.

In FIG. 6*q*, p body 260 is implanted with a p-type impurity, such as B, Al, or Ga, through via 220. The implant is performed at an energy level of about 30-200 kilo-electron-volts (KeV) with a dose between 1e19 and 1e20 atoms/$cm^3$. The p-type impurities are driven-in, at a temperature of 850° C. for 10 minutes, to form p+ contact 278.

In FIG. 6*r*, conductive material 280 is formed into vias 272 to n+ source region 262 and p+ contact 278 in p body 260. Conductive layer 280 is formed using PVD, CVD, electrolytic plating, electroless plating process, or other suitable metal deposition process. Conductive layer 280 can be one or more layers of aluminum (Al), copper (Cu), tin (Sn), nickel (Ni), gold (Au), silver (Ag), tungsten (W), or other suitable electrically conductive material. Conductive layer 280 and insulating layer 270 are planarized by CMP. Conductive layer 280 operates as a barrier metal.

In FIG. 6*s*, conductive layer 282 is formed over insulating layer 270 and conductive layer 280. Conductive layer 284 is formed over insulating layer 256. Conductive layer 286 is formed over surface 128 of substrate 120. Conductive layers 282-286 are formed using PVD, CVD, electrolytic plating, electroless plating process, or other suitable metal deposition process. Conductive layers 282-286 can be one or more layers of Al, Cu, Sn, Ni, Au, Ag, W, or other suitable electrically conductive material. Conductive layer 282 provides the source contact, conductive layer 284 is the gate contact, and conductive layer 286 is the backside drain contact. A passivation layer (not shown) is typically formed over conductive layer 282.

JEDIFET 290 is a multi-cell vertical power MOSFET, similar to FIG. 5*a*, having applications in DC-DC power converters, aerospace, and general purpose portable electrical devices, where the application requires minimum output capacitance $C_{OSS}$. JEDIFET 290 is designated as JEDIFET C. A user would typically select JEDIFET R to optimize $R_{DSON}$ and JEDIFET C to optimize $C_{OSS}$.

Figure 7A:
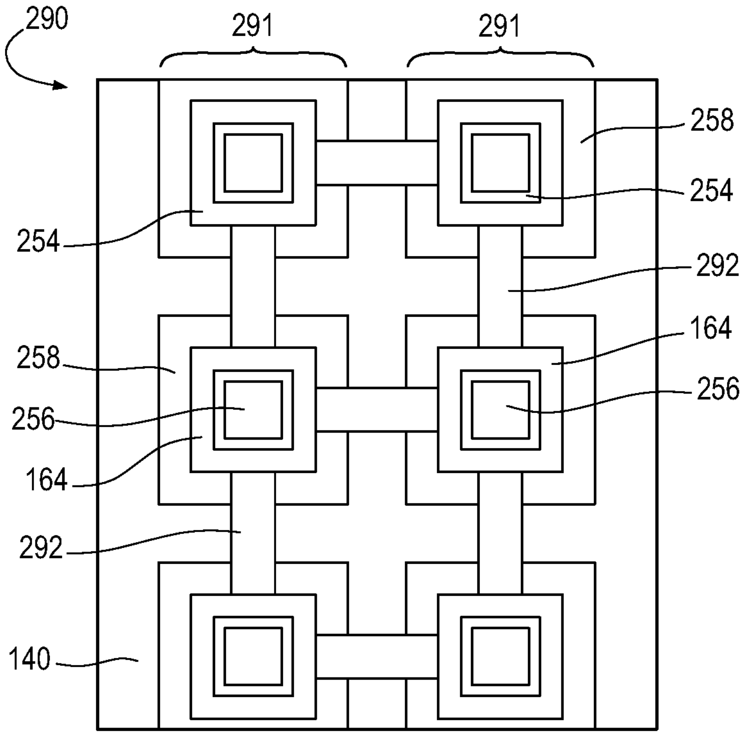
FIGS. 7*a*-7*b* illustrate a top view of the multi-cell power MOSFET from FIGS. 6*a*-6*s;*

FIG. 7*a* is a top view of a portion of JEDIFET 290 showing six cells 291. In one embodiment, there is 1.0 μm between cell centers. JEDIFET 290 includes p column 140, n− column 258, gate region 164, insulating layer 254, and insulating layer 258. Polysilicon bridge 292 connects gate regions 164.

Figure 7B:
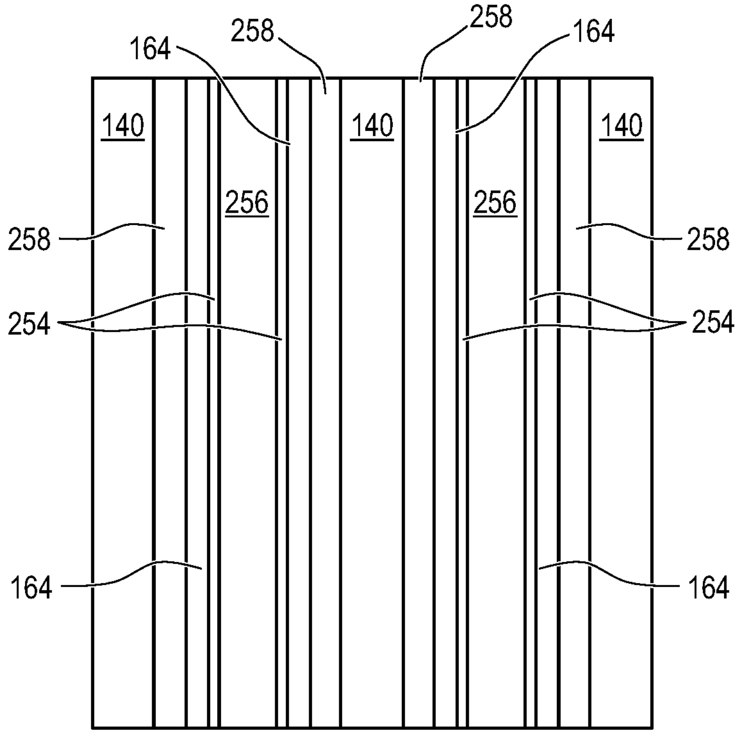

In another embodiment, FIG. 7*b* is a top view of a striped design for the JEDIFET including p column 140, n− column 258, gate regions 164, insulating layer 254, and insulating material 256.

Figure 8:
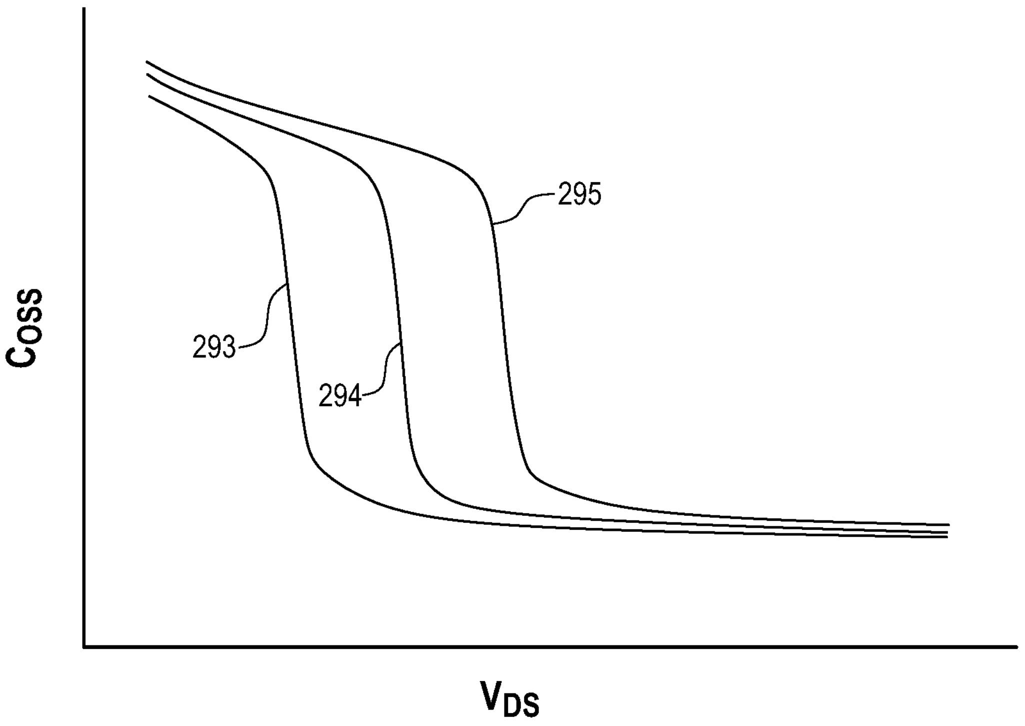
FIG. 8 is a graph of output capacitance $C_{OSS}$ versus drain-source voltage.
Figure 9:
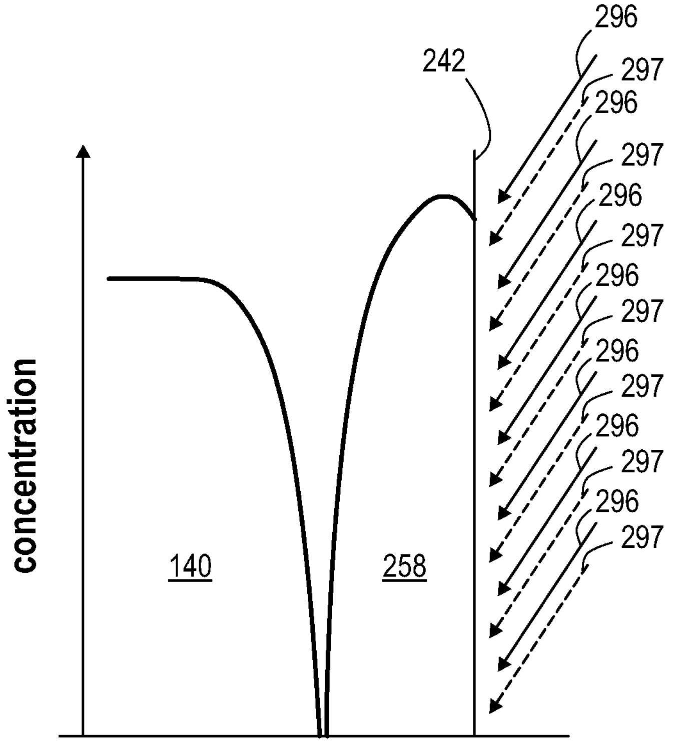
FIG. 9 is a graph of doping concentration for n-drift region and p well.
Figure 10:
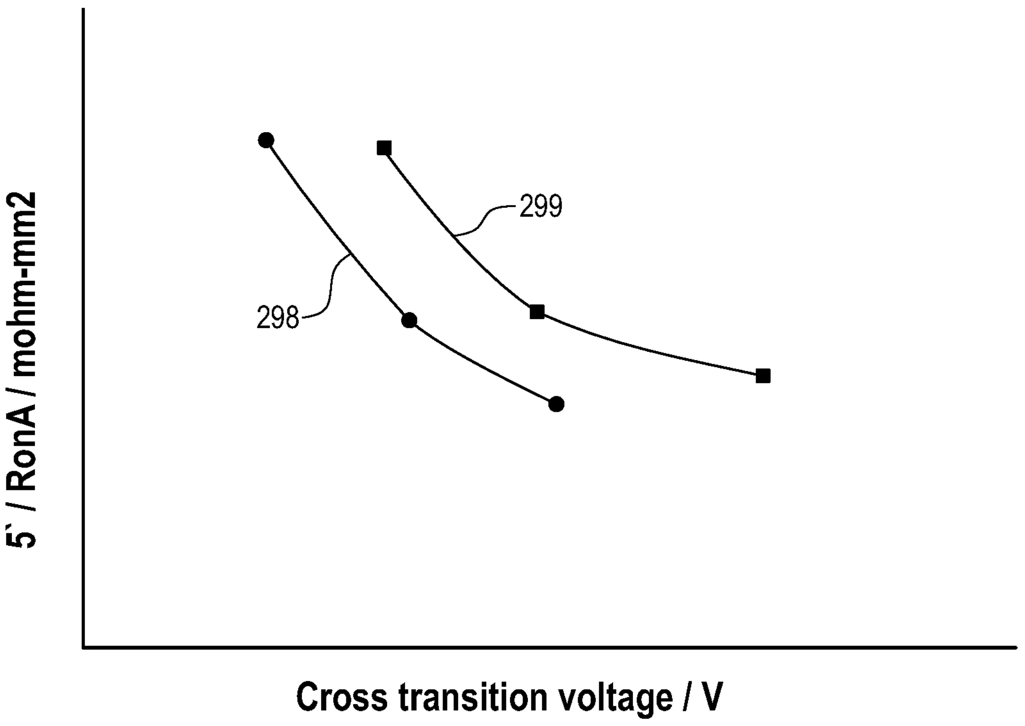
FIG. 10 is a graph of RONA versus output capacitance $C_{OSS}$.

JEDIFET 290 is a vertical transistor with super-junction features (n− column 258 and p column 140) to optimize for minimum output capacitance $C_{OSS}$. JEDIFET 290 has no field plate as in JEDIFET 230, so $C_{OSS}$ can be reduced by increasing drain-source voltage ($V_{DS}$) to fully deplete n− column 258 and p column 140. The $C_{OSS}$ transition voltage is a function of n− column 258 concentration and p column 140 concentration. The $C_{OSS}$ transition voltage is shown for various values of $V_{DS}$ and RONA in FIG. 8. Curve 293 has RONA of 31.7 mohm-mm2, curve 294 has RONA of 20.7 mohm-mm2, and curve 295 has RONA of 16.1 mohm-mm2. Decreasing n− column 258 concentration and p column 140 concentration causes $C_{OSS}$ transition voltage to decrease but at the cost of RONA increases because n− column 258 becomes high resistivity as curves 293-295 show. Because n− column 258 concentration is formed by implant and diffusion, this concentration is high along side surface 242. The highly doped n− column 258 concentration is not fully depleted at low $V_{DS}$. Therefore, $C_{OSS}$ transition voltage cannot be reduced by n− column 258 diffusion alone. Accordingly, $C_{OSS}$ transition voltage and RONA have a trade-off relationship. FIG. 9 shows a first impurity 296, as described in FIG. 6*b*. To reduce $C_{OSS}$ transition voltage without increasing RONA, an additional counter implant 297 of p-type impurities, such as B, Al, or Ga, modulates n− column 258 doping profile. By doping modulation with counter implant 297, n− column 258 concentration is high. As shown in FIG. 10, doping modulation curve 298 achieves lower RONA when $C_{OSS}$ transition voltage is same in comparing with a single n− column 258 implant, as shown in curve 299.

JEDIFET 230 and JEDIFET 290 can be made voltage scalable. JEDIFET 230 is voltage scalable by increasing the length of n− drift region 198 and the thickness of insulating layer 196. Insulating layer 196 must have sufficient thickness to withstand $V_{DS}$. JEDIFET 290 is voltage scalable by increasing n-drift region 198 length alone. For a higher BVDSS, in the range of 100-300 volts, another JEDIFET combines features previously described in FIGS. 4 and 6. FIGS. 11*a*-11*e* incorporate details from JEDIFET R (FIG. 4) and JEDIFET C (FIG. 6) and show the principal differences to achieve the combined JEDIFET R+C.

Figure 11A:
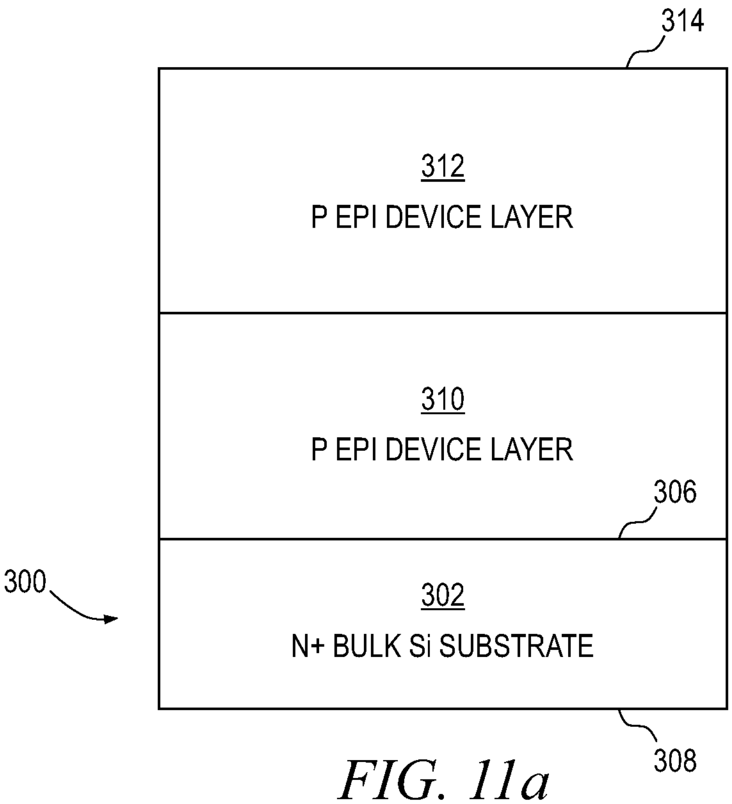
FIGS. 11*a*-11*e* illustrate a process of forming a multi-cell power MOSFET enhanced for low $R_{DSON}$ and low $C_{OSS}$.

FIG. 11*a* illustrates substrate 300 containing a base semiconductor material 302, such as Si, SiC, 3C-SiC, germanium, aluminum phosphide, aluminum arsenide, gallium arsenide, gallium nitride, indium phosphide, diamond, and all families of III-V and II-VI semiconductor materials for structural support. In one embodiment, substrate 300 contains N+ bulk Si with a thickness of about 350 μm. Substrate 300 includes a first surface 306 and second surface 308 opposite the first surface 126.

Semiconductor layer 310 is epitaxially grown over surface 306 of substrate 300, similar to FIG. 4*b*. Semiconductor layer 312 with surface 314 is epitaxially grown over semiconductor layer 310, similar to FIG. 4*b*. Alternatively, semiconductor layer 310 is DWB to surface 306 of substrate 300, and semiconductor layer 312 is DWB to semiconductor layer 310, similar to FIG. 4*c*-4*d*. Semiconductor layer 310 is doped with p-type impurities, e.g., B, Al, or Ga, similar to p epi 238, to form p epi device layer 310. Semiconductor layer 312 is doped with p-type impurities, e.g., B, Al, or Ga, similar to p-epi 140, to form p epi device layer 312. The different doping concentrations arise from p epi device layer 310 being used for a JEDIFET R type device, and p epi device layer 312 being used for a JEDIFET C type device. JEDIFET 360 will be formed in p epi device layers 310 and 312.

Figure 11B:
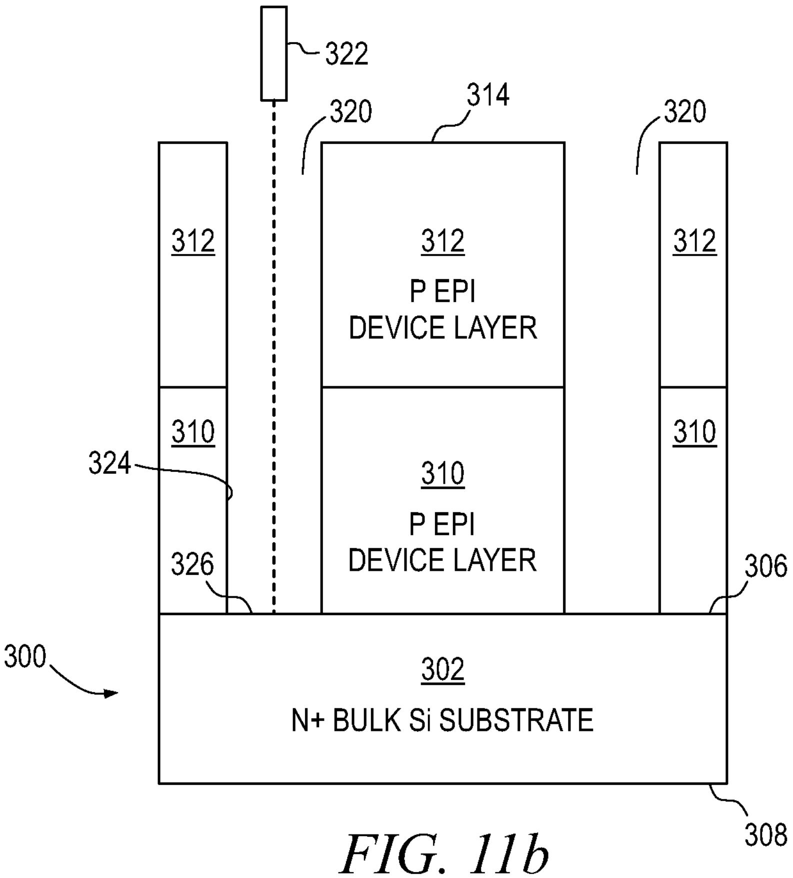
Figure 11C:
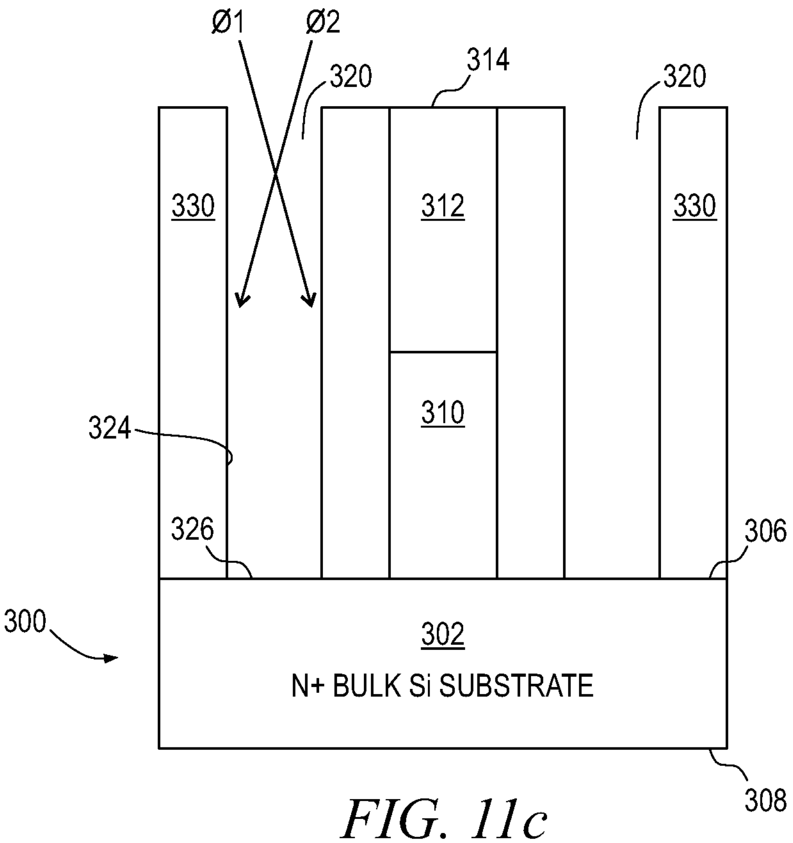

In FIG. 11*b*, trenches 320 are formed by DRIE or LDA using laser 322, similar to FIG. 4*u*. Trench 320 has side surface 324 and bottom surface 326. In FIG. 11*c*, side surfaces 324 of trenches 320 are implanted with an impurity, which may occur at predetermined angles Φ1, Φ2, similar to FIG. 4*v*. Since the JEDIFET C type device (in p epi layer 312) does not have field plate, the n− drift region concentration is about one half that of n− drift region 198 in JEDIFET R. Note that the implant is performed along the entire sidewall 324.

Figure 11D:
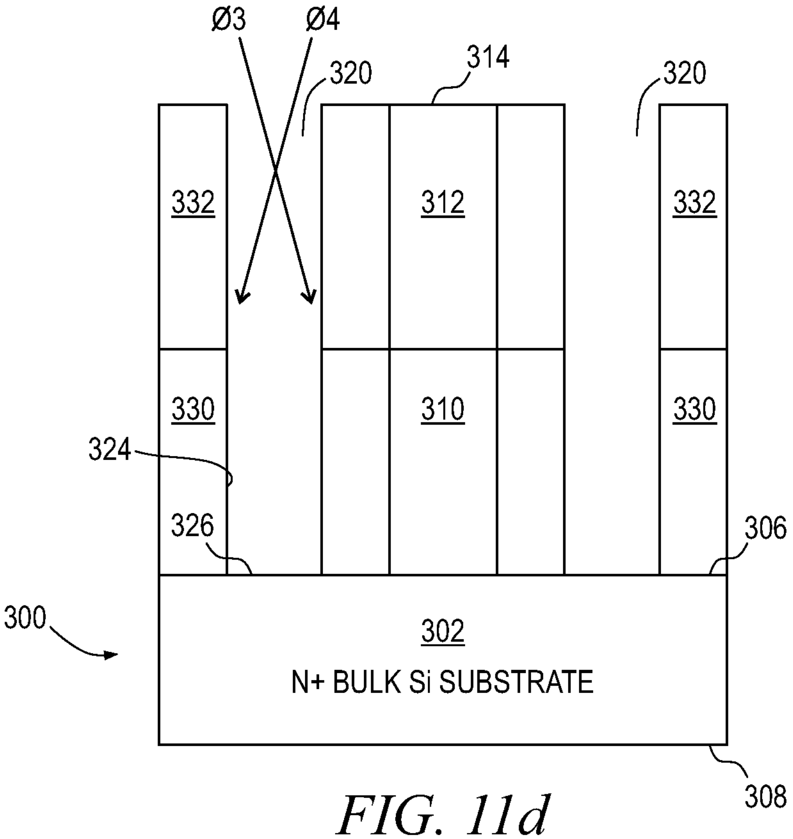

In FIG. 11*d*, an upper portion of side surfaces 324 of trenches 320 is implanted with an impurity, which may occur at predetermined angles Φ3, Φ4, where Φ3, Φ4>Φ1, Φ2. The second implant is performed at an energy level of about 30-200 KeV with a dose between 1e16 and 1e18 atoms/cm$^3$. The n-type impurities are driven-in, either at the end of each implant or after the second implant, at a temperature of 850-900° C. for 30-60 minutes, to form n− drift region or column 330 and n− drift region or column 332. Note that doping concentration for column 332 is formed by two implantations (Φ1, Φ2 and Φ3, Φ4) while doping concentration for column 330 is formed by one implantation (Φ1, Φ2).

Figure 11E:
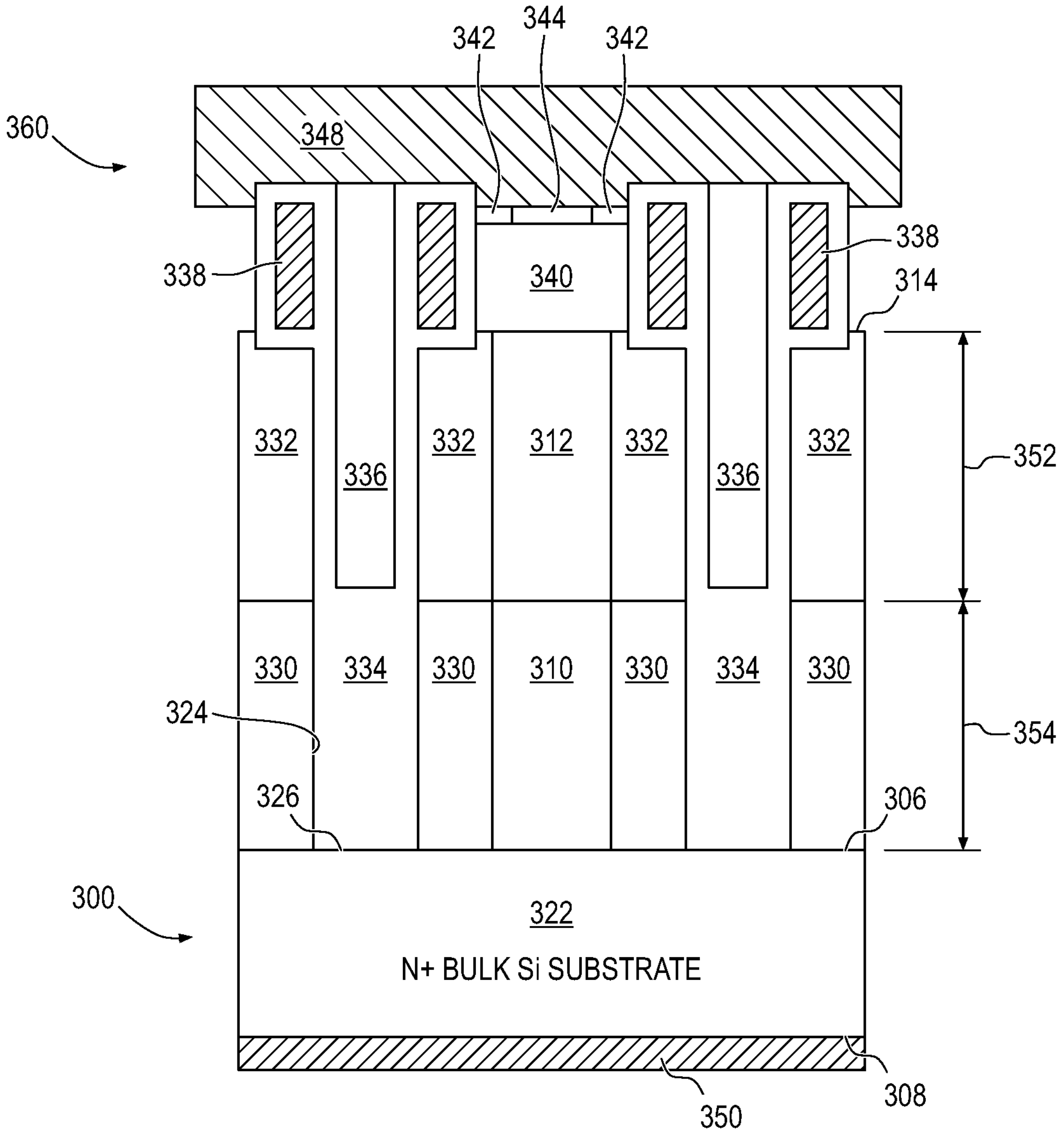

FIG. 11*e* shows JEDIFET 360 with insulating material 334, field plate 336, gate region 338, p body 340, source regions 342, p+ contact 344, source metal 348, and backside drain metal 350. JEDIFET 360 is also designated as JEDIFET R+C. Again, the complete process has been shown in FIGS. 4 and 6. The relevant features in FIGS. 11*a*-11*e* are that the n− drift region has been divided between n− drift region or column 330 and n− drift region or column 332. The n− drift region or column 330 has a first doping concentration in region 354 and n− drift region or column 332 has a second doping concentration in region 352 greater than the first doping concentration. In addition, field plate 336 extends through region 352 but not into region 352. Accordingly, region 352 is optimized for $R_{DSON}$ and region 354 is optimized for $C_{OSS}$. JEDIFET R+C has combined features for low $R_{DSON}$ and low $C_{OSS}$ and high BVDSS. Region 354, with JEDIFET C features, supports higher voltage by nature of the super-junction structure of n− drift region or column 330. Region 352, with JEDIFET R features, supports low $R_{DSON}$ by nature of field plate 336 and high doping concentration in n− drift region or column 332 and further supports higher BVDSS by nature of the super-junction structure of n− drift region or column 332 and insulating layer like 196. JEDIFET R+C will require a thicker insulating layer like 196 around field plate 336 to support higher BVDSS.

P epi layer 238 has a similar concentration as p-well 140. For lower voltage, thinner N-epi thickness is sufficient for p-well diffusion because p-well does not need to be deep for thinner n epi. For higher voltage, thicker epi is required and at the same time p-well needs to be deep by longer diffusion time. Longer diffusion time causes up-diffusion from N+ bulk Silicon material 122 and consequently the epi becomes substantially thin. Because thick n epi requires deep p-well by long diffusion time, and at the same time such a long diffusion makes n epi thin by up-diffusion, n epi+p-well approach is not appropriate for higher voltage. Therefore, for higher voltage p epi approach is a better choice. When p epi is used, p-well diffusion is not required as p-type region is formed by p epi. Because of no p well diffusion, no up-diffusion occurs and p epi thickness can be thinner than n epi thickness. In the embodiment, JEDIFET R uses n epi and JEDIFET C uses p epi for voltage rating. JEDIFET R refers 30V and JEDIFET C refers 70V. In case of 30V, JEDIFET C, n epi+p-well approach is good and in case of 70V JEDIFET R, p-epi approach is indicated.

Figure 12:
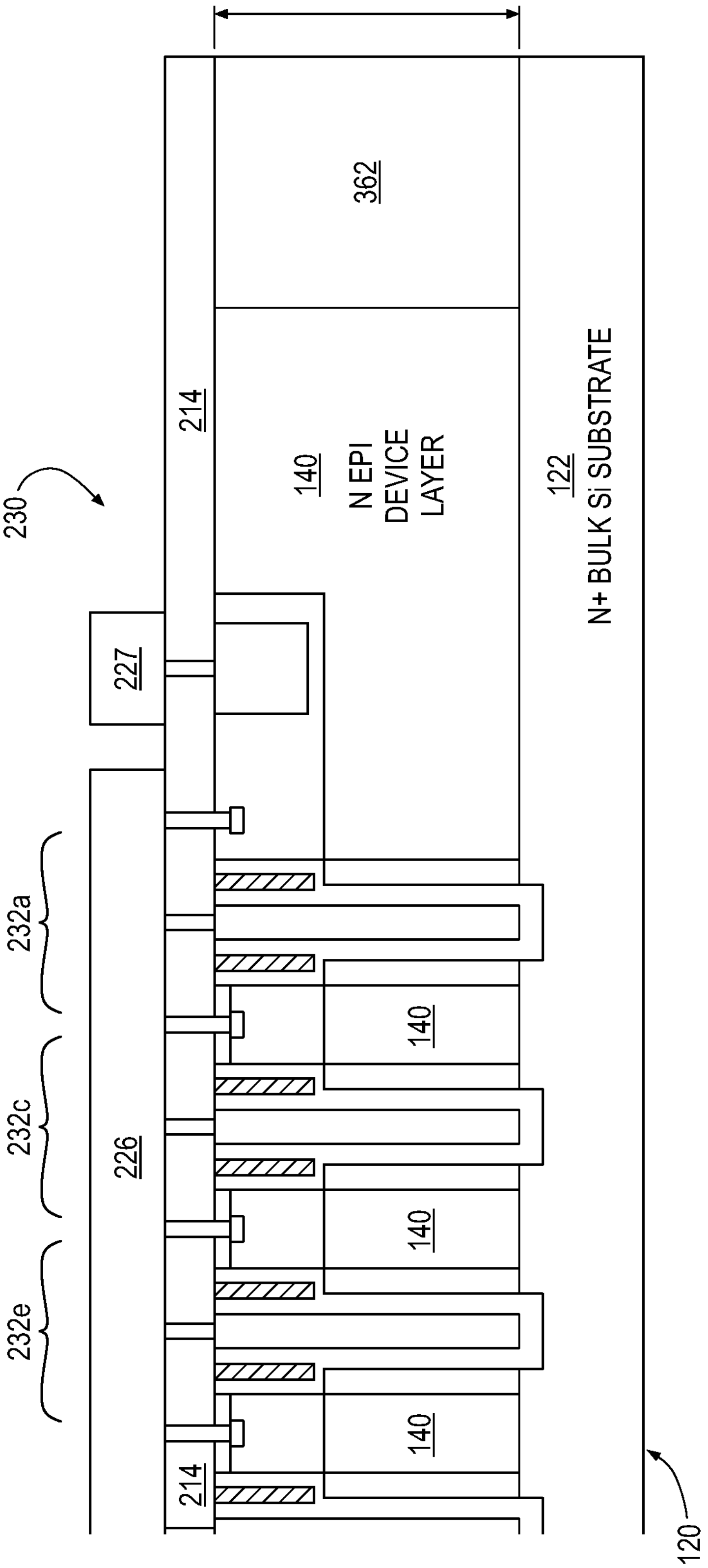
FIG. 12 illustrates an edge termination for the multi-cell power MOSFET from FIGS. 4*a*-4*an;*

FIG. 12 illustrates an edge termination for JEDIFET 230. Cells 232*a*, 232*c*, and 232*e* are formed in p well 140 over substrate 120, as described in FIG. 4. The various processing step in FIG. 4 are defined by a mask, deposition, implant, and diffusion. Edge p well 362 is lightly doped, as required.

Figure 13:
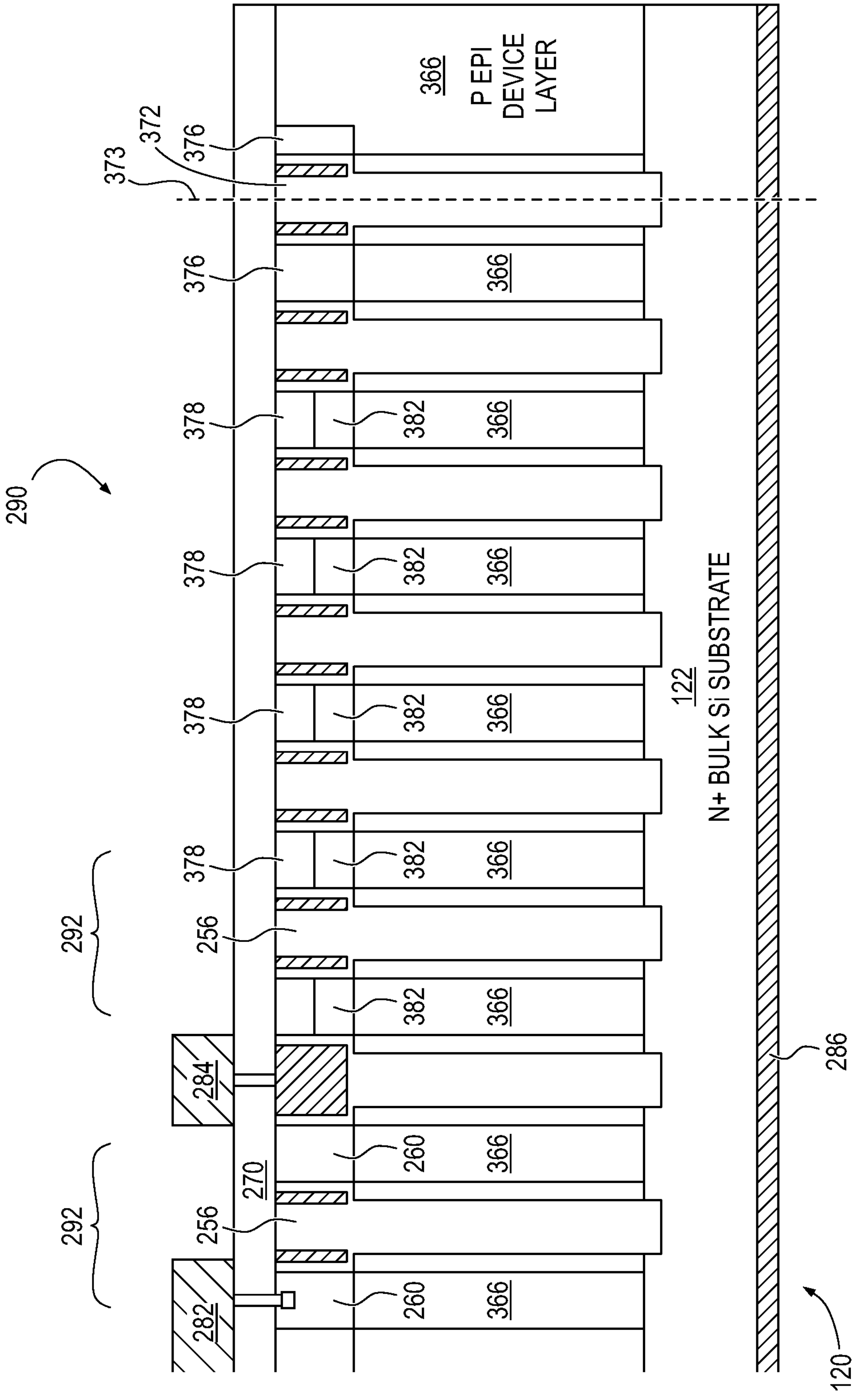
FIG. 13 illustrates an edge termination for the multi-cell power MOSFET from FIGS. 6*a*-6*s*.

FIG. 13 illustrates an edge termination for JEDIFET 290. In this case, cells 292 are formed in a thick p epi 366 over substrate 120, similar to FIG. 6. Edge p epi 366 is surrounded by trench 372 at die edge 373, n− drift region or column 374, and deep n region 376. Shallow n region 378 is formed on surface 380 and is connected to substrate 120 through deep n region 376 and N-layer and n− drift region or column 374. P region 382 is formed under n region 378 and connected to source metal 282.

Figure 14:
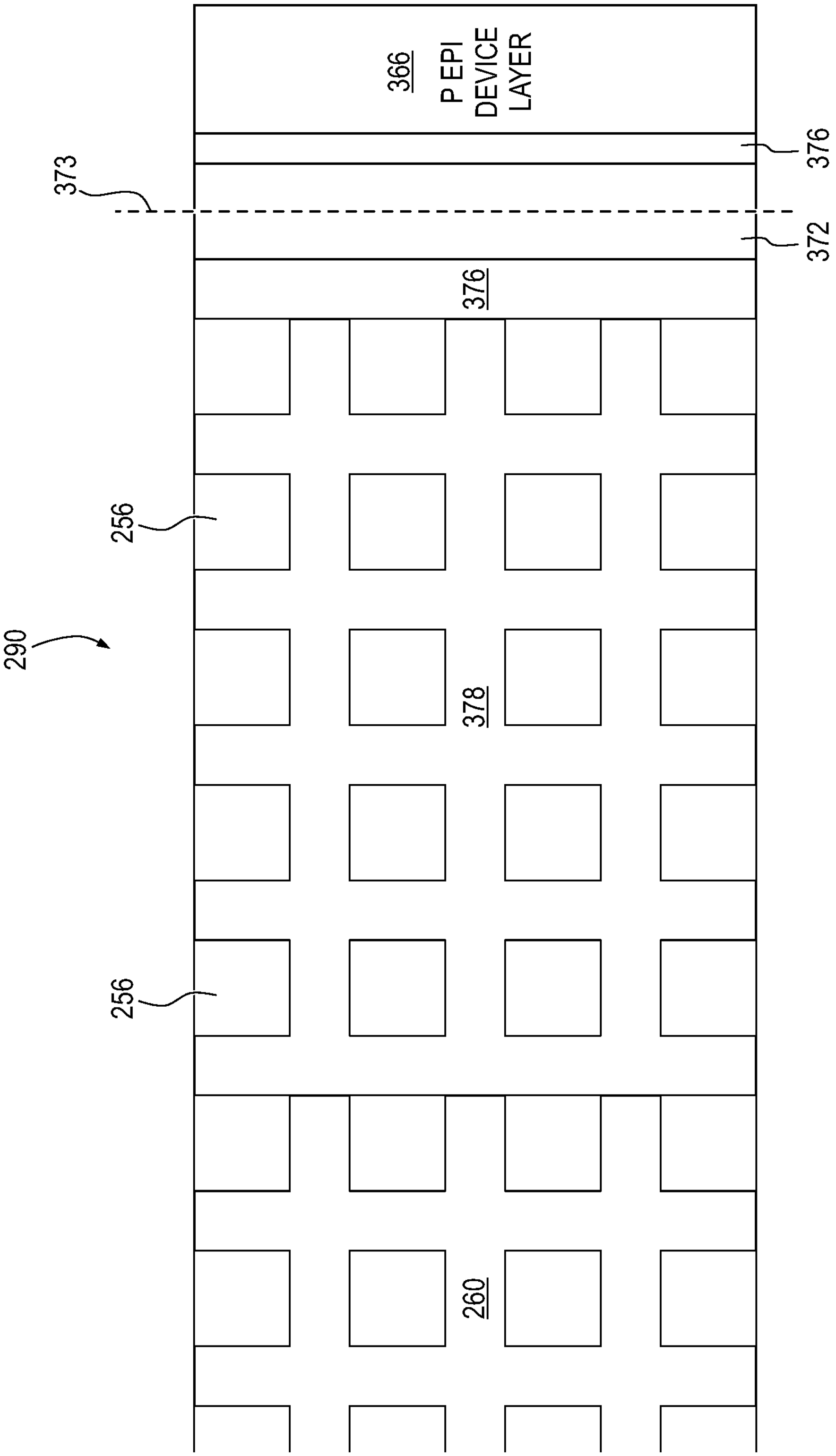
FIG. 14 illustrates a top view of the edge termination for the multi-cell power MOSFET from FIGS. 6*a*-6*s*.

FIG. 14 illustrates a top view of the edge termination for JEDIFET 290 from FIG. 13. Edge p epi 366 is surrounded by trench 372 at die edge 373 and deep n region 376. Shallow n region 378 and p body 260 are shown. The voltage is blocked vertically by the super-junction structure and laterally by shallow n region 378 and p region 382.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
- a substrate;
- a semiconductor layer formed over the substrate;
- a gate region disposed within the semiconductor layer;
- a first trench extending through the gate region to expose a side surface of the gate region and further extending through the semiconductor layer and into the substrate;
- a first insulating layer formed in the first trench to contact the side surface of the gate region as exposed by the first trench;
- a first column of semiconductor material having a first conductivity type extending through the semiconductor layer along the first trench and terminating prior to a bottom surface of the first trench while contacting the substrate, wherein the gate region is disposed over and completely within a vertical projection of the first column of semiconductor material to decrease output capacitance of the semiconductor device; and
- a second column of semiconductor material having a second conductivity type opposite the first conductivity type and formed in contact with the first column of semiconductor material opposite the first trench and terminating prior to the bottom surface of the first trench.

2. The semiconductor device of claim 1, further including a second insulating layer formed in the first trench over a surface of the first insulating layer.

3. The semiconductor device of claim 1, further including a polysilicon material disposed over the first trench and gate region.

4. The semiconductor device of claim 3, wherein the first column of semiconductor material extends around the first trench.

5. The semiconductor device of claim 3, further including:
- a source region formed within the semiconductor layer; and
- a second insulating layer formed between the gate region and source region.

6. The semiconductor device of claim 5, further including a conductive layer formed over the semiconductor layer, wherein the source region is coupled to the conductive layer.

7. The semiconductor device of claim 1, further including:
- a second trench formed through the semiconductor layer, wherein the first trench is formed within the second trench;
- an insulating material forming in the second trench; and
- a first polysilicon material disposed over the insulating material in the second trench to form the gate region.

8. A semiconductor device, comprising:
- a semiconductor layer;
- a first trench formed in the semiconductor layer;
- a first insulating material disposed in the first trench;
- a gate region formed within the first trench over the first insulating material in the semiconductor layer;
- a second trench formed partially within the first trench and extending completely through the gate region to expose a side surface of the gate region and further extending completely through the semiconductor layer;
- a second insulating material disposed in the first trench and second trench over a surface of the first insulating material; and
- a first column of semiconductor material having a first conductivity type extends through the semiconductor layer along the second trench with the gate region being disposed over the first column of semiconductor material to decrease output capacitance of the semiconductor device, wherein the gate region is disposed over and completely within a vertical projection of the first column of semiconductor material.

9. The semiconductor device of claim 8, wherein a second column of semiconductor material having a second conductivity type opposite the first conductivity type extends through the semiconductor layer in contact with the first column of semiconductor material.

10. The semiconductor device of claim 8, further including a polysilicon material disposed over the second trench and gate region.

11. The semiconductor device of claim 8, wherein the first column of semiconductor material is doped through the second trench.

12. The semiconductor device of claim 8, wherein the first column of semiconductor material extends around the second trench.

13. The semiconductor device of claim 8, further including:

a source region formed within the semiconductor layer; and the first insulating material being formed between the gate region and source region.

14. The semiconductor device of claim 13, further including a conductive layer formed over the semiconductor layer, wherein the source region is coupled to the conductive layer.

15. The semiconductor device of claim 8, wherein the first column of semiconductor material terminates prior to a bottom surface of the second trench.

16. The semiconductor device of claim 8, wherein the second column of semiconductor material terminates prior to a bottom surface of the second trench.

17. A method of making a semiconductor device, comprising:

providing a substrate;

forming a semiconductor layer over the substrate;

forming a gate region in the semiconductor layer;

forming a first trench through the gate region to expose a side surface of the gate region and further extending through the semiconductor layer and into the substrate;

forming a first insulating layer in the first trench to contact the side surface of the gate region;

forming a first column of semiconductor material having a first conductivity type extending through the semiconductor layer along the first trench to contact the substrate, wherein the gate region is disposed over the first column of semiconductor material to decrease output capacitance of the semiconductor device, wherein the gate region is disposed over and completely within a vertical projection of the first column of semiconductor material; and forming a second column of semiconductor material having a second conductivity type opposite the first conductivity type and formed in contact with the first column of semiconductor material opposite the trench.

18. The method of claim 17, further including:

forming a second trench into the semiconductor layer, wherein the first trench is formed within the second trench;

disposing a first polysilicon material in the second trench to form the gate region; and forming a second insulating layer in the first trench over a surface of the first insulating layer.

19. The method of claim 18, wherein the first column of semiconductor material terminates prior to a bottom surface of the second trench.

20. The method of claim 18, wherein the second column of semiconductor material terminates prior to a bottom surface of the second trench.

21. The method of claim 17, further including doping the first column of semiconductor material through the first trench.

22. The method of claim 17, wherein the first column of semiconductor material extends around the first trench.

23. The method of claim 17, further including:

forming a source region within the semiconductor layer; and forming the first insulating layer between the gate region and source region.

24. The method of claim 23, further including forming a conductive layer over the semiconductor layer, wherein the source region is coupled to the conductive layer.

25. The method of claim 17, further including forming a polysilicon material over the first trench and gate region.

* * * * *